(12) United States Patent
Yamazaki

(10) Patent No.: US 9,293,592 B2
(45) Date of Patent: Mar. 22, 2016

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/508,017

(22) Filed: Oct. 7, 2014

(65) Prior Publication Data

US 2015/0102342 A1   Apr. 16, 2015

(30) Foreign Application Priority Data

Oct. 11, 2013  (JP) ................... 2013-213915
Oct. 11, 2013  (JP) ................... 2013-213928

(51) Int. Cl.
*H01L 29/786* (2006.01)
*H01L 27/12* (2006.01)
(Continued)

(52) U.S. Cl.
CPC .... *H01L 29/78648* (2013.01); *H01L 21/02554* (2013.01); *H01L 21/02565* (2013.01); *H01L 21/02631* (2013.01); *H01L 21/467* (2013.01); *H01L 21/47573* (2013.01);
(Continued)

(58) Field of Classification Search
CPC ..................... H01L 29/78648; H01L 29/7869; H01L 29/78693; H01L 21/823412; H01L 29/78696
See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Jose R Diaz
(74) *Attorney, Agent, or Firm* — Fish & Richardson P.C.

(57) ABSTRACT

The structure includes a first blocking film over an insulating surface; a base insulating film over the insulating surface and the first blocking film; a first oxide semiconductor film over the base insulating film; a second oxide semiconductor film over the first oxide semiconductor film; source and drain electrodes in contact with side surfaces of the first and second oxide semiconductor films; a first insulating film over the source electrode; a second insulating film over the drain electrode; a third insulating film over the second oxide semiconductor film and the first and second insulating films; a third oxide semiconductor film over the third insulating film; a gate insulating film over the third oxide semiconductor film; and a gate electrode on and in contact with the gate insulating film and covering a top surface and side surfaces of the second oxide semiconductor film with the gate insulating film provided therebetween.

20 Claims, 48 Drawing Sheets

(51) Int. Cl.
  *H01L 21/02* (2006.01)
  *H01L 21/4757* (2006.01)
  *H01L 29/51* (2006.01)
  *H01L 21/467* (2006.01)

(52) U.S. Cl.
  CPC ....... *H01L 27/1225* (2013.01); *H01L 27/1255* (2013.01); *H01L 27/1259* (2013.01); *H01L 29/517* (2013.01); *H01L 29/7869* (2013.01); *H01L 29/78696* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,994,500 B2 | 8/2011 | Kim et al. | |
| 8,058,645 B2 | 11/2011 | Jeong et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,237,166 B2 | 8/2012 | Kumomi et al. | |
| 8,274,078 B2 | 9/2012 | Itagaki et al. | |
| 8,384,080 B2 | 2/2013 | Taniguchi et al. | |
| 8,547,771 B2 | 10/2013 | Koyama et al. | |
| 8,692,252 B2 | 4/2014 | Takata et al. | |
| 8,748,241 B2 | 6/2014 | Isobe et al. | |
| 8,847,220 B2 * | 9/2014 | Yamazaki | H01L 27/1225 257/107 |
| 8,890,159 B2 * | 11/2014 | Yamazaki | H01L 29/247 257/43 |
| 8,987,731 B2 * | 3/2015 | Yamazaki | H01L 29/78693 257/288 |
| 9,059,219 B2 * | 6/2015 | Sasagawa | H01L 29/66969 |
| 9,153,699 B2 * | 10/2015 | Yamazaki | H01L 29/7869 |
| 9,166,060 B2 * | 10/2015 | Yamazaki | H01L 29/78696 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 | 12/2010 | Umeda et al. | |
| 2011/0193083 A1 | 8/2011 | Kim et al. | |
| 2011/0215328 A1 | 9/2011 | Morosawa et al. | |
| 2012/0119205 A1 | 5/2012 | Taniguchi et al. | |
| 2012/0132902 A1 | 5/2012 | Imoto et al. | |
| 2012/0241739 A1 | 9/2012 | Yamazaki et al. | |
| 2013/0092925 A1 | 4/2013 | Saito et al. | |
| 2013/0092943 A1 | 4/2013 | Hatano et al. | |
| 2014/0097867 A1 | 4/2014 | Koyama et al. | |
| 2014/0151691 A1 | 6/2014 | Matsubayashi et al. | |
| 2014/0203277 A1 | 7/2014 | Shimomura | |
| 2014/0264324 A1 | 9/2014 | Yamazaki | |
| 2014/0361293 A1 | 12/2014 | Yamazaki et al. | |
| 2015/0021596 A1 | 1/2015 | Yamazaki et al. | |
| 2015/0028330 A1 | 1/2015 | Yamazaki et al. | |
| 2015/0069384 A1 | 3/2015 | Kobayashi et al. | |
| 2015/0076496 A1 | 3/2015 | Tanaka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2011-124360 A | 6/2011 |
| JP | 2011-138934 A | 7/2011 |
| JP | 2012-160679 | 8/2012 |
| JP | 2012-257187 A | 12/2012 |
| WO | WO-2004/114391 | 12/2004 |
| WO | WO-2008/133345 | 11/2008 |

OTHER PUBLICATIONS

Asaoka.Y et al., "29.1: Polarizer-Free Reflective LCD Combined With Ultra Low-Power Driving Techology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3-Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 :Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magaize, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatement", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

\* cited by examiner

FIG. 35A
FIG. 35B
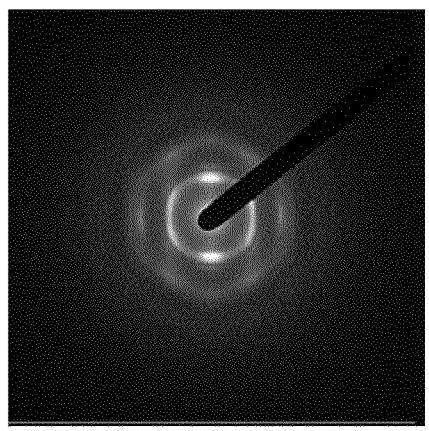
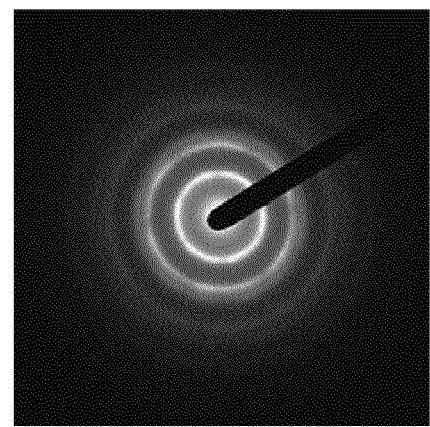

FIG. 37A Heated Substrate
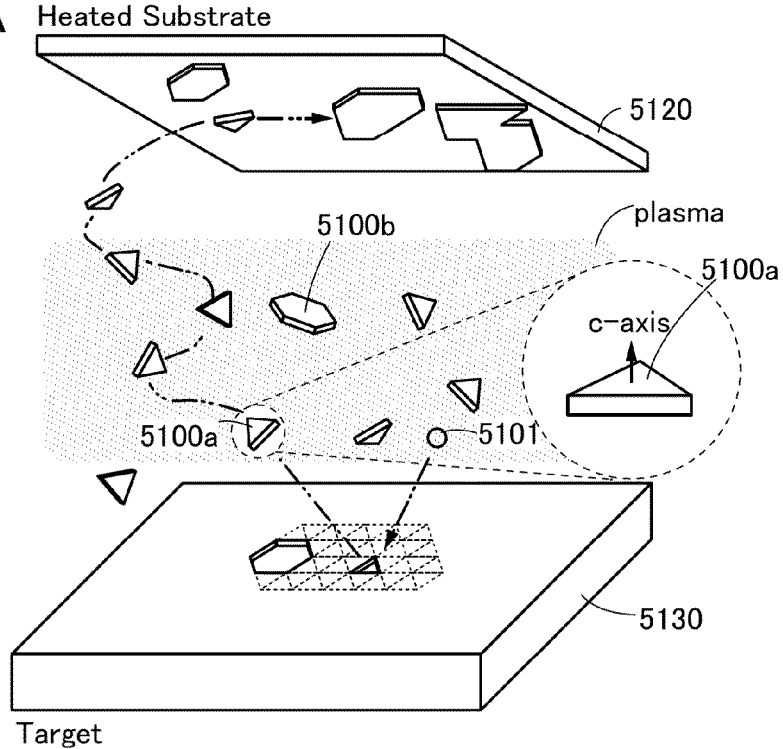
FIG. 37B Room-temperature Substrate
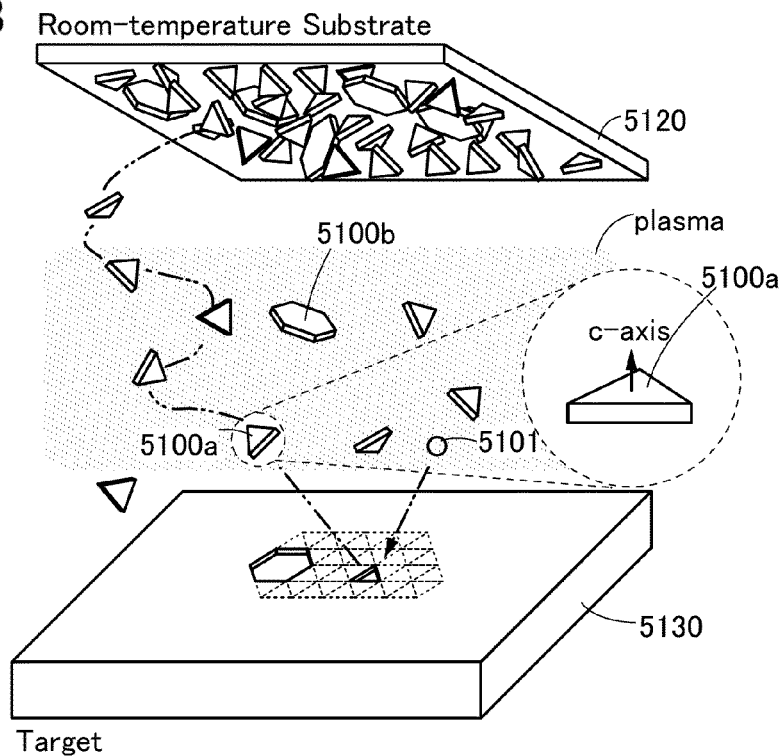

cross section of the pellet upper surface of the pellet

4000

4000

4000

4000

4000

4000

SEMICONDUCTOR DEVICE AND METHOD FOR MANUFACTURING SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device, a display device, a light-emitting device, a memory device, a driving method thereof, or a manufacturing method thereof.

In this specification and the like, a semiconductor device generally means a device that can function by utilizing semiconductor characteristics. An electro-optical device, an image display device (also simply referred to as a display device), a semiconductor circuit, a light-emitting device, a power storage device, a memory device, and an electronic device include a semiconductor device in some cases.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an amorphous oxide semiconductor film containing indium (In), gallium (Ga), and zinc (Zn) is disclosed in Patent Document 1.

Techniques for improving carrier mobility by stacking oxide semiconductor films are disclosed in Patent Documents 2 and 3.

A transistor including an oxide semiconductor film is known to have extremely low leakage current in an off state. For example, a CPU with low-power consumption utilizing the low leakage current of the transistor including an oxide semiconductor film is disclosed (see Patent Document 4).

REFERENCE

Patent Documents

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

Miniaturization of transistors has been progressing with an increase in the degree of integration of circuits. In some cases, miniaturization of transistors causes deterioration of the electrical characteristics of the transistors, such as on-state current, off-state current, threshold voltage, and a subthreshold swing value (an S value). In general, a decrease in channel length leads to an increase in off-state current, an increase in variations of threshold voltage, and an increase in S value. When the channel width is decreased, the on-state current is reduced.

Thus, an object of one embodiment of the present invention is to provide a semiconductor device having a structure which can prevent the deterioration of electrical characteristics, which becomes more noticeable with miniaturization of transistors. Another object is to provide a highly integrated semiconductor device. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a semiconductor device with favorable characteristics. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first blocking film over an insulating surface; a base insulating film over the insulating surface and the first blocking film; a first oxide semiconductor film over the base insulating film; a second oxide semiconductor film over the first oxide semiconductor film; a source electrode and a drain electrode in contact with side surfaces of the first oxide semiconductor film and side surfaces of the second oxide semiconductor film; a first insulating film over the source electrode; a second insulating film over the drain electrode; a third insulating film over the second oxide semiconductor film, the first insulating film, and the second insulating film; a third oxide semiconductor film over the third insulating film; a gate insulating film over the third oxide semiconductor film; and a gate electrode on and in contact with the gate insulating film and covering a top surface and side surfaces of the second oxide semiconductor film with the gate insulating film provided therebetween.

Another embodiment of the present invention is a semiconductor device including a conductive film embedded in an insulating surface; a first blocking film over the insulating surface and the conductive film; a base insulating film over the conductive film and the first blocking film; a first oxide semiconductor film over the base insulating film; a second oxide semiconductor film over the first oxide semiconductor film; a source electrode and a drain electrode in contact with side surfaces of the first oxide semiconductor film and side surfaces of the second oxide semiconductor film; a first insulating film over the source electrode; a second insulating film over the drain electrode; a third insulating film over the second oxide semiconductor film, the first insulating film, and the second insulating film; a third oxide semiconductor film over the third insulating film; a gate insulating film over the third oxide semiconductor film; and a gate electrode on and in contact with the gate insulating film and covering a top surface and side surfaces of the second oxide semiconductor film with the gate insulating film provided therebetween.

Another embodiment of the present invention is a semiconductor device including a first blocking film over an insulating surface; a base insulating film over the insulating surface and the first blocking film; a first oxide semiconductor film over the base insulating film; a second oxide semiconductor film over the first oxide semiconductor film; a source electrode and a drain electrode in contact with side surfaces of the first oxide semiconductor film and side surfaces of the second oxide semiconductor film; a first insulating film over the source electrode; a second insulating film over the drain electrode; a third insulating film over the source electrode and a fourth insulating film over the drain electrode, the third insulating film and the fourth insulating film being in contact with the side surfaces of the second oxide semiconductor film; a third oxide semiconductor film over the second oxide semiconductor film, the third insulating film, and the fourth insulating film; a gate insulating film over the third oxide semiconductor film; and a gate electrode on and in contact with the gate insulating film and covering a top surface and side surfaces of the second oxide semiconductor film with the gate insulating film provided therebetween.

Another embodiment of the present invention is a semiconductor device including a conductive film embedded in an insulating surface; a first blocking film over the insulating surface and the conductive film; a base insulating film over the conductive film and the first blocking film; a first oxide semiconductor film over the base insulating film; a second oxide semiconductor film over the first oxide semiconductor film; a source electrode and a drain electrode in contact with side surfaces of the first oxide semiconductor film and side surfaces of the second oxide semiconductor film; a first insulating film over the source electrode; a second insulating film over the drain electrode; a third insulating film over the source electrode and a fourth insulating film over the drain electrode, the third insulating film and the fourth insulating film being in contact with the side surfaces of the second oxide semiconductor film; a third oxide semiconductor film over the second oxide semiconductor film, the third insulating film, and the fourth insulating film; a gate insulating film over the third oxide semiconductor film; and a gate electrode on and in contact with the gate insulating film and covering a top surface and side surfaces of the second oxide semiconductor film with the gate insulating film provided therebetween.

In the above structure, the first blocking film preferably includes aluminum oxide.

In the above structure, a second blocking film over the gate electrode and the first blocking film is preferably included.

In the above structure, the second blocking film preferably includes aluminum oxide.

The above semiconductor device includes a capacitor, and the capacitor includes a lower electrode film, an inter-electrode insulating film covering the lower electrode film, and an upper electrode film in contact with a part of the inter-electrode insulating film. The source electrode, the drain electrode, and the lower electrode film have the same composition, and the second blocking film and the inter-electrode insulating film have the same composition.

Another embodiment of the present invention is a method for manufacturing a semiconductor device, including the steps of: forming a first blocking film over an insulating surface; forming a base insulating film over the insulating surface and the first blocking film; forming a stacked-layer film including a first oxide semiconductor film, a second oxide semiconductor film, and a hard mask that are formed in this order, over the base insulating film; forming a first conductive film over the base insulating film and the stacked-layer film; forming a first insulating film over the first conductive film; performing removing treatment on the first conductive film, the first insulating film, and the hard mask to expose the second oxide semiconductor film and form a source electrode and a drain electrode; forming a second insulating film over the first conductive film subjected to the removing treatment and the first insulating film subjected to the removing treatment; performing etching on the first insulating film subjected to the removing treatment, the base insulating film, and the second insulating film to expose the first blocking film; forming a third oxide semiconductor film over the first blocking film, the base insulating film subjected to the etching, and the second insulating film subjected to the etching; forming a gate insulating film over the third oxide semiconductor film; and forming a gate electrode that is on and in contact with the gate insulating film and covers a top surface and side surfaces of the second oxide semiconductor film with the gate insulating film provided therebetween.

Another embodiment of the present invention is a method for manufacturing a semiconductor device, including the steps of: forming a first conductive film embedded in an insulating surface; forming a first blocking film over the insulating surface and the first conductive film; forming a base insulating film over the first conductive film and the first blocking film; forming a stacked-layer film including a first oxide semiconductor film, a second oxide semiconductor film, and a hard mask that are formed in this order, over the base insulating film; forming a second conductive film over the base insulating film and the stacked-layer film; forming a first insulating film over the second conductive film; performing removing treatment on the second conductive film, the first insulating film, and the hard mask to expose the second oxide semiconductor film and form a source electrode and a drain electrode; forming a second insulating film over the second conductive film subjected to the removing treatment and the first insulating film subjected to the removing treatment; performing etching on the first insulating film subjected to the removing treatment, the base insulating film, and the second insulating film to expose the first blocking film; forming a third oxide semiconductor film over the first blocking film, the base insulating film subjected to the etching, and the second insulating film subjected to the etching; forming a gate insulating film over the third oxide semiconductor film; and forming a gate electrode that is on and in contact with the gate insulating film and covers a top surface and side surfaces of the second oxide semiconductor film with the gate insulating film provided therebetween.

Another embodiment of the present invention is a method for manufacturing a semiconductor device, including the steps of: forming a first blocking film over an insulating surface; forming a base insulating film over the insulating surface and the first blocking film; forming a stacked-layer film including a first oxide semiconductor film, a second oxide semiconductor film, and a hard mask that are formed in this order, over the base insulating film; forming a first conductive film over the base insulating film and the stacked-layer film; forming a first insulating film over the first conductive film; performing removing treatment on the first conductive film and the first insulating film to expose the hard mask; performing etching on a part of the first conductive film subjected to the removing treatment and the hard mask to form a source electrode and a drain electrode; forming a second insulating film over the first insulating film subjected to the removing treatment, the second oxide semiconductor film, the source electrode, and the drain electrode; performing removing treatment on the second insulating film to expose the second oxide semiconductor film and form a third insulating film and a fourth insulating film; performing etching on the first insulating film subjected to the removing treatment and the base insulating film to expose the first blocking film; forming a third oxide semiconductor film over the second oxide semiconductor film, the third insulating film, the fourth insulating film, the first blocking film, and the base insulating film subjected to the etching; forming a gate insulating film over the third oxide semiconductor film; and forming a gate electrode that is on and in contact with the gate insulating film and covers a top surface and side surfaces of the second oxide semiconductor film with the gate insulating film provided therebetween.

Another embodiment of the present invention is a method for manufacturing a semiconductor device, including the steps of: forming a first conductive film embedded in an insulating surface; forming a first blocking film over the insulating surface and the first conductive film; forming a base insulating film over the first conductive film and the first blocking film; forming a stacked-layer film including a first oxide semiconductor film, a second oxide semiconductor film, and a hard mask that are formed in this order, over the base insulating film; forming a second conductive film over the base insulating film and the stacked-layer film; forming a first insulating film over the second conductive film; performing removing treatment on the second conductive film and the first insulating film to expose the hard mask; performing etching on a part of the second conductive film subjected to the removing treatment and the hard mask to form a source electrode and a drain electrode; forming a second insulating film over the first insulating film subjected to the removing treatment, the second oxide semiconductor film, the source electrode, and the drain electrode; performing removing treatment on the second insulating film to expose the second oxide semiconductor film and form a third insulating film and a fourth insulating film; performing etching on the first insulating film subjected to the removing treatment and the base insulating film to expose the first blocking film; forming a third oxide semiconductor film over the second oxide semiconductor film, the third insulating film, the fourth insulating film, the first blocking film, and the base insulating film subjected to the etching; forming a gate insulating film over the third oxide semiconductor film; and forming a gate electrode that is on and in contact with the gate insulating film and covers a top surface and side surfaces of the second oxide semiconductor film with the gate insulating film provided therebetween.

In the above manufacturing method, the removing treatment is preferably performed by chemical mechanical polishing.

In the above manufacturing method, a second blocking film is preferably formed over the gate electrode and the first blocking film after the gate electrode is formed.

Another embodiment of the present invention is the method for manufacturing a semiconductor device including a capacitor, the above manufacturing method including the steps of: forming a lower electrode film in a layer where one of the source electrode and the drain electrode is formed; forming an inter-electrode insulating film covering the lower electrode film; and forming an upper electrode film in contact with a part of the inter-electrode insulating film. The one of the source electrode and the drain electrode and the lower electrode film are formed in the same process, and the second blocking film and the inter-electrode insulating film are formed in the same process.

One embodiment of the present invention can provide a semiconductor device having a structure which can prevent deterioration of electrical characteristics, which becomes more noticeable with miniaturization. Furthermore, a highly integrated semiconductor device can be provided. A semiconductor device in which deterioration of on-state current characteristics is reduced can be provided. A semiconductor device with low power consumption can be provided. A highly reliable semiconductor device can be provided. A semiconductor device which can retain data even when power supply is stopped can be provided. A semiconductor device with favorable characteristics can be provided. A novel semiconductor device can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 35A and 35B show electron diffraction patterns of a CAAC-OS.

FIGS. 37A and 37B are schematic diagrams illustrating deposition models of a CAAC-OS and an nc-OS.

DETAILED DESCRIPTION OF THE INVENTION

Figure 1A:
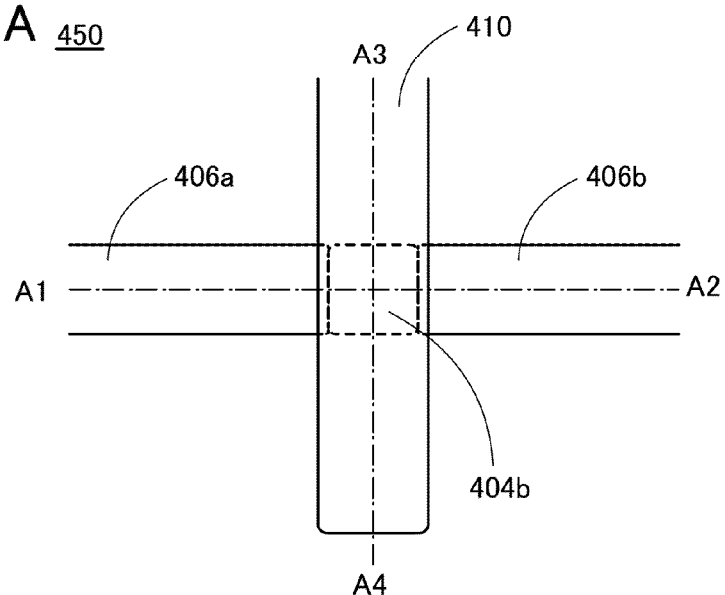
FIGS. 1A and 1B are a top view and a cross-sectional view, respectively, which illustrate a transistor.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that what is described (or part thereof) in one embodiment can be applied to, combined with, or exchanged with another content (or part thereof) in the same embodiment and/or what is described (or part thereof) in another embodiment or other embodiments.

Note that in each embodiment, a content described in the embodiment is a content described with reference to a variety of diagrams or a content described with a text disclosed in this specification.

In addition, by combining a diagram (or part thereof) described in one embodiment with another part of the diagram, a different diagram (or part thereof) described in the same embodiment, and/or a diagram (or part thereof) described in another or other embodiments, much more diagrams can be formed.

Embodiment 1

In this embodiment, a semiconductor device of one embodiment of the present invention is described with reference to drawings.

Figure 1B:
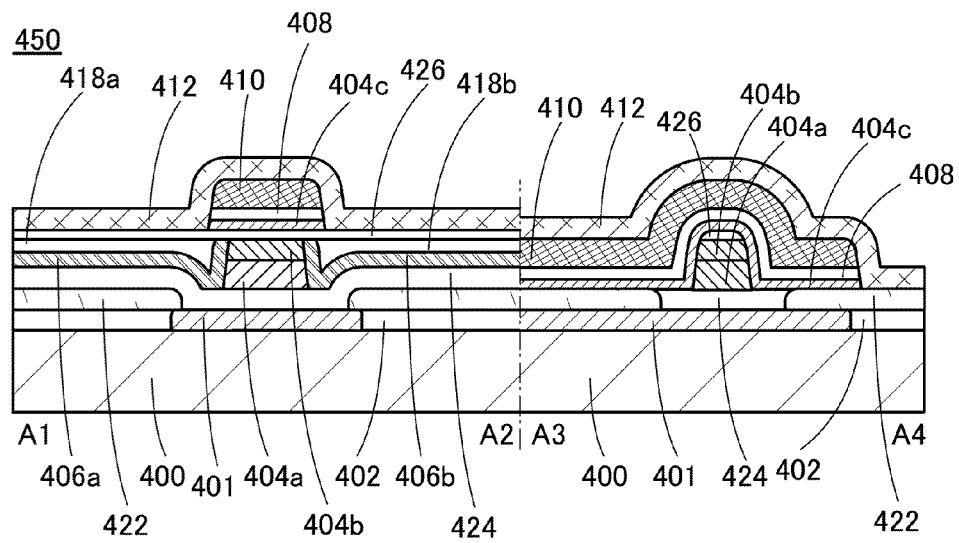

FIGS. 1A and 1B are a top view and a cross-sectional view of a transistor of one embodiment of the present invention. FIG. 1A is the top view. FIG. 1B illustrates a cross section taken along dashed-dotted lines A1-A2 and A3-A4 in FIG. 1A. Note that for simplification of the drawing, some components in the top view in FIG. 1A are not illustrated. In some cases, the direction of the dashed-dotted line A1-A2 is referred to as a channel length direction, and the direction of the dashed-dotted line A3-A4 is referred to as a channel width direction.

A transistor 450 illustrated in FIGS. 1A and 1B includes a conductive film 401 and an insulating film 402 over a substrate 400; a blocking film 422 over the conductive film 401 and the insulating film 402; a base insulating film 424 over the conductive film 401 and the blocking film 422; an oxide semiconductor film 404a and an oxide semiconductor film 404b over the base insulating film 424; a source electrode 406a and a drain electrode 406b in contact with side surfaces of the oxide semiconductor film 404a and the oxide semiconductor film 404b; an insulating film 418a over the source electrode 406a; an insulating film 418b over the drain electrode 406b; an insulating film 426 over the oxide semiconductor film 404b, the source electrode 406a, the drain electrode 406b, the insulating film 418a, and the insulating film 418b; an oxide semiconductor film 404c over the blocking film 422, the base insulating film 424, and the insulating film 426; a gate insulating film 408 over the oxide semiconductor film 404c; a gate electrode 410 on and in contact with the gate insulating film 408 and covering a top surface and side surfaces of the oxide semiconductor film 404b with the gate insulating film 408 provided therebetween; and a blocking film 412 over the insulating film 418a, the insulating film 418b, the blocking film 422, and the gate electrode 410. The oxide semiconductor film 404a, the oxide semiconductor film 404b, and the oxide semiconductor film 404c are collectively referred to as a multilayer film 404.

Note that at least part (or all) of the source electrode 406a (and/or the drain electrode 406b) is provided on at least part (or all) of a surface, a side surface, and/or a bottom surface of a semiconductor film such as the oxide semiconductor film 404a (and/or the oxide semiconductor film 404b).

Alternatively, at least part (or all) of the source electrode 406a (and/or the drain electrode 406b) is in contact with at least part (or all) of a surface, a side surface, and/or a bottom surface of a semiconductor film such as the oxide semiconductor film 404a (and/or the oxide semiconductor film 404b). Alternatively, at least part (or all) of the source electrode 406a (and/or the drain electrode 406b) is in contact with at least part (or all) of a semiconductor film such as the oxide semiconductor film 404a (and/or the oxide semiconductor film 404b).

Alternatively, at least part (or all) of the source electrode 406a (and/or the drain electrode 406b) is electrically connected to at least part (or all) of a surface, a side surface, and/or a bottom surface of a semiconductor film such as the oxide semiconductor film 404a (and/or the oxide semiconductor film 404b). Alternatively, at least part (or all) of the source electrode 406a (and/or the drain electrode 406b) is electrically connected to part (or all) of a semiconductor film such as the oxide semiconductor film 404a (and/or the oxide semiconductor film 404b).

Alternatively, at least part (or all) of the source electrode 406a (and/or the drain electrode 406b) is provided near at least part (or all) of a surface, a side surface, and/or a bottom surface of a semiconductor film such as the oxide semiconductor film 404a (and/or the oxide semiconductor film 404b). Alternatively, at least part (or all) of the source electrode 406a (and/or the drain electrode 406b) is provided near part (or all) of a semiconductor film such as the oxide semiconductor film 404a (and/or the oxide semiconductor film 404b).

Alternatively, at least part (or all) of the source electrode 406a (and/or the drain electrode 406b) is provided next to at least part (or all) of a surface, a side surface, and/or a bottom surface of a semiconductor film such as the oxide semiconductor film 404a (and/or the oxide semiconductor film 404b). Alternatively, at least part (or all) of the source electrode 406a (and/or the drain electrode 406b) is provided next to part (or all) of a semiconductor film such as the oxide semiconductor film 404a (and/or the oxide semiconductor film 404b).

Alternatively, at least part (or all) of the source electrode 406a (and/or the drain electrode 406b) is provided obliquely above at least part (or all) of a surface, a side surface, and/or a bottom surface of a semiconductor film such as the oxide semiconductor film 404a (and/or the oxide semiconductor film 404b). Alternatively, at least part (or all) of the source electrode 406a (and/or the drain electrode 406b) is provided obliquely above part (or all) of a semiconductor film such as the oxide semiconductor film 404a (and/or the oxide semiconductor film 404b).

Alternatively, at least part (or all) of the source electrode 406a (and/or the drain electrode 406b) is provided above at least part (or all) of a surface, a side surface, and/or a bottom surface of a semiconductor film such as the oxide semiconductor film 404a (and/or the oxide semiconductor film 404b). Alternatively, at least part (or all) of the source electrode 406a (and/or the drain electrode 406b) is provided above part (or all) of a semiconductor film such as the oxide semiconductor film 404a (and/or the oxide semiconductor film 404b).

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

In manufacturing a transistor with a small channel length and a small channel width, when an electrode, a semiconductor film, or the like is processed while a resist mask is reduced in size, the electrode, the semiconductor film, or the like has a round end portion (curved surface) in some cases. This structure can improve coverage with an insulating film and an electrode which are to be formed over a film having a round end portion.

The source and drain electrodes 406a and 406b of the transistor 450 in FIGS. 1A and 1B can be formed by performing removing (polishing) treatment on a conductive film which is to be the source and drain electrodes 406a and 406b.

A high current can flow in the whole (bulk) of the oxide semiconductor film 404b which is a channel because the side surfaces of the source electrode 406a and the drain electrode 406b are in contact with the side surfaces of the oxide semiconductor film 404b, so that high on-state current can be obtained.

Miniaturization of a transistor leads to high integration and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Moreover, the gate electrode 410 electrically surrounds the oxide semiconductor film 404b, so that on-state current is increased. Such a transistor structure is referred to as a surrounded channel (s-channel) structure. In the s-channel structure, current flows through the whole oxide semiconductor film 404b. Since the current flows through the inside of the oxide semiconductor film 404b, an adverse effect of interface scattering is unlikely to occur, leading to a large amount of on-state current. Note that an increase in the thickness of the oxide semiconductor film 404b enables the on-state current to increase.

The substrate 400 is not limited to a simple supporting substrate, and may be a substrate where a device such as a transistor is formed. In that case, at least one of the gate electrode 410, the source electrode 406a, and the drain electrode 406b of the transistor 450 may be electrically connected to the above device.

The insulating film 402 has a function of preventing diffusion of impurities from the substrate 400. The conductive film 401 serving as a gate electrode is provided so as to be embedded in the insulating film 402. When the conductive film 401 is used as a back gate, the on-state current can be further increased and the threshold voltage can be controlled. In order to increase the on-state current, for example, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

The blocking film 422 also has a function of preventing diffusion of impurities from the substrate 400. The blocking film 422 can prevent outward diffusion of oxygen from the multilayer film 404 and entry of hydrogen, water, or the like from the outside to the multilayer film 404. The blocking film can be formed using an insulating film containing one or more of aluminum oxide, silicon nitride oxide, and silicon nitride. The blocking film may be a stack of any of the above materials.

The base insulating film 424 can have a function of supplying oxygen to the multilayer film 404 as well as a function of preventing diffusion of impurities from the substrate 400. For this reason, the base insulating film 424 is preferably an insulating film containing oxygen and further preferably, the base insulating film 424 is an insulating film containing oxygen in which the oxygen content is higher than that in the stoichiometric composition. In the case where the substrate 400 is provided with another device as described above, the base insulating film 424 also has a function as an interlayer insulating film.

The multilayer film 404 in which a channel of the transistor 450 is formed has a structure in which the oxide semiconductor film 404a, the oxide semiconductor film 404b, and the oxide semiconductor film 404c are stacked in this order from the substrate 400 side. The oxide semiconductor film 404b is surrounded by the oxide semiconductor film 404a and the oxide semiconductor film 404c. As in FIG. 1B, the gate electrode 410 electrically surrounds the oxide semiconductor film 404b.

Here, for the oxide semiconductor film 404b, for example, an oxide semiconductor whose electron affinity (an energy difference between a vacuum level and a bottom of a conduction band) is higher than those of the oxide semiconductor film 404a and the oxide semiconductor film 404c is used. The electron affinity can be obtained by subtracting an energy difference between a bottom of a conduction band and a top of a valence band (what is called an energy gap) from an energy difference between the vacuum level and the top of the valence band (what is called an ionization potential).

It is preferable that each of the oxide semiconductor film 404a and the oxide semiconductor film 404c contains one or more kinds of metal elements forming the oxide semiconductor film 404b, and is formed using an oxide semiconductor whose energy of the bottom of the conduction band is closer to the vacuum level than that of the oxide semiconductor film 404b is by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode 410 in such a structure, a channel is formed in the oxide semiconductor film 404b of the multilayer film 404, because the oxide semiconductor film 404b has the lowest energy at the bottom of the conduction band. In other words, the oxide semiconductor film 404c is formed between the oxide semiconductor film 404b and the gate insulating film 408, whereby the channel of the transistor is formed in a region that is not in contact with the gate insulating film 408.

Furthermore, because the oxide semiconductor film 404a contains one or more kinds of metal elements contained in the oxide semiconductor film 404b, an interface state is less likely to be formed at the interface of the oxide semiconductor film 404b with the oxide semiconductor film 404a than at the interface with the base insulating film 424 on the assumption that the oxide semiconductor film 404b is in contact with the base insulating film 424. The interface state sometimes forms a channel; therefore, the threshold voltage of the transistor is changed in some cases. Thus, with the oxide semiconductor film 404a, variation in the electrical characteristics of the transistor, such as a threshold voltage, can be reduced. Further, the reliability of the transistor can be improved.

Furthermore, since the oxide semiconductor film 404c contains one or more metal elements contained in the oxide semiconductor film 404b, scattering of carriers is less likely to occur at the interface of the oxide semiconductor film 404b with the oxide semiconductor film 404c than at the interface with the gate insulating film 408 on the assumption that the oxide semiconductor film 404b is in contact with the gate insulating film 408. Therefore, with the oxide semiconductor film 404c, the field-effect mobility of the transistor can be increased.

For the oxide semiconductor film 404a and the oxide semiconductor film 404c, for example, a material containing Al, Ti, Ga, Ge, Y, Zr, Sn, La, Ce, or Hf with a higher atomic ratio than that used for the oxide semiconductor film 404b can be used. Specifically, an atomic ratio of any of the above metal elements in the oxide semiconductor film 404a and the oxide semiconductor film 404c is 1.5 times or more, preferably 2 times or more, further preferably 3 times or more as much as that in the oxide semiconductor film 404b. Any of the above metal elements is strongly bonded to oxygen and thus has a function of suppressing generation of an oxygen vacancy in the oxide semiconductor film. That is, an oxygen vacancy is less likely to be generated in the oxide semiconductor film 404a and the oxide semiconductor film 404c than in the oxide semiconductor film 404b.

Note that when each of the oxide semiconductor film 404a, the oxide semiconductor film 404b, and the oxide semiconductor film 404c is an In-M-Zn oxide (M is a metal such as Al, Ti, Ga, Ge, Y, Zr, Sn, La, Ce, or Hf) containing at least indium, zinc, and M, and the oxide semiconductor film 404a has an atomic ratio of In to M and Zn which is $x_1:y_1:z_1$, the oxide semiconductor film 404b has an atomic ratio of In to M and Zn which is $x_2:y_2:z_2$, and the oxide semiconductor film 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the oxide semiconductor film 404b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in the oxide semiconductor film 404a and the oxide semiconductor film 404c are preferably less than 50 atomic % and greater than or equal to 50 atomic %, respectively, and further preferably less than 25 atomic % and greater than or equal to 75 atomic %, respectively. In the case where Zn and O are not taken into consideration, the proportion of In and the proportion of M in the oxide semiconductor film 404b are preferably higher than or equal to 25 atomic % and lower than 75 atomic %, respectively, and further preferably higher than or equal to 34 atomic % and lower than 66 atomic %, respectively.

The thicknesses of the oxide semiconductor film 404a and the oxide semiconductor film 404c are each greater than or equal to 3 nm and less than or equal to 100 nm, preferably greater than or equal to 3 nm and less than or equal to 50 nm. The thickness of the oxide semiconductor film 404b is greater than or equal to 3 nm and less than or equal to 200 nm, preferably greater than or equal to 3 nm and less than or equal to 100 nm, further preferably greater than or equal to 3 nm and less than or equal to 50 nm. The thickness of the oxide semiconductor film 404b is preferably larger than those of the oxide semiconductor film 404a and the oxide semiconductor film 404c.

For each of the oxide semiconductor film 404a, the oxide semiconductor film 404b, and the oxide semiconductor film 404c, an oxide semiconductor containing indium, zinc, and gallium can be used, for example. Note that the oxide semiconductor film 404b preferably contains indium because carrier mobility can be increased.

Note that stable electrical characteristics can be effectively imparted to a transistor including an oxide semiconductor film by reducing the concentration of impurities in the oxide semiconductor film to make the oxide semiconductor film intrinsic or substantially intrinsic. The term "substantially intrinsic" refers to the state where an oxide semiconductor film has a carrier density lower than $1\times10^{17}/cm^3$, preferably lower than $1\times10^{15}/cm^3$, further preferably lower than $1\times10^{13}/cm^3$.

Further, in the oxide semiconductor film, hydrogen, nitrogen, carbon, silicon, and a metal element other than main components are impurities. For example, hydrogen and nitrogen form donor levels to increase the carrier density, and silicon forms impurity levels in the oxide semiconductor film. The impurity level becomes a trap, which might deteriorate the electric characteristics of the transistor. Accordingly, in the oxide semiconductor film 404a, the oxide semiconductor film 404b, and the oxide semiconductor film 404c and at interfaces between these films, the impurity concentration is preferably reduced.

In order to make the oxide semiconductor film intrinsic or substantially intrinsic, in SIMS (secondary ion mass spectrometry), for example, the concentration of silicon at a certain depth of the oxide semiconductor film or in a region of the oxide semiconductor film is preferably lower than $1\times10^{19}$ atoms/cm$^3$, more preferably lower than $5\times10^{18}$ atoms/cm$^3$, still more preferably lower than $1\times10^{18}$ atoms/cm$^3$. Further, the concentration of hydrogen at a certain depth of the oxide semiconductor film or in a region of the oxide semiconductor film is preferably lower than or equal to $2\times10^{20}$ atoms/cm$^3$, more preferably lower than or equal to $5\times10^{19}$ atoms/cm$^3$, still more preferably lower than or equal to $1\times10^{19}$ atoms/cm$^3$, yet still more preferably lower than or equal to $5\times10^{18}$ atoms/cm$^3$. Further, the concentration of nitrogen at a certain depth of the oxide semiconductor film or in a region of the oxide semiconductor film is preferably lower than $5\times10^{19}$ atoms/cm$^3$, more preferably lower than or equal to $5\times10^{18}$ atoms/cm$^3$, still more preferably lower than or equal to $1\times10^{18}$ atoms/cm$^3$, yet still more preferably lower than or equal to $5\times10^{17}$ atoms/cm$^3$.

In addition, in a case where the oxide semiconductor film includes a crystal, the crystallinity of the oxide semiconductor film might be decreased if silicon or carbon is included at high concentration. In order not to lower the crystallinity of the oxide semiconductor film, for example, the concentration of silicon at a certain depth of the oxide semiconductor film or in a region of the oxide semiconductor film may be lower than $1\times10^{19}$ atoms/cm$^3$, preferably lower than $5\times10^{18}$ atoms/cm$^3$, more preferably lower than $1\times10^{18}$ atoms/cm$^3$. Further, the concentration of carbon at a certain depth of the oxide semiconductor film or in a region of the oxide semiconductor film may be lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which a highly purified oxide semiconductor film is used for a channel formation region as described above has extremely low off-state current. In the case where the voltage between a source and a drain is set to about 0.1 V, 5 V, or 10 V, for example, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the multilayer film, which serves as a channel, be not in contact with the gate insulating film for the above-described reason. In the case where a channel is formed at the interface between the gate insulating film and the multilayer film, scattering of carriers occurs at the interface, whereby the field-effect mobility of the transistor is reduced in some cases. Also from the view of the above, it is preferable that the region of the multilayer film, which serves as a channel, be separated from the gate insulating film.

Accordingly, with the multilayer film 404 having a stacked structure including the oxide semiconductor film 404a, the oxide semiconductor film 404b, and the oxide semiconductor film 404c in this order, a channel can be formed in the oxide semiconductor film 404b; thus, the transistor can have a high field-effect mobility and stable electric characteristics.

Next, the band structure of the multilayer film 404 is described. In the stacked film, In—Ga—Zn oxide with an energy gap of 3.5 eV is used for layers corresponding to the oxide semiconductor film 404a and the oxide semiconductor film 404c, and In—Ga—Zn oxide with an energy gap of 3.15 eV is used for a layer corresponding to the oxide semiconductor film 404b.

The energy gaps of the oxide semiconductor film 404a, the oxide semiconductor film 404b, and the oxide semiconductor film 404c were measured with the use of a spectroscopic ellipsometer (UT-300 manufactured by HORIBA Jobin Yvon) under the condition where the thickness of each of the film was set to 10 nm. The energy difference between the vacuum level and the top of the valence band was measured using an ultraviolet photoelectron spectroscopy (UPS) device (VersaProbe, ULVAC-PHI, Inc.).

Figure 2A:
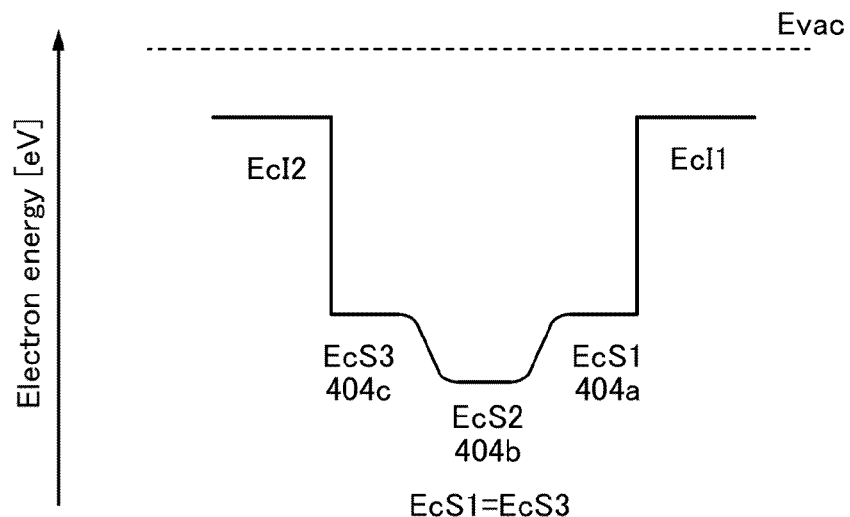
FIGS. 2A and 2B show band structures of multilayer films.

FIG. 2A schematically shows part of a band structure of an energy gap (electron affinity) between the vacuum level and a bottom of a conduction band of each layer, which is calculated by subtracting the energy gap of each layer from the energy gap between the vacuum level and the top of the valence band. FIG. 2A is a band diagram showing the case where silicon oxide films are provided in contact with the oxide semiconductor film 404a and the oxide semiconductor film 404c. Here, Evac represents energy of the vacuum level, EcI1 and EcI2 each represent energy at the bottom of conduction band of the silicon oxide film, EcS1 represents energy at the bottom of the conduction band of the oxide semiconductor film 404a, EcS2 represents energy at the bottom of the conduction band of the oxide semiconductor film 404b, and EcS3 represents energy at the bottom of the conduction band of the oxide semiconductor film 404c.

As shown in FIG. 2A, the energies at the bottoms of the conduction bands of the oxide semiconductor film 404a, the oxide semiconductor film 404b, and the oxide semiconductor film 404c successively vary. This can be understood also from the fact that the constituent elements are common among the oxide semiconductor film 404a, the oxide semiconductor film 404b, and the oxide semiconductor film 404c and oxygen is easily diffused among the oxide semiconductor films 404a to 404c. Thus, the oxide semiconductor film 404a, the oxide semiconductor film 404b, and the oxide semiconductor film 404c have a continuous physical property although they have different compositions and form a stack.

The multilayer film 404 in which layers containing the same main components are stacked is formed to have not only a simple stacked-layer structure of the layers but also a continuous energy band (here, in particular, a well structure having a U shape in which the energy of the bottom of the conduction band is continuously changed between the layers). In other words, the stacked-layer structure is formed such that there exists no impurity that forms a defect level such as a trap center or a recombination center at each interface. If impurities exist between the stacked layers in the multilayer film, the continuity of the energy band is lost and carriers disappear by a trap or recombination.

Note that FIG. 2A shows the case where EcS1 and EcS3 are similar to each other; however, EcS1 and EcS3 may be different from each other. For example, part of the band structure in the case where EcS1 is higher than EcS3 is shown as in FIG. 2B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor film 404a and the oxide semiconductor film 404c and an In—Ga—Zn oxide whose atomic ratio of In to Ga and Zn is 1:1:1 or 3:1:2 can be used for the oxide semiconductor film 404b. Further, when EcS1 is higher than EcS3, an In—Ga—Zn oxide whose atomic ratio of In to Ga and Zn is 1:6:4 or 1:9:6 can be used for the oxide semiconductor film 404a, an In—Ga—Zn oxide whose atomic ratio of In to Ga and Zn is 1:1:1 or 3:1:2 can be used for the oxide semiconductor film 404b, and an In—Ga—Zn oxide whose atomic ratio of In to Ga and Zn is 1:3:2, 1:3:3, or 1:3:4 can be used for the oxide semiconductor film 404c, for example.

Figure 2B:
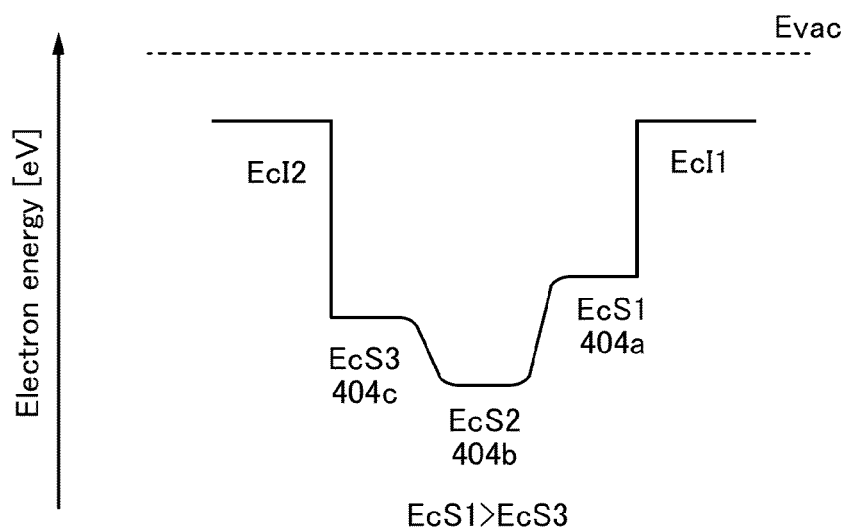

According to FIGS. 2A and 2B, the oxide semiconductor film 404b of the multilayer film 404 serves as a well, so that a channel is formed in the oxide semiconductor film 404b in a transistor including the multilayer film 404. Since the energy of the bottom of the conduction band is continuously changed, the multilayer film 404 can also be referred to as a U-shaped well. Further, a channel formed to have such a structure can also be referred to as a buried channel.

Note that trap states resulting from impurities or defects can be formed in the vicinity of the interfaces between the oxide semiconductor film 404a and an insulating film such as the silicon oxide film and between the oxide semiconductor film 404c and such an insulating film. The oxide semiconductor film 404b can be distanced away from the trap state owing to existence of the oxide semiconductor film 404a and the oxide semiconductor film 404c. However, when the energy difference between EcS1 or EcS3 and EcS2 is small, an electron in the oxide semiconductor film 404b might reach the trap state by passing over the energy difference. When the electron to be a negative charge is trapped in the trap state, the threshold voltage of the transistor is shifted in the positive direction.

Thus, to reduce a change in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor film 404a, the oxide semiconductor film 404b, and the oxide semiconductor film 404c preferably include crystal parts. In particular, when a crystal in which c-axes are aligned is used, the transistor can have stable electrical characteristics.

In the case where an In—Ga—Zn oxide is used for the multilayer film 404, it is preferable that the oxide semiconductor film 404c contain less In than the oxide semiconductor film 404b so that diffusion of In to the gate insulating film is prevented.

As the source electrode 406a and the drain electrode 406b, a conductive film capable of extracting oxygen from the oxide semiconductor film is preferably used. As an example of the conductive film capable of extracting oxygen from the oxide semiconductor film, a conductive film containing aluminum, titanium, chromium, nickel, molybdenum, tantalum, tungsten, or the like can be given.

By the conductive film capable of extracting oxygen from the oxide semiconductor film, oxygen in the oxide semiconductor film is released to form oxygen vacancies in the oxide semiconductor film in some cases. Oxygen is more likely to be extracted as the temperature is higher. Since the manufacturing process of the transistor involves some heat treatment steps, oxygen vacancies are likely to be formed in a region of the oxide semiconductor film, which is in contact with the source electrode or the drain electrode. Furthermore, hydrogen enters sites of the oxygen vacancies by heating, and thus the oxide semiconductor film becomes n-type in some cases. Thus, owing to the source electrode and the drain electrode, the resistance of a region where the oxide semiconductor film is in contact with the source electrode or the drain electrode is reduced, so that the on-state resistance of the transistor can be reduced.

Each of the insulating films 418a, 418b, and 426 is preferably an insulating film containing oxygen in excess of the stoichiometric composition. Oxygen released from the insulating film can be diffused to a channel formation region in the multilayer film 404, so that oxygen vacancies formed in the channel formation region can be filled with the oxygen. In this manner, stable electrical characteristics of the transistor can be achieved.

The gate insulating film 408 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 408 may be a stack including any of the above materials. The gate insulating film 408 may contain lanthanum (La), nitrogen, zirconium (Zr), or the like as an impurity.

An example of a stacked-layer structure of the gate insulating film 408 is described. The gate insulating film 408 includes, for example, oxygen, nitrogen, silicon, or hafnium. Specifically, the gate insulating film 408 preferably includes hafnium oxide and silicon oxide or silicon oxynitride.

Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide having a crystalline structure has higher dielectric constant than hafnium oxide with an amorphous structure. Therefore, it is preferable to use hafnium oxide having a crystalline structure in order to provide a transistor with a low off-state current. Examples of the crystalline structure include a monoclinic crystal structure and a cubic crystal structure. Note that one embodiment of the present invention is not limited to the above examples.

In some cases, an interface state due to a defect exists in hafnium oxide having a crystalline structure. The interface state serves as a trap center in some cases. Therefore, when hafnium oxide is provided near a channel region of a transistor, the electrical characteristics of the transistor might deteriorate because of the interface state. In order to reduce the adverse effect of the interface state, in some cases, it is preferable to separate the channel region of the transistor and the hafnium oxide from each other by providing another film therebetween. The film has a buffer function. The film having a buffer function may be included in the gate insulating film 408 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

In some cases, the threshold voltage of a transistor can be controlled by trapping an electric charge in an interface state (trap center) in hafnium oxide having the above-described crystalline structure. In order to make the electric charge exist stably, for example, an insulator having a larger energy gap than hafnium oxide may be provided between the channel region and the hafnium oxide. Alternatively, a semiconductor or an insulator having lower electron affinity than hafnium oxide may be provided. The film having a buffer function may be formed using a semiconductor or an insulator having higher ionization energy than hafnium oxide. With the use of such a semiconductor or an insulator, an electric charge trapped in the interface state is less likely to be released; accordingly, the electric charge can be held for a long period of time.

Examples of such an insulator include silicon oxide and silicon oxynitride. In order to make the interface state in the gate insulating film 408 trap an electric charge, an electron may be transferred from the oxide semiconductor film toward the gate electrode 410. As a specific example, the potential of the gate electrode 410 is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating film 408 or the like shifts in the positive direction. The amount of electrons to be trapped (the amount of change in threshold voltage) can be controlled by adjusting a voltage of the gate electrode 410 or time in which the voltage is applied. Note that a location in which an electric charge is trapped is not necessarily limited to the inside of the gate insulating film 408 as long as an electric charge can be trapped therein. A stacked-layer film having a similar structure may be used as another insulating layer.

The gate electrode 410 may be formed using a conductive film containing one or more of aluminum, titanium, chromium, cobalt, nickel, copper, yttrium, zirconium, molybdenum, ruthenium, silver, tantalum, tungsten, and the like.

The blocking film 412 may be formed over the gate insulating film 408 and the gate electrode 410. The blocking film can be formed using an insulating film containing one or more of aluminum oxide, silicon nitride oxide, and silicon nitride. The blocking film may be a stack including any of the above materials.

High integration of a semiconductor device requires miniaturization of a transistor. However, it is known that miniaturization of a transistor causes deterioration of the electrical characteristics of the transistor. A decrease in channel width causes a reduction in on-state current.

However, in the transistor of one embodiment of the present invention, as described above, the oxide semiconductor film 404c is formed so as to cover the channel formation region of the oxide semiconductor film 404b, and a channel formation layer and the gate insulating film are not in contact with each other. Accordingly, scattering of carriers at the interface between the channel formation layer and the gate insulating film can be reduced and the field-effect mobility of the transistor can be increased.

In the case where an oxide semiconductor film is an intrinsic or substantially intrinsic oxide semiconductor film, it is concerned that the field-effect mobility is decreased because of a reduction in the number of carriers in the oxide semiconductor film. However, in the transistor of one embodiment of the present invention, a gate electric field is applied to the oxide semiconductor film not only in the vertical direction but also in the side surface directions. That is, the gate electric field is applied to the whole of the oxide semiconductor film, whereby current flows in the bulk of the oxide semiconductor film. Consequently, a change in the electrical characteristics can be suppressed owing to the highly purified intrinsic oxide semiconductor film and the field-effect mobility of the transistor can be increased.

In the transistor of one embodiment of the present invention, the oxide semiconductor film 404b is formed over the oxide semiconductor film 404a, so that an interface state is less likely to be formed. In addition, impurities do not enter the oxide semiconductor film 404b from above and below because the oxide semiconductor film 404b is an intermediate layer in a three-layer structure. With the structure in which the oxide semiconductor film 404b is surrounded by the oxide semiconductor film 404a and the oxide semiconductor film 404c (or the oxide semiconductor film 404b is electrically covered by the gate electrode 410), on-state current of the transistor is increased as described above, and in addition, threshold voltage can be stabilized and an S value can be reduced. Thus, Icut (drain current when gate voltage is 0 V) can be reduced and power consumption can be reduced. Further, the threshold voltage of the transistor becomes stable; thus, long-term reliability of the semiconductor device can be improved.

Next, a method for manufacturing the transistor is described with reference to FIGS. 3A to 3C, FIGS. 4A to 4C, FIGS. 5A to 5C, FIGS. 6A and 6B, and FIGS. 7A and 7B.

First, the conductive film 401 is formed over the substrate 400, and an insulating film is formed over the substrate 400 and the conductive film 401. Then, removing (polishing) treatment is performed on the insulating film to remove a part of the insulating film and expose the conductive film 401, whereby the insulating film 402 is formed (see FIG. 3A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The conductive film 401 can be formed by a sputtering method, a PECVD method, a thermal CVD method, a vacuum evaporation method, a PLD method, or the like. The conductive film 401 can be formed using Al, Ti, Cr, Co, Ni, Cu, Y, Zr, Mo, Ru, Ag, Ta, W, or an alloy material containing any of these as its main component.

The insulating film 402 can be formed by a sputtering method, a PECVD method, a thermal CVD method, a vacuum evaporation method, a PLD method, or the like. The insulating film 402 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

For the removing treatment, chemical mechanical polishing (CMP) treatment can be preferably used. Another removing treatment may be used. Alternatively, the polishing treatment such as the CMP treatment may be combined with etching (dry etching or wet etching) treatment, plasma treatment, or the like. For example, after the CMP treatment, dry etching treatment or plasma treatment (e.g., reverse sputtering) may be performed in order to improve the flatness of a surface to be processed. When the removing treatment is combined with etching treatment, plasma treatment, or the like, the order of steps may be, without any particular limitation, determined as appropriate depending on the material, thicknesses, and surface roughness.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the flatness of the surface of the insulating film 402 can be further increased.

Figure 3A:
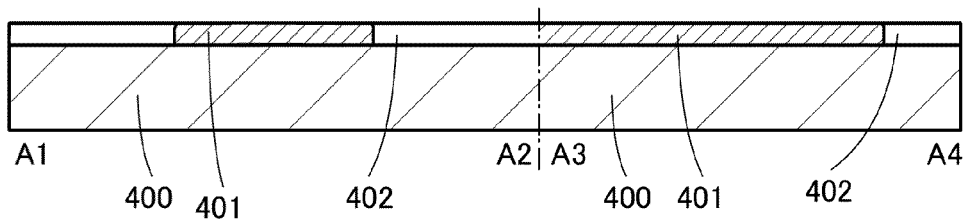
FIGS. 3A to 3C illustrate a method for manufacturing a transistor.
Figure 3B:
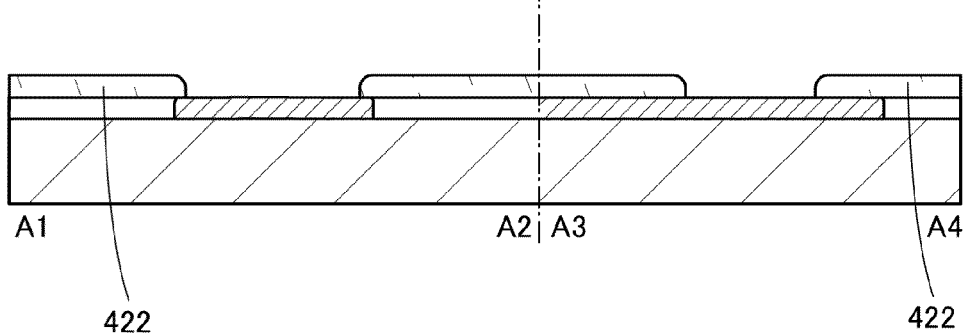

Next, the blocking film 422 is formed over the conductive film 401 and the insulating film 402 (see FIG. 3B).

The blocking film 422 can be formed by a sputtering method, a PECVD method, a thermal CVD method, a vacuum evaporation method, a PLD method, or the like. The blocking film 422 can be formed using an insulating film containing one or more of aluminum oxide, silicon nitride oxide, and silicon nitride. The blocking film may be a stack including any of the above materials.

Figure 3C:
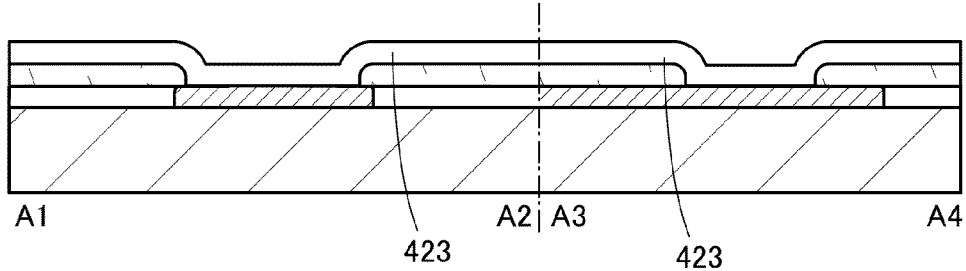

Next, a base insulating film 423 is formed over the conductive film 401 and the blocking film 422 (see FIG. 3C).

The base insulating film 423 can be formed by a sputtering method, a PECVD method, a thermal CVD method, a vacuum evaporation method, a PLD method, or the like. The base insulating film 423 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed. Alternatively, a stack including any of the above materials may be used, and at least an upper layer of the base insulating film 423 which is in contact with the multilayer film 404 is preferably formed using a material containing excess oxygen that might serve as a supply source of oxygen to the multilayer film 404.

Oxygen may be added to the base insulating film 423 by an ion implantation method, an ion doping method, a plasma immersion ion implantation method, or the like. Adding oxygen enables the base insulating film 423 to supply oxygen much easily to the multilayer film 404.

Figure 4A:
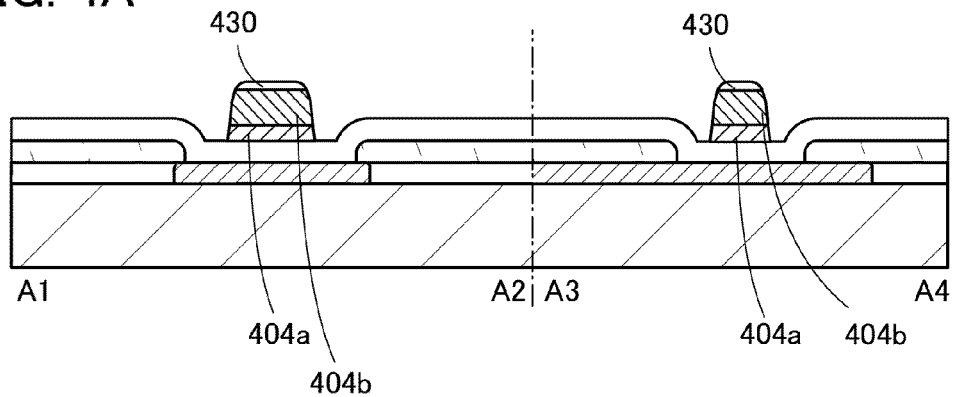
FIGS. 4A to 4C illustrate a method for manufacturing a transistor.

Next, an oxide semiconductor film to be the oxide semiconductor film 404a and an oxide semiconductor film to be the oxide semiconductor film 404b are formed over the base insulating film 423 and processed using a hard mask 430, whereby the oxide semiconductor film 404a and the oxide semiconductor film 404b are formed (see FIG. 4A).

In order to form the oxide semiconductor films to be the oxide semiconductor film 404a and the oxide semiconductor film 404b into an island-like shape, first, the hard mask 430 is provided over the oxide semiconductor film to be the oxide semiconductor film 404b, and then, the oxide semiconductor film to be the oxide semiconductor film 404a and the oxide semiconductor film to be the oxide semiconductor film 404b are etched using the hard mask 430 as a mask. At the time of the etching, end portions of the hard mask are gradually reduced as the etching progresses; as a result, the end portions of the hard mask may be rounded to have curved surfaces. Accordingly, end portions of the oxide semiconductor film 404b may also be rounded to have curved surfaces. This structure improves the coverage with a film which is to be formed over the oxide semiconductor film 404b; thus a shape defect of the film such as disconnection can be prevented. In the case where the end portions of the oxide semiconductor film 404b are rounded to have curved surfaces, electric field concentration which might occur at end portions of the source electrode 406a and the drain electrode 406b can be reduced, which can suppress deterioration of the transistor. Note that the hard mask 430 can be formed using tungsten, titanium, molybdenum, tantalum, or the like.

In the case where the oxide semiconductor film 404a and the oxide semiconductor film 404b are formed by a sputtering method, a power supply device for generating plasma can be an RF power supply device, an AC power supply device, a DC power supply device, or the like as appropriate. Note that it is preferable to use DC discharge applicable to a large-sized substrate in deposition because the semiconductor devices can be manufactured with high productivity.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

Note that a chamber in a sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for the oxide semiconductor film 404a and the oxide semiconductor film 404b, is removed as much as possible. Alternatively, a turbo molecular pump and a cold trap are preferably combined so as to prevent a backflow of a gas, especially a gas containing carbon or hydrogen from an exhaust system to the inside of the chamber.

In order to obtain an intrinsic or substantially intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 404a and the oxide semiconductor film 404b can be prevented as much as possible.

Note that the oxide semiconductor film 404a and/or the oxide semiconductor film 404b can be formed with a deposition apparatus utilizing ALD instead of sputtering. For example, in the case where an In—Ga—Zn oxide film is formed, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The materials described above can be used for the oxide semiconductor film 404a, the oxide semiconductor film 404b, and the oxide semiconductor film 404c that is to be formed in a later step. For example, an In—Ga—Zn oxide whose atomic ratio of In to Ga and Zn is 1:3:4 or 1:3:2 can be used for the oxide semiconductor film 404a, an In—Ga—Zn oxide whose atomic ratio of In to Ga and Zn is 1:1:1 can be used for the oxide semiconductor film 404b, and an In—Ga—Zn oxide whose atomic ratio of In to Ga and Zn is 1:3:4 or 1:3:2 can be used for the oxide semiconductor film 404c.

An oxide that can be used for each of the oxide semiconductor films 404a, 404b, and 404c preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that here, for example, an "In—Ga—Zn oxide" means an oxide containing In, Ga, and Zn as its main components. The In—Ga—Z-based oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used. Note that M represents one or more metal elements selected from Ga, Fe, Mn, and Co. Alternatively, a material represented by $In_2SnO_5(ZnO)_n$ (n>0 is satisfied, and n is an integer) may be used.

In the case of using an In—Ga—Zn oxide, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used for the oxide semiconductor film 404a, the oxide semiconductor film 404b, and the oxide semiconductor film 404c so that the oxide semiconductor film 404a and the oxide semiconductor film 404c each have an electron affinity lower than that of the oxide semiconductor film 404b.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content in the oxide semiconductor film 404b is preferably higher than those in the oxide semiconductor film 404a and the oxide semiconductor film 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. For this reason, with the use of an oxide having a high indium content for the oxide semiconductor film 404b, a transistor having high mobility can be achieved.

A structure of the oxide semiconductor film is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that an angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

<Structure of Oxide Semiconductor Film>

A structure of the oxide semiconductor film is described below.

An oxide semiconductor film is classified into a single crystal oxide semiconductor film and a non-single-crystal oxide semiconductor film. Examples of a non-single-crystal oxide semiconductor film include a c-axis aligned crystalline oxide semiconductor (CAAC-OS) film, a polycrystalline oxide semiconductor film, a microcrystalline oxide semiconductor film, and an amorphous oxide semiconductor film.

From another perspective, an oxide semiconductor film is classified into an amorphous oxide semiconductor film and a crystalline oxide semiconductor film. Examples of a crystalline oxide semiconductor film include a single crystal oxide semiconductor film, a CAAC-OS film, a polycrystalline oxide semiconductor film, and a microcrystalline oxide semiconductor film.

<CAAC-OS Film>

First, a CAAC-OS film is described. Note that a CAAC-OS can be referred to as an oxide semiconductor including c-axis aligned nanocrystals (CANC).

A CAAC-OS film is one of oxide semiconductor films having a plurality of c-axis aligned crystal parts (also referred to as pellets).

In a combined analysis image (also referred to as a high-resolution TEM image) of a bright-field image and a diffraction pattern of a CAAC-OS film, which is obtained using a transmission electron microscope (TEM), a plurality of pellets can be observed. However, in the high-resolution TEM image, a boundary between pellets, that is, a grain boundary is not clearly observed. Thus, in the CAAC-OS film, a reduction in electron mobility due to the grain boundary is less likely to occur.

Figure 32A:
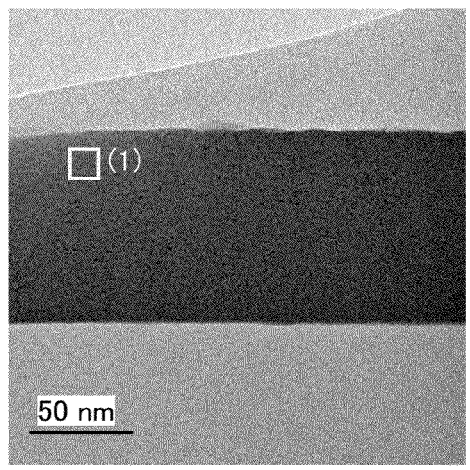
FIGS. 32A to 32D are Cs-corrected high-resolution TEM images of a cross section of a CAAC-OS and a cross-sectional schematic view of the CAAC-OS.

The CAAC-OS observed with a TEM is described below. FIG. 32A shows an example of a high-resolution TEM image of a cross section of the CAAC-OS film which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 32B:
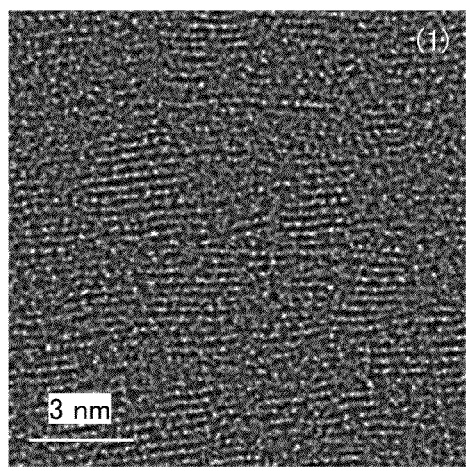

FIG. 32B is an enlarged Cs-corrected high-resolution TEM image of a region (1) in FIG. 32A. FIG. 32B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 32C:
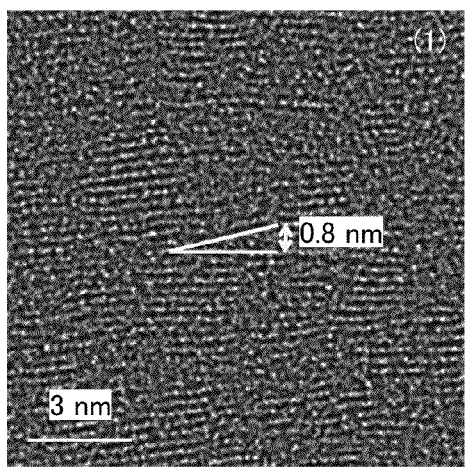

As shown in FIG. 32B, the CAAC-OS film has a characteristic atomic arrangement. The characteristic atomic arrangement is denoted by an auxiliary line in FIG. 32C. FIGS. 32B and 32C prove that the size of a pellet is approximately 1 nm to 3 nm, and the size of a space caused by tilt of the pellets is approximately 0.8 nm. Therefore, the pellet can be referred to as nanocrystal (nc).

Figure 32D:
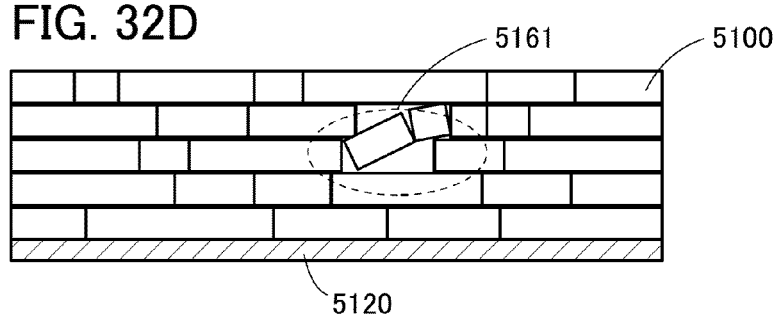

Here, according to the Cs-corrected high-resolution TEM images, the schematic arrangement of pellets 5100 of a CAAC-OS film over a substrate 5120 is illustrated by such a structure in which bricks or blocks are stacked (see FIG. 32D). The part in which the pellets are tilted as observed in FIG. 32C corresponds to a region 5161 shown in FIG. 32D.

Figure 33A:
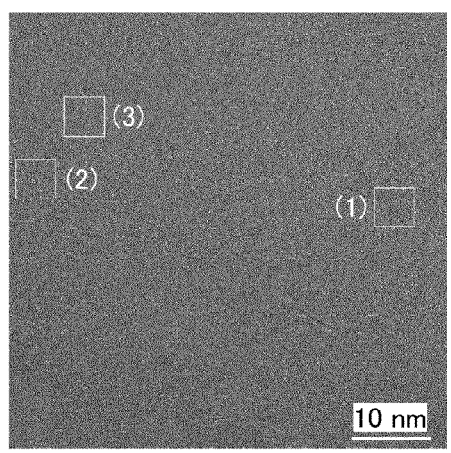
FIGS. 33A to 33D are Cs-corrected high-resolution TEM images of a plane of a CAAC-OS.
Figure 33B:
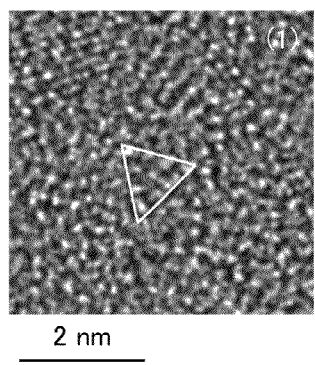
Figure 33C:
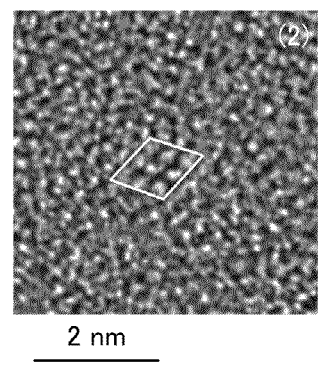
Figure 33D:
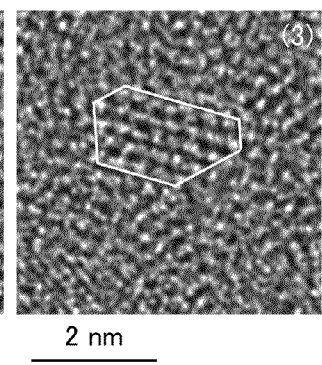

FIG. 33A shows a Cs-corrected high-resolution TEM image of a plane of the CAAC-OS film observed from a direction substantially perpendicular to the sample surface. FIGS. 33B, 33C, and 33D are enlarged Cs-corrected high-resolution TEM images of regions (1), (2), and (3) in FIG. 33A, respectively. FIGS. 33B, 33C, and 33D indicate that metal atoms are arranged in a triangular, quadrangular, or hexagonal configuration in a pellet. However, there is no regularity of arrangement of metal atoms between different pellets.

Figure 34A:
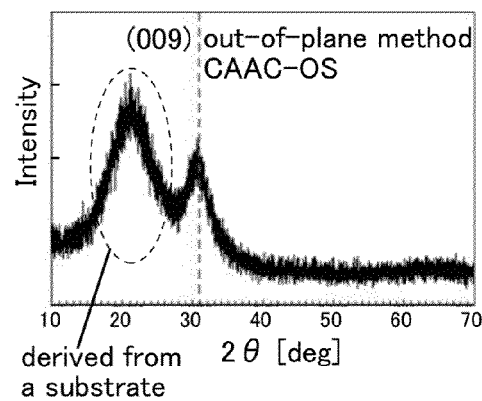
FIGS. 34A to 34C show structural analysis of a CAAC-OS and a single crystal oxide semiconductor by XRD.

Next, the CAAC-OS film analyzed by X-ray diffraction (XRD) is described. For example, when the structure of a CAAC-OS film including an $InGaZnO_4$ crystal is analyzed by an out-of-plane method, a peak appears at a diffraction angle (2θ) of around 31° as shown in FIG. 34A. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS.

Note that in structural analysis of the CAAC-OS film by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is more preferable that in the CAAC-OS film analyzed by an out-of-plane method, a peak appear when 2θ is around 31° and that a peak not appear when 2θ is around 36°.

Figure 34B:
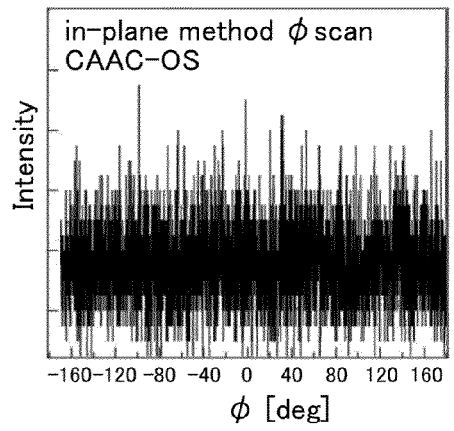
Figure 34C:
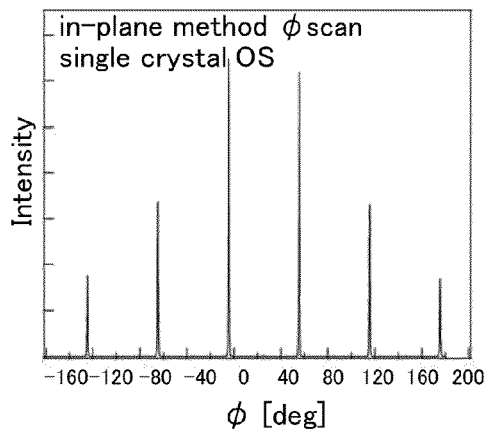

On the other hand, in structural analysis of the CAAC-OS film by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS film, when analysis (φ scan) is performed with 2θ fixed at around 56° and with the sample rotated using a normal vector of the sample surface as an axis (φ axis), as shown in FIG. 34B, a peak is not clearly observed. In contrast, in the case of a single crystal oxide semiconductor film of $InGaZnO_4$, when φ scan is performed with 2θ fixed at around 56°, as shown in FIG. 34C, six peaks which are derived from crystal planes equivalent to the (110) plane are observed. Accordingly, the structural analysis using XRD shows that the directions of a-axes and b-axes are different in the CAAC-OS film.

Next, the CAAC-OS film analyzed by electron diffraction is described. For example, when an electron beam with a probe diameter of 300 nm is incident on a CAAC-OS film including an $InGaZnO_4$ crystal in a direction parallel to the sample surface, a diffraction pattern (also referred to as a selected-area transmission electron diffraction pattern) shown in FIG. 35A might be obtained. In this diffraction pattern, spots derived from the (009) plane of an InGaZnO₄ crystal are included. Thus, the electron diffraction also indicates that pellets included in the CAAC-OS film have c-axis alignment and that the c-axes are aligned in a direction substantially perpendicular to the formation surface or the top surface of the CAAC-OS film. Meanwhile, FIG. 35B shows a diffraction pattern obtained in such a manner that an electron beam with a probe diameter of 300 nm is incident on the same sample in a direction perpendicular to the sample surface. As shown in FIG. 35B, a ring-like diffraction pattern is observed. Thus, the electron diffraction also indicates that the a-axes and b-axes of the pellets included in the CAAC-OS film do not have regular alignment. The first ring in FIG. 35B is considered to be derived from the (010) plane, the (100) plane, and the like of the InGaZnO₄ crystal. The second ring in FIG. 35B is considered to be derived from the (110) plane and the like.

Moreover, the CAAC-OS film is an oxide semiconductor film having a low density of defect states. Defects in the oxide semiconductor film are, for example, a defect due to impurity and oxygen vacancies. Therefore, the CAAC-OS film can be regarded as an oxide semiconductor film with a low impurity concentration, or an oxide semiconductor film having a small number of oxygen vacancies.

The impurity contained in the oxide semiconductor film might serve as carrier traps or serve as carrier generation sources. In addition, oxygen vacancies in the oxide semiconductor film might serve as carrier traps or serve as carrier generation sources when hydrogen is captured therein.

Note that the impurity means an element other than the main components of the oxide semiconductor film, such as hydrogen, carbon, silicon, or a transition metal element. For example, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity.

An oxide semiconductor having a low density of defect states (a small number of oxygen vacancies) can have a low carrier density. Such an oxide semiconductor film is referred to as a highly purified intrinsic or substantially highly purified intrinsic oxide semiconductor film. A CAAC-OS film has a low impurity concentration and a low density of defect states. That is, a CAAC-OS film is likely to be highly purified intrinsic or substantially highly purified intrinsic oxide semiconductor film. Thus, a transistor including a CAAC-OS film rarely has negative threshold voltage (is rarely normally on). The highly purified intrinsic or substantially highly purified intrinsic oxide semiconductor film has few carrier traps. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics. However, a transistor including a CAAC-OS film has small variation in electrical characteristics and high reliability.

Since the CAAC-OS film has a low density of defect states, the number of carriers trapped in defect states by light irradiation is small. Therefore, in a transistor using the CAAC-OS film, change in electrical characteristics due to irradiation with visible light or ultraviolet light is small.

<Microcrystalline Oxide Semiconductor Film>

Next, a microcrystalline oxide semiconductor film is described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases. Note that there is a possibility that the origin of the nanocrystal is the same as that of a pellet in a CAAC-OS film. Therefore, a crystal part of the nc-OS film may be referred to as a pellet in the following description.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS film when an electron beam having a probe diameter close to or smaller than the size of a pellet is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since there is no regularity of crystal orientation between the pellets (nanocrystals) as mentioned above, the nc-OS film can also be referred to as an oxide semiconductor film including random aligned nanocrystals (RANC) or an oxide semiconductor film including non-aligned nanocrystals (NANC).

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different pellets in the nc-OS film. Therefore, the nc-OS film has a higher density of defect states than the CAAC-OS film.

<Amorphous Oxide Semiconductor Film>

Next, an amorphous oxide semiconductor film is described.

The amorphous oxide semiconductor film is an oxide semiconductor film having disordered atomic arrangement and no crystal part and exemplified by an oxide semiconductor film which exists in an amorphous state as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and only a halo pattern appears when the amorphous oxide semiconductor film is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor film to be called an amorphous oxide semiconductor film as long as even a negligible degree of ordering is present in an atomic arrangement. At least an oxide semiconductor film having long-term ordering cannot be called an amorphous oxide semiconductor film. Accordingly, because of the presence of crystal part, for example, a CAAC-OS film and an nc-OS film cannot be called an amorphous oxide semiconductor film or a completely amorphous oxide semiconductor film.

<Amorphous-Like Oxide Semiconductor Film>

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed.

An a-like OS film has an unstable structure because it includes a void. To verify that an a-like OS film has an unstable structure as compared with a CAAC-OS film and an nc-OS film, a change in structure caused by electron irradiation is described below.

An a-like OS film, an nc-OS film, and a CAAC-OS film are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 36:
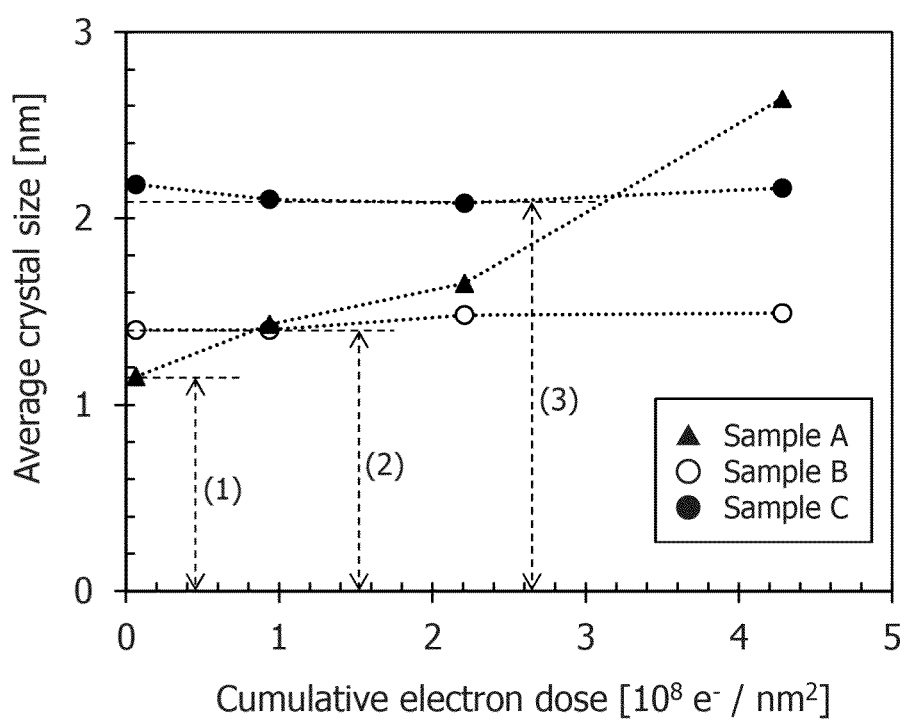
FIG. 36 shows a change of crystal parts of an In—Ga—Zn oxide owing to electron irradiation.

FIG. 36 shows the change in the average size of crystal parts (at 22 points to 45 points) in each sample. Note that the crystal part size corresponds to the length of a lattice fringe. FIG. 36 indicates that the crystal part size in the a-like OS increases with an increase in the cumulative electron dose. Specifically, as shown by (1) in FIG. 36, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS film and the CAAC-OS film shows little change from the start of electron irradiation to a cumulative electron dose of $4.2 \times 10^8$ e$^-$/nm$^2$. Specifically, as shown by (2) and (3) in FIG. 36, the average crystal sizes in an nc-OS and a CAAC-OS are approximately 1.4 nm and approximately 2.1 nm, respectively, regardless of the cumulative electron dose.

In this manner, growth of the crystal part in the a-like OS film is induced by electron irradiation. In contrast, in the nc-OS film and the CAAC-OS film, growth of the crystal part is hardly induced by electron irradiation. Therefore, the a-like OS film has an unstable structure as compared with the nc-OS film and the CAAC-OS film.

The a-like OS film has a lower density than the nc-OS film and the CAAC-OS film because it includes a void. Specifically, the density of the a-like OS film is higher than or equal to 78.6% and lower than 92.3% of the density of the single crystal oxide semiconductor film having the same composition. The density of each of the nc-OS film and the CAAC-OS film is higher than or equal to 92.3% and lower than 100% of the density of the single crystal oxide semiconductor film having the same composition. Note that it is difficult to deposit an oxide semiconductor having a density of lower than 78% of the density of the single crystal oxide semiconductor film.

For example, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductor films have various structures and various properties. Note that an oxide semiconductor film may be a stacked layer film including two or more films of an amorphous oxide semiconductor film, an a-like OS film, a microcrystalline oxide semiconductor film, and a CAAC-OS film, for example.

<Deposition Model>

Examples of deposition models of a CAAC-OS film and an nc-OS film are described below.

FIG. 37A is a schematic view of the inside of a deposition chamber where a CAAC-OS film is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 38A:
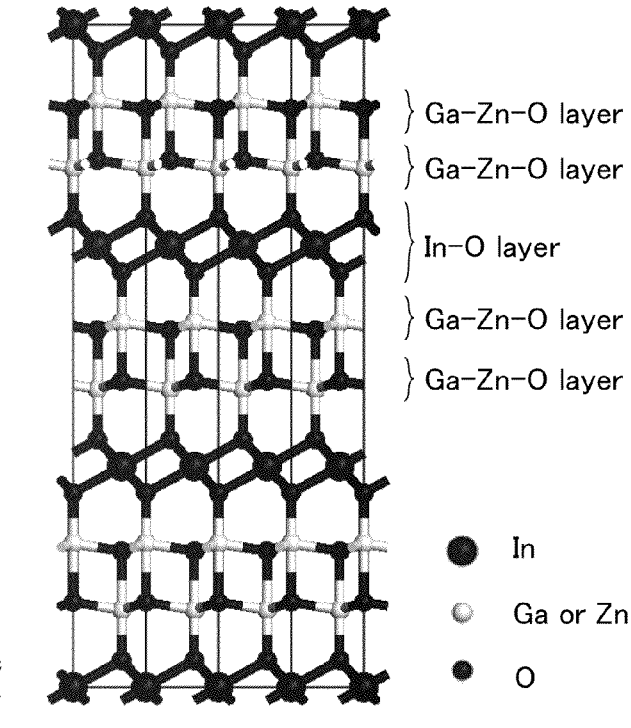
FIGS. 38A to 38C illustrate an $InGaZnO_4$ crystal and a pellet.

Here, the target 5130 has a polycrystalline structure which includes a plurality of crystal grains and in which a cleavage plane exists in at least one crystal grain. FIG. 38A shows a structure of an $InGaZnO_4$ crystal included in the target 5130 as an example. Note that FIG. 38A shows a structure of the case where the $InGaZnO_4$ crystal is observed from a direction parallel to the b-axis. FIG. 38A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 38B:
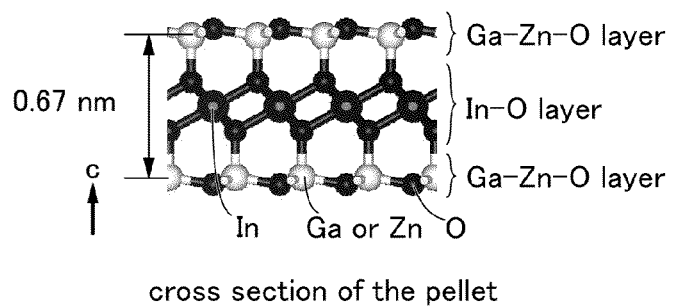
Figure 38C:
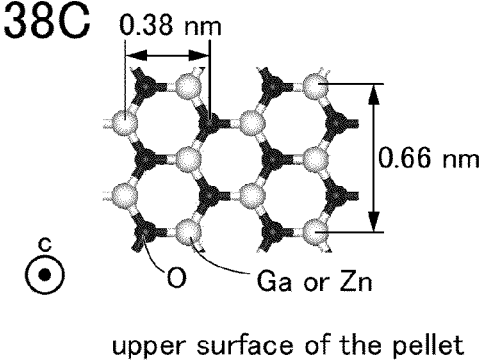

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 36. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 38B is separated. Note that FIG. 38C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. In this manner, when the side surfaces are charged with the same polarity, charges repel each other, and accordingly, the pellet 5100 can maintain a flat-plate shape. In the case where a CAAC-OS film is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 36 corresponds to the amount of growth in plasma. Here, in the case where the temperature of the substrate 5120 is at around room temperature, the pellet 5100 on the substrate 5120 hardly grows; thus, an nc-OS film is formed (see FIG. 37B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

As shown in FIGS. 37A and 37B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets or/and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 37A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS film might be filled; thus, the CAAC-OS film has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS film.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS film does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS film owing to heating during deposition, heating or bending after deposition, it is possible to relieve local stress or release distortion. Therefore, this structure is suitable for a flexible semiconductor device. Note that the nc-OS film has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 39A to 39D are cross-sectional schematic views.

Figure 39A:
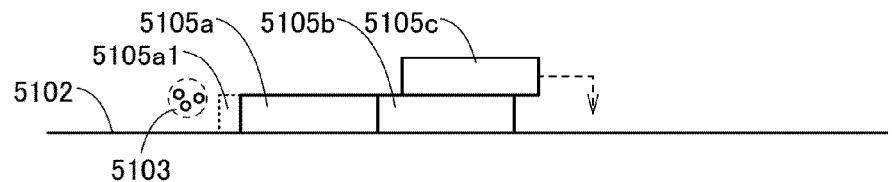
FIGS. 39A to 39D are schematic diagrams illustrating a deposition model of a CAAC-OS.

As illustrated in FIG. 39A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 39B:
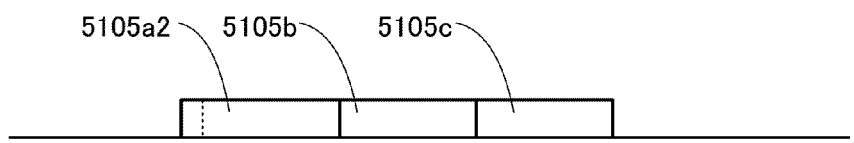

Then, as illustrated in FIG. 39B, the region 5105a1 grows to part of the pellet 5105a to form a pellet 5105a2. In addition, a side surface of the pellet 5105c is in contact with another side surface of the pellet 5105b.

Figure 39C:
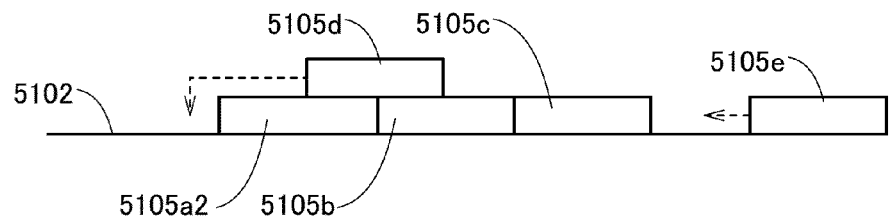

Next, as illustrated in FIG. 39C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 39D:
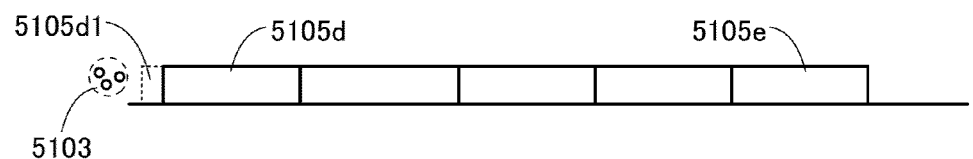

Then, as illustrated in FIG. 39D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS film is formed over the substrate 5120. Therefore, each pellet of the CAAC-OS film is larger than that of the nc-OS film. A difference in size between (3) and (2) in FIG. 36 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In that case, in an oxide semiconductor film used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS film can be deposited even when a formation surface does not have a crystal structure; therefore, a growth mechanism in this case is different from epitaxial growth. In addition, laser crystallization is not needed for formation of a CAAC-OS film, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS film can be formed.

In addition, it is found that in formation of the CAAC-OS film, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS layer can be obtained.

In the case where the top surface of the substrate 5120 has unevenness, a CAAC-OS film in which n layers (n is a natural number) in each of which the pellets 5100 are arranged along the unevenness are stacked is formed. Since the substrate 5120 has unevenness, a gap is easily generated between the pellets 5100 in the CAAC-OS film in some cases. Note that owing to intermolecular force, the pellets 5100 are arranged so that a gap between the pellets is as small as possible even on the unevenness surface. Therefore, even when the formation surface has unevenness, a CAAC-OS film with high crystallinity can be obtained.

Since a CAAC-OS film is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS film with high crystallinity can be formed even on a formation surface with an amorphous structure.

First heat treatment may be performed after the oxide semiconductor film 404b is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor film 404b can be improved, and in addition, impurities such as hydrogen and water can be removed from the base insulating film 423 and the oxide semiconductor film 404a. Note that the first heat treatment may be performed before etching for formation of the oxide semiconductor film 404b.

Figure 4B:
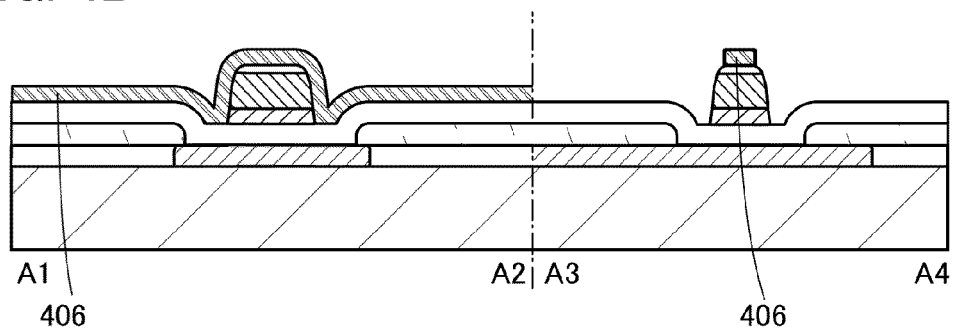

Next, a conductive film 406 to be the source electrode 406a and the drain electrode 406b is formed over the oxide semiconductor film 404b (see FIG. 4B). For the conductive film 406, Al, Cr, Cu, Ta, Ti, Mo, W, or an alloy material containing any of these as a main component can be used. For example, a 100-nm-thick titanium film is formed by a sputtering method or the like. Alternatively, a tungsten film may be formed by a CVD method.

Figure 4C:
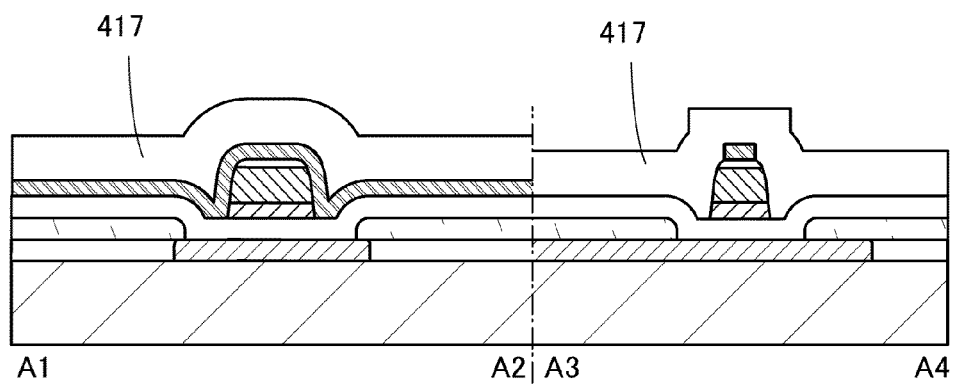

Next, an insulating film 417 is formed over the base insulating film 423 and the conductive film 406 (see FIG. 4C). The insulating film 417 can be formed using a material and a method similar to those of the base insulating film 423.

Figure 5A:
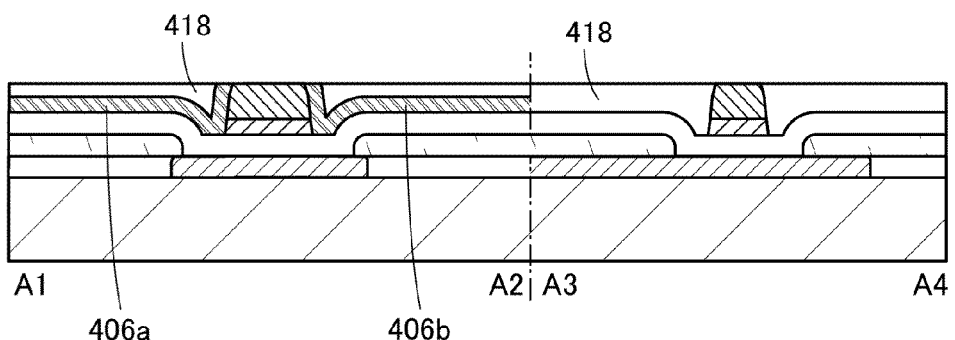
FIGS. 5A to 5C illustrate a method for manufacturing a transistor.

Next, removing (polishing) treatment is performed on the conductive film 406, the insulating film 417, and the hard mask 430 to remove a part of the conductive film 406, a part of the insulating film 417, and the hard mask 430 and expose the oxide semiconductor film 404b, whereby the source electrode 406a, the drain electrode 406b, and the insulating film 418 are formed (see FIG. 5A).

For the removing treatment, CMP treatment can be preferable used. Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the flatness of the surface of the insulating film 418 can be further improved.

Figure 5B:
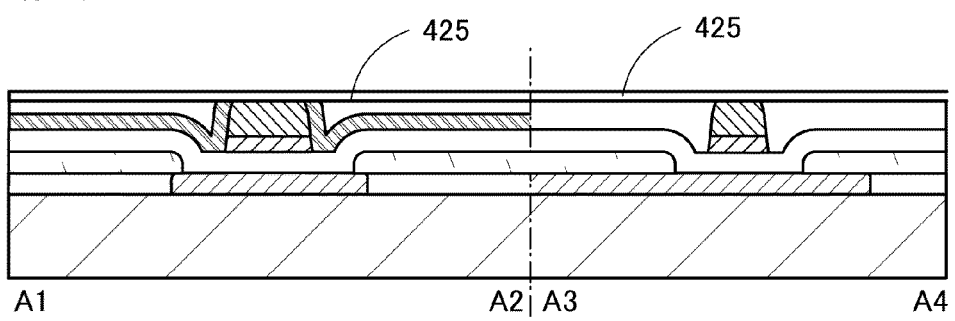

Next, an insulating film 425 is formed over the oxide semiconductor film 404b, the source electrode 406a, the drain electrode 406b, and the insulating film 418 (see FIG. 5B). The insulating film 425 can be formed using a material and a method similar to those of the base insulating film 423.

Figure 5C:
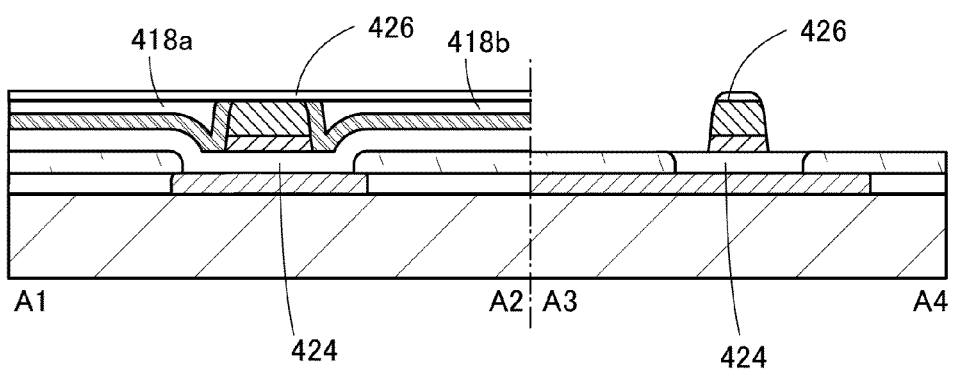

Next, the insulating film 425, the insulating film 418, and the base insulating film 423 are etched to form the insulating film 426, the insulating film 418a, the insulating film 418b, and the base insulating film 424 (see FIG. 5C).

Figure 6A:
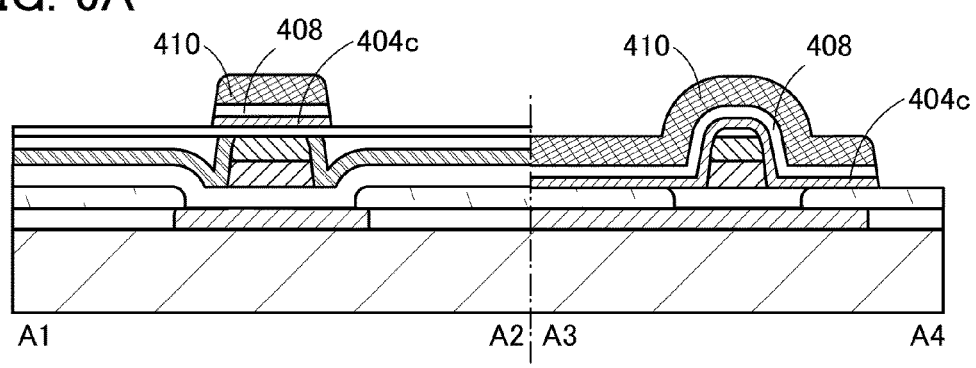
FIGS. 6A and 6B illustrate a method for manufacturing a transistor.

Next, the oxide semiconductor film 404c, the gate insulating film 408, and the gate electrode 410 are formed over the blocking film 422, the base insulating film 424, and the insulating film 426 (see FIG. 6A).

Note that second heat treatment may be performed after an oxide semiconductor film to be the oxide semiconductor film 404c is formed. The second heat treatment can be performed in a condition similar to that of the first heat treatment. By the second heat treatment, impurities such as hydrogen and water can be removed from the oxide semiconductor film to be the oxide semiconductor film 404c. In addition, impurities such as hydrogen and water can be further removed from the oxide semiconductor film 404a and the oxide semiconductor film 404b.

The gate insulating film 408 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 408 may have a stacked-layer structure of any of the above materials. The gate insulating film 408 can be formed by a sputtering method, a PECVD method, a thermal CVD method, a vacuum evaporation method, a PLD method, or the like.

For the gate electrode 410, Al, Ti, Cr, Co, Ni, Cu, Y, Zr, Mo, Ru, Ag, Ta, W, or an alloy material containing any of these as its main component can be used. The gate electrode 410 can be formed by a sputtering method, a PECVD method, a thermal CVD method, a vacuum evaporation method, a PLD method, or the like. The gate electrode 410 may be formed using a conductive film containing nitrogen or a stack including the conductive film and a conductive film containing nitrogen. Note that the gate electrode 410 is formed so as to electrically surround the oxide semiconductor film 404b as illustrated in the drawing.

Figure 6B:
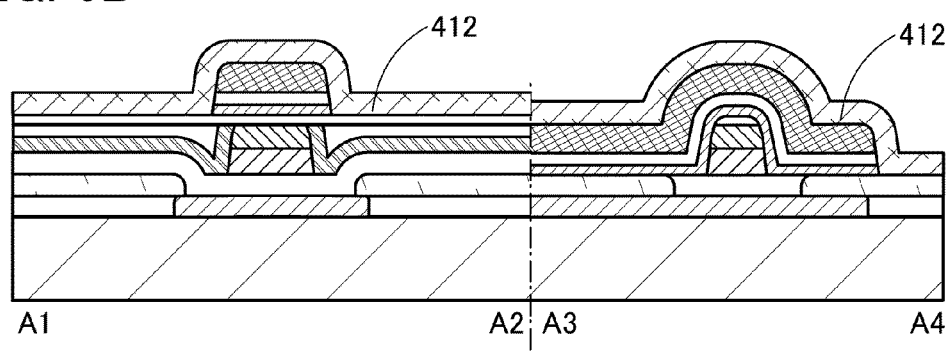

Next, the blocking film 412 is formed over the insulating film 426, the gate electrode 410, and the blocking film 422 (see FIG. 6B). For the blocking film 412, the material and the formation method of the blocking film 422 can be referred to.

Through the above process, the transistor 450 illustrated in FIGS. 1A and 1B can be manufactured. Because the transistor 450 is surrounded by the blocking film 412 and the blocking film 422, it is possible to prevent outward diffusion of oxygen from the multilayer film 404 and entry of hydrogen, water, or the like into the multilayer film 404 from the outside, so that generation of an oxygen vacancy in the oxide semiconductor film can be suppressed. As a result, stable electrical characteristics of the transistor can be achieved.

Modification Example 1

Figure 7A:
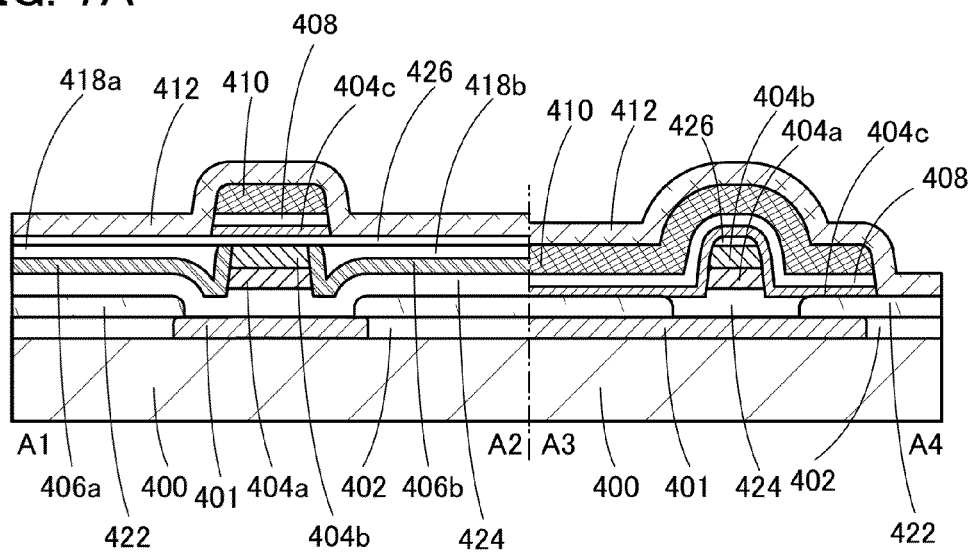
FIGS. 7A and 7B are each a cross-sectional view illustrating a transistor.
Figure 7B:
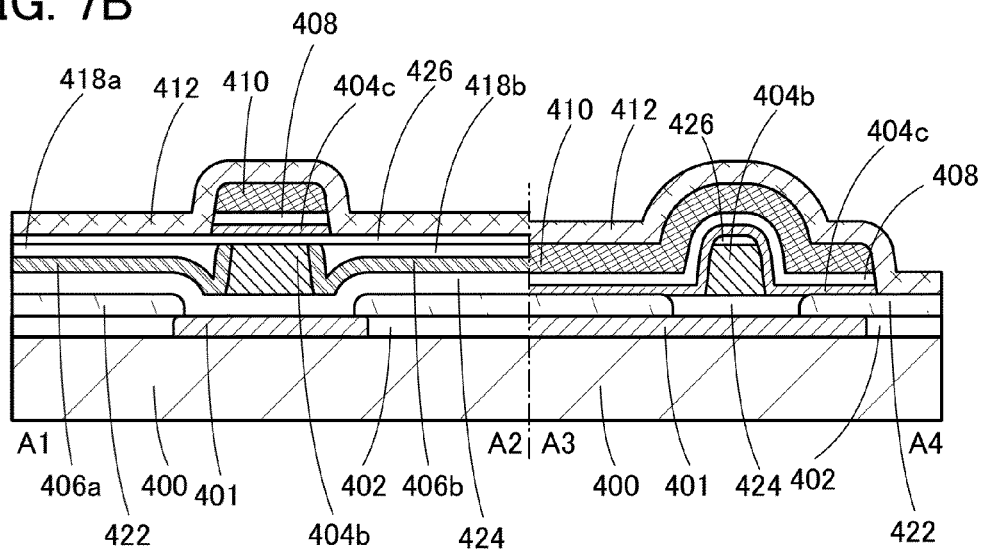
Figure 8A:
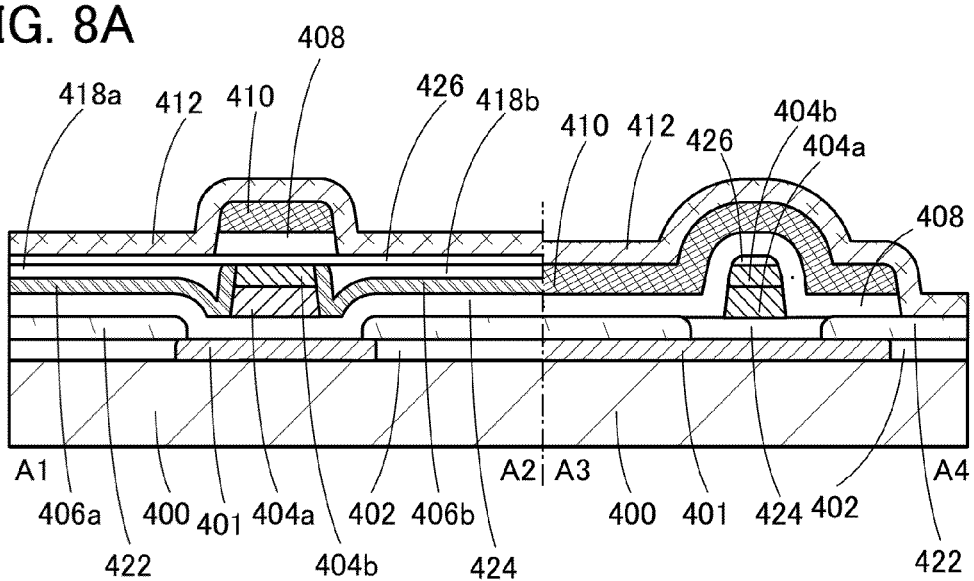
FIGS. 8A and 8B are each a cross-sectional view illustrating a transistor.
Figure 8B:
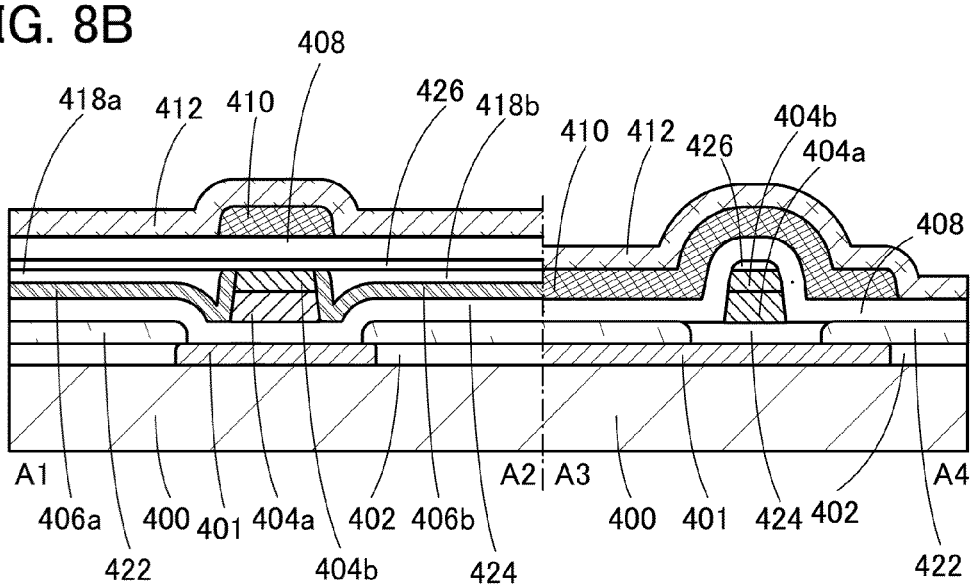
Figure 9A:
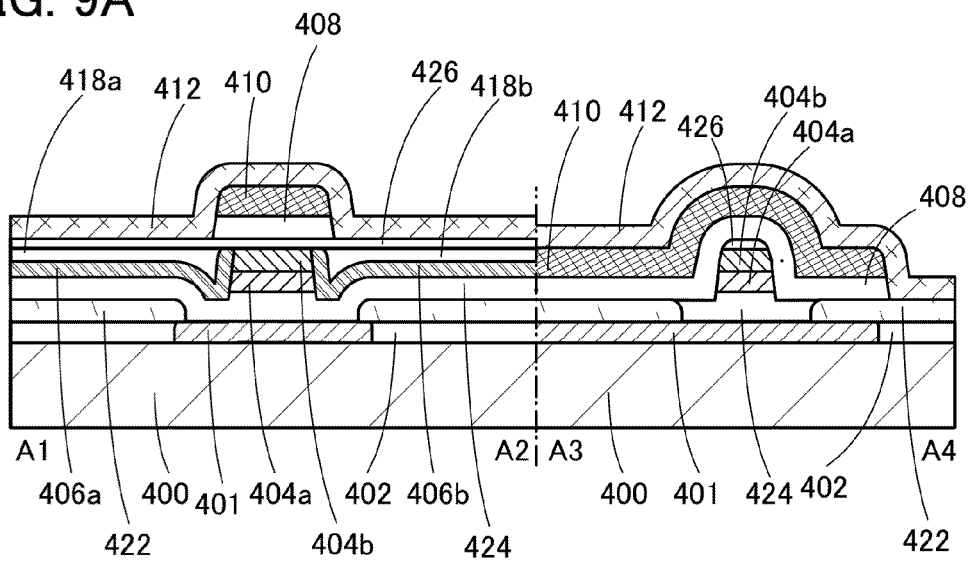
FIGS. 9A and 9B are each a cross-sectional view illustrating a transistor.
Figure 9B:
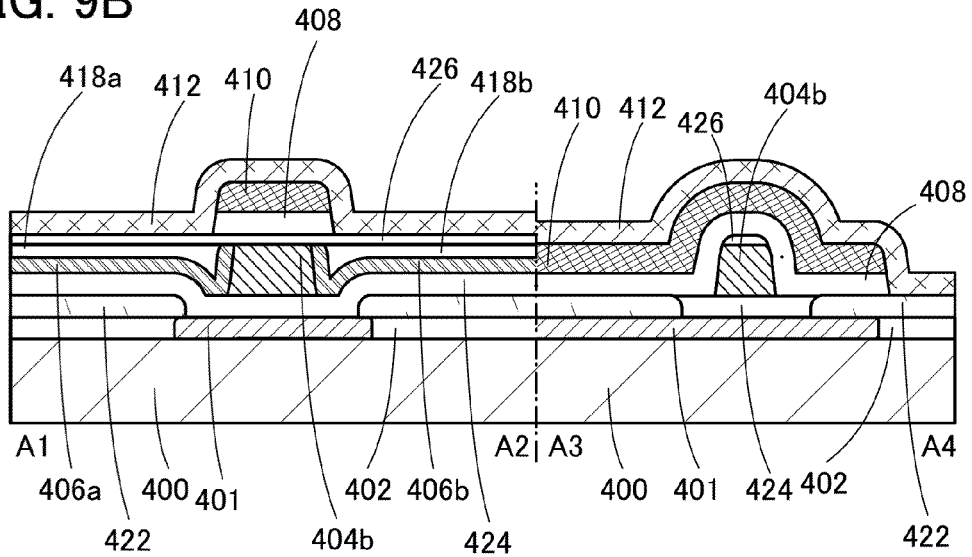
Figure 10A:
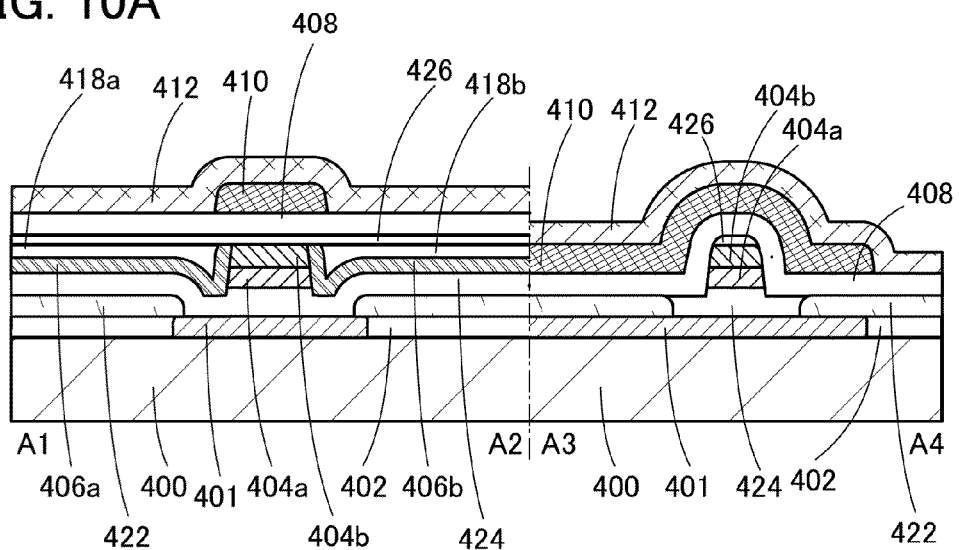
FIGS. 10A and 10B are each a cross-sectional view illustrating a transistor.
Figure 10B:
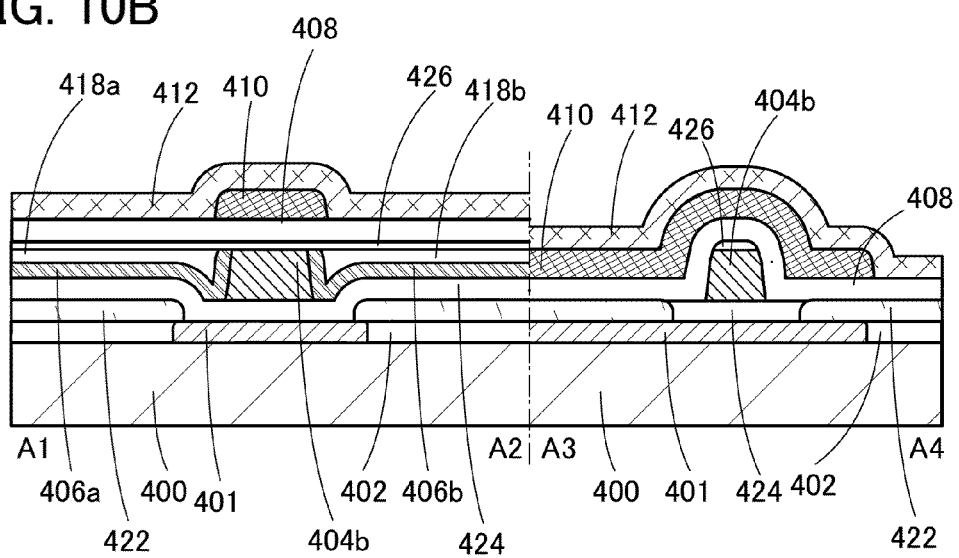

As in a transistor illustrated in FIG. 7A, a surface of the base insulating film 424 may be etched when the oxide semiconductor film 404a and the oxide semiconductor film 404b are etched. Note that the description of the transistor illustrated in FIGS. 1A and 1B is referred to for the other components.

Modification Example 2

In this embodiment, the structure in which the oxide semiconductor film 404b is provided between the oxide semiconductor film 404a and the oxide semiconductor film 404c is described. However, this embodiment is not limited to thereto. A structure without the oxide semiconductor film 404a and/or the oxide semiconductor film 404c may be used. Furthermore, another oxide semiconductor film may be additionally provided. For example, as illustrated in a transistor in FIG. 7B, a structure including only the oxide semiconductor film 404b and the oxide semiconductor film 404c may be used. Note that the description of the transistor illustrated in FIGS. 1A and 1B is referred to for the structures of the other components.

Note that, depending on circumstances or conditions, the oxide semiconductor film 404c is not necessarily provided, and etching of the gate insulating film 408 is not needed. FIGS. 8A and 8B, FIGS. 9A and 9B, and FIGS. 10A and 10B show examples in which such structures are applied to the structures in FIGS. 1A and 1B, FIGS. 7A and 7B, and the like.

Although an example where a channel or the like is formed in an oxide semiconductor film is described in this embodiment or the like, one embodiment of the present invention is not limited thereto. For example, depending on cases or conditions, a channel, the vicinity of the channel, a source region, a drain region, or the like may be formed using a material containing Si (silicon), Ge (germanium), SiGe (silicon germanium), GaAs (gallium arsenide), or the like.

This embodiment can be combined with any of the other embodiments in this specification as appropriate.

Embodiment 2

In this embodiment, a semiconductor device including a capacitor 550 that can be formed concurrently with the transistor 450 described in Embodiment 1 is described.

Figure 11A:
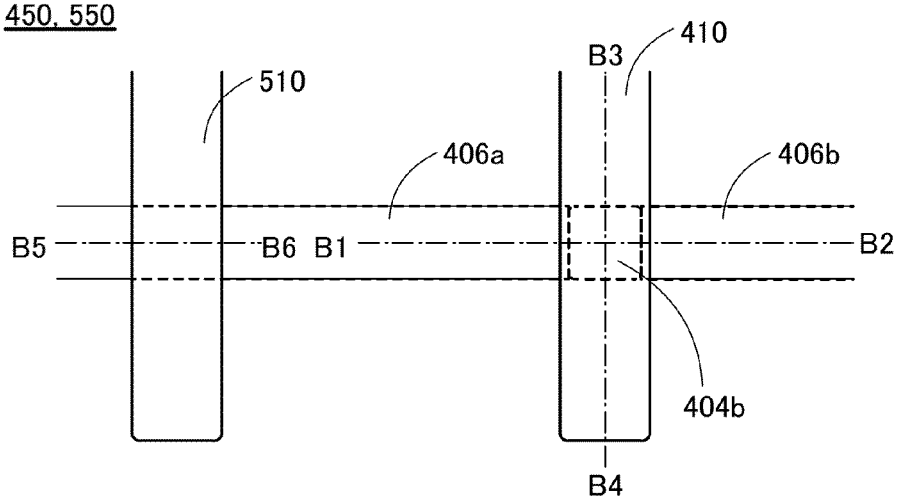
FIGS. 11A to 11C are a top view and cross-sectional views illustrating a transistor and a capacitor.
Figure 11B:
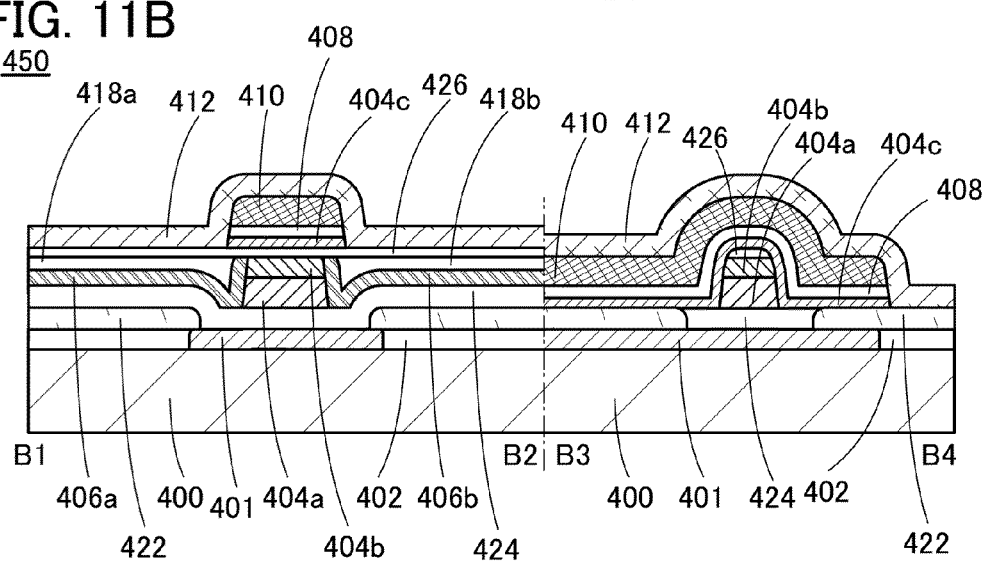
Figure 11C:
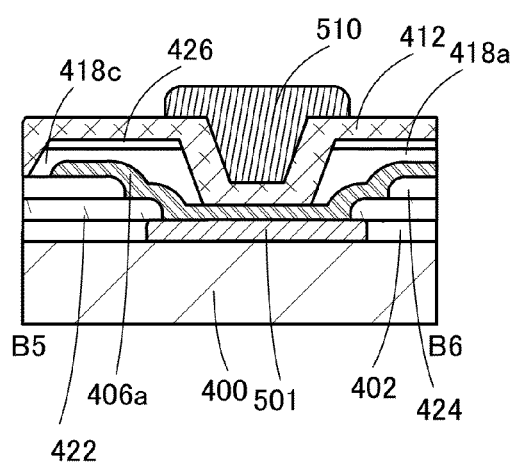

FIGS. 11A to 11C are a top view and cross-sectional views of a semiconductor device including the transistor and a capacitor of one embodiment of the present invention. FIG. 11A is the top view. FIG. 11B illustrates a cross section taken along dashed-dotted lines B1-B2 and B3-B4 in FIG. 11A. FIG. 11C illustrates a cross section taken along a dashed-dotted line B5-B6 in FIG. 11A. Note that for simplification of the drawing, some components in the top view in FIG. 11A are not illustrated. In some cases, the direction of the dashed-dotted line B1-B2 and the direction of the dashed-dotted line B5-B6 are each referred to as a channel length direction, and the direction of the dashed-dotted line B3-B4 is referred to as a channel width direction.

The structure of the transistor 450 illustrated in FIGS. 11A and 11B is the same as that of the transistor 450 described in Embodiment 1. The semiconductor device including the capacitor 550 illustrated in FIGS. 11A and 11C includes a conductive film 501 and the insulating film 402 over the substrate 400; the blocking film 422 over the conductive film 501 and the insulating film 402; the base insulating film 424 over the blocking film 422; the source electrode 406a over the conductive film 501, the blocking film 422, and the base insulating film 424; the insulating film 418a and the insulating film 418c over the source electrode 406a; the insulating film 426 over the insulating film 418a and the insulating film 418c; the blocking film 412 over the source electrode 406a and the insulating film 426; and an electrode 510 over the blocking film 412.

The capacitor 550 includes the source electrode 406a serving as a lower electrode film, the electrode 510 serving as an upper electrode film, and the blocking film 412 serving as an inter-electrode insulating film provided between the source electrode 406a and the electrode 510. Here, the source electrode 406a is used as the lower electrode film; alternatively, the drain electrode 406b may be used as the lower electrode film.

Next, a method for manufacturing the transistor 450 and the capacitor 550 is described with reference to FIGS. 12A to 12C, FIGS. 13A to 13C, FIGS. 14A to 14C, and FIGS. 15A to 15C.

First, the conductive film 401 and the conductive film 501 are formed over the substrate 400, and the insulating film is formed over the substrate 400, the conductive film 401, and the conductive film 501. Then, removing (polishing) treatment is performed on the insulating film to remove a part of the insulating film and expose the conductive film 401 and the conductive film 501, whereby the insulating film 402 is formed (see FIG. 12A).

The conductive film 501 can be formed using the same step and the same material as the conductive film 401. Embodiment 1 can be referred to for materials and formation methods of the substrate 400 and the conductive film 401, the removing treatment performed on the insulating film, or the like.

Figure 12A:
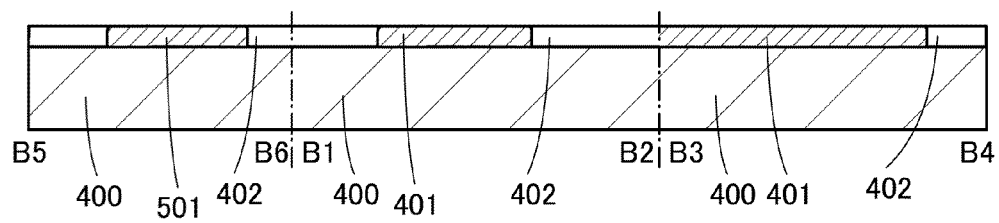
FIGS. 12A to 12C illustrate a method for manufacturing a transistor and a capacitor.
Figure 12B:
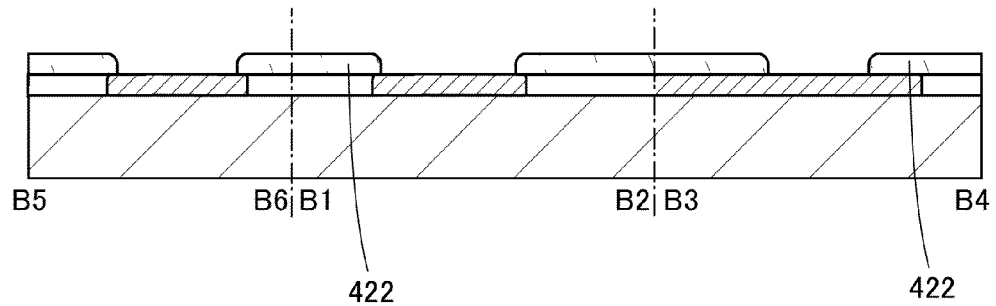

Next, the blocking film 422 is formed over the conductive film 401, the conductive film 501, and the insulating film 402 (see FIG. 12B). Embodiment 1 can be referred to for a material and a formation method of the blocking film 422.

Figure 12C:
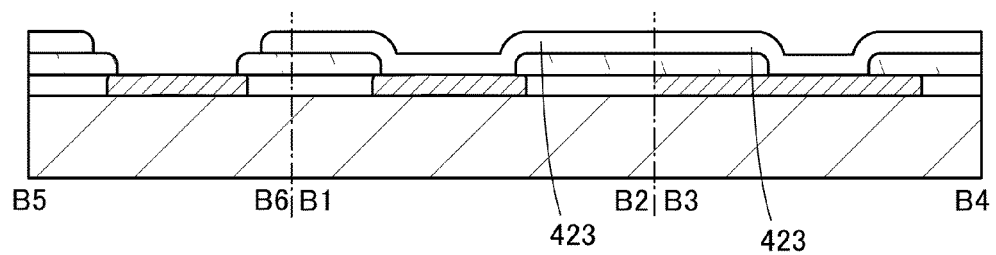

Next, the base insulating film 423 including an opening reaching the conductive film 501 is formed over the conductive film 401, the conductive film 501, and the blocking film 422 (see FIG. 12C). Embodiment 1 can be referred to for a material and a formation method of the base insulating film 423.

Figure 13A:
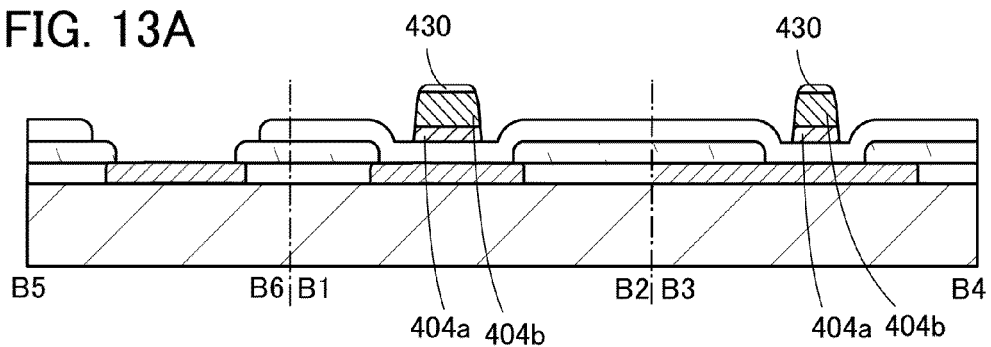
FIGS. 13A to 13C illustrate a method for manufacturing a transistor and a capacitor.

Next, the oxide semiconductor film to be the oxide semiconductor film 404a and the oxide semiconductor film to be the oxide semiconductor film 404b are formed over the base insulating film 423 and processed using the hard mask 430, whereby the oxide semiconductor film 404a and the oxide semiconductor film 404b are formed (see FIG. 13A). Embodiment 1 can be referred to for materials and formation methods of the oxide semiconductor film 404a, the oxide semiconductor film 404b, and the hard mask 430.

Figure 13B:
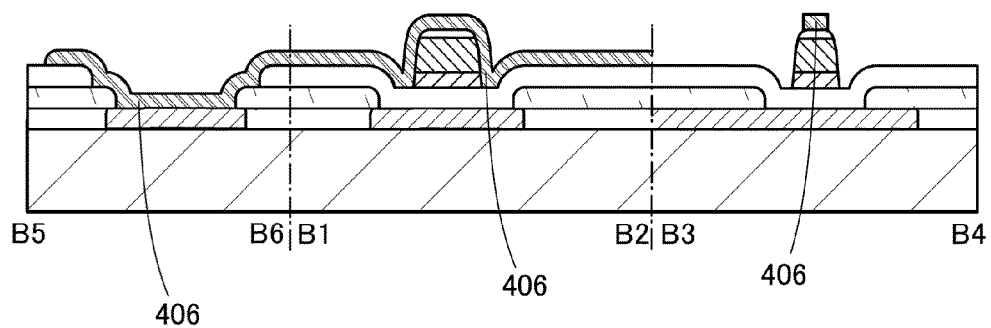

Next, the conductive film 406 to be the source electrode 406a and the drain electrode 406b is formed over the oxide semiconductor film 404b (see FIG. 13B). Embodiment 1 can be referred to for a material and a formation method of the conductive film 406.

Figure 13C:
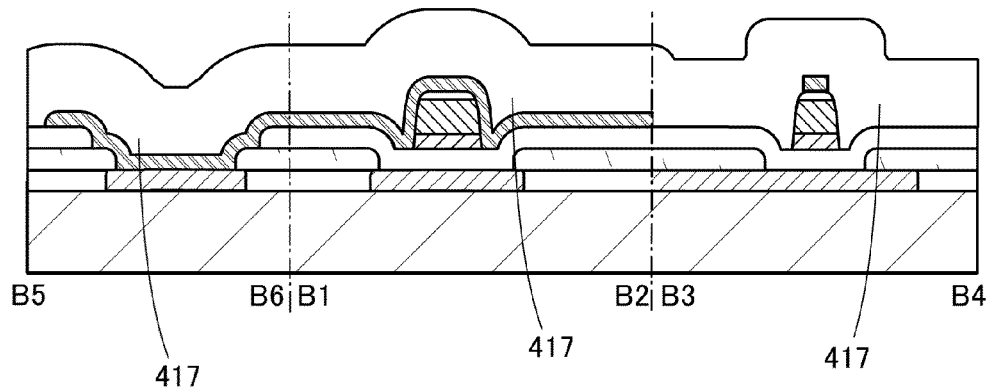

Next, the insulating film 417 is formed over the base insulating film 423 and the conductive film 406 (see FIG. 13C). The insulating film 417 can be formed using a material and a method similar to those of the base insulating film 423.

Figure 14A:
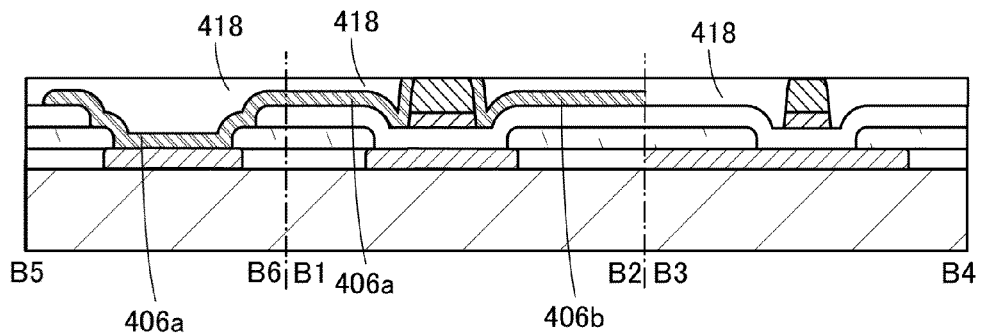
FIGS. 14A to 14C illustrate a method for manufacturing a transistor and a capacitor.

Next, removing (polishing) treatment is performed on the conductive film 406, the insulating film 417, and the hard mask 430 to remove a part of the conductive film 406, a part of the insulating film 417, and the hard mask 430 and expose the oxide semiconductor film 404b, whereby the source electrode 406a, the drain electrode 406b, and the insulating film 418 are formed (see FIG. 14A). Embodiment 1 can be referred to for the removing treatment or the like of the conductive film 406, the insulating film 417, and the hard mask 430.

Figure 14B:
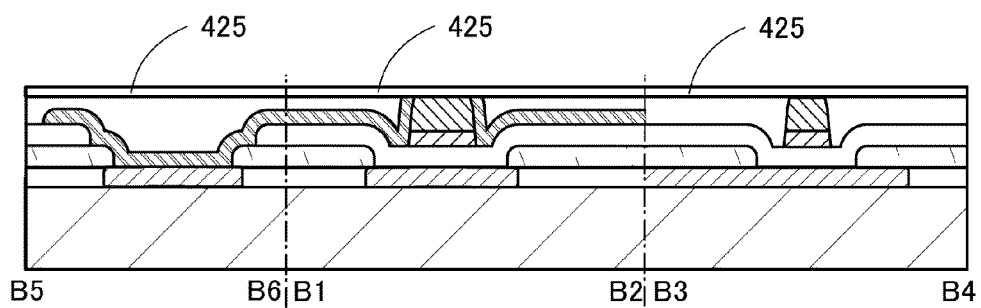

Next, the insulating film 425 is formed over the oxide semiconductor film 404b, the source electrode 406a, the drain electrode 406b, and the insulating film 418 (see FIG. 14B). The insulating film 425 can be formed using a material and a method similar to those of the base insulating film 423.

Figure 14C:
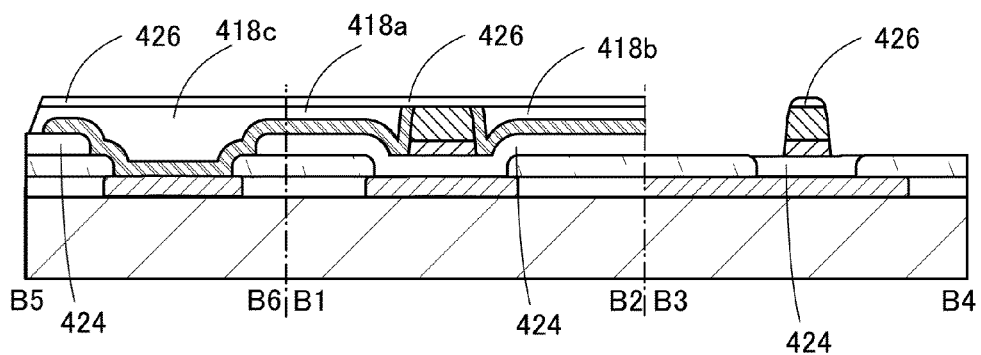

Next, the insulating film 425, the insulating film 418, and the base insulating film 423 are etched to form the insulating film 426, the insulating film 418a, the insulating film 418b, the insulating film 418c, and the base insulating film 424 (see FIG. 14C).

Figure 15A:
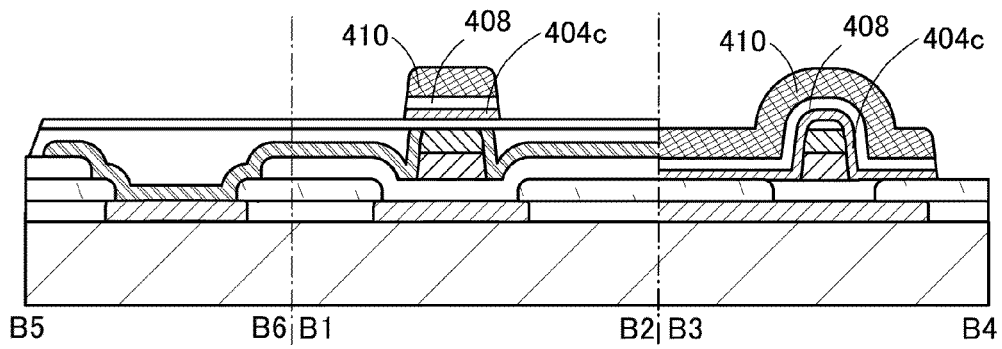
FIGS. 15A to 15C illustrate a method for manufacturing a transistor and a capacitor.

Next, the oxide semiconductor film 404c, the gate insulating film 408, and the gate electrode 410 are formed over the blocking film 422, the base insulating film 424, and the insulating film 426 (see FIG. 15A). Embodiment 1 can be referred to for materials and formation methods of the oxide semiconductor film 404c, the gate insulating film 408, and the gate electrode 410.

Figure 15B:
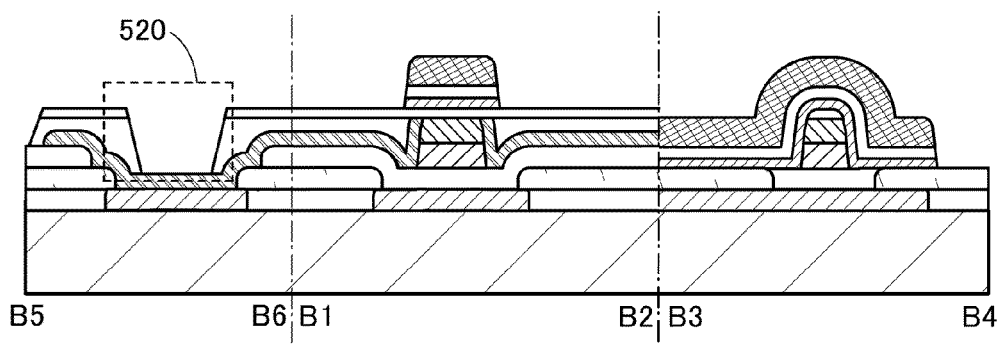
Figure 15C:
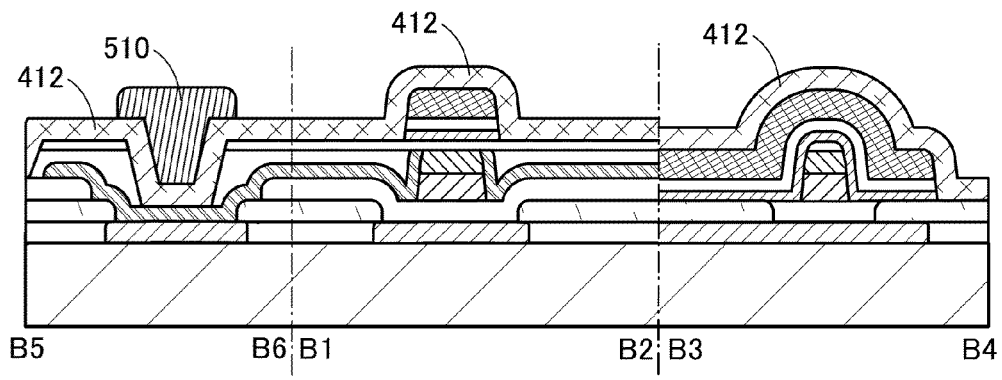

Next, an opening 520 reaching the source electrode 406a is formed in the insulating film 426 and the insulating film 418c (see FIG. 15B).

Next, the blocking film 412 is formed over the source electrode 406a, the insulating film 426, the gate electrode 410, and the blocking film 422. Then, the electrode 510 is formed over the blocking film 412 (see FIG. 15C). For the blocking film 412, the material and the formation method of the blocking film 422 can be referred to. The electrode 510 can be formed using a material and a formation method similar to those of the gate electrode 410.

Through the above process, the transistor 450 and the capacitor 550 illustrated in FIGS. 11A to 11C can be manufactured. The transistor 450 and the capacitor 550 can be formed through the same process; therefore, the capacitor 550 can be efficiently formed.

This embodiment can be combined with any of the other embodiments in this specification as appropriate.

Embodiment 3

In this embodiment, a semiconductor device having a structure different from the structure of the semiconductor device described in the above embodiment is described.

Figure 16A:
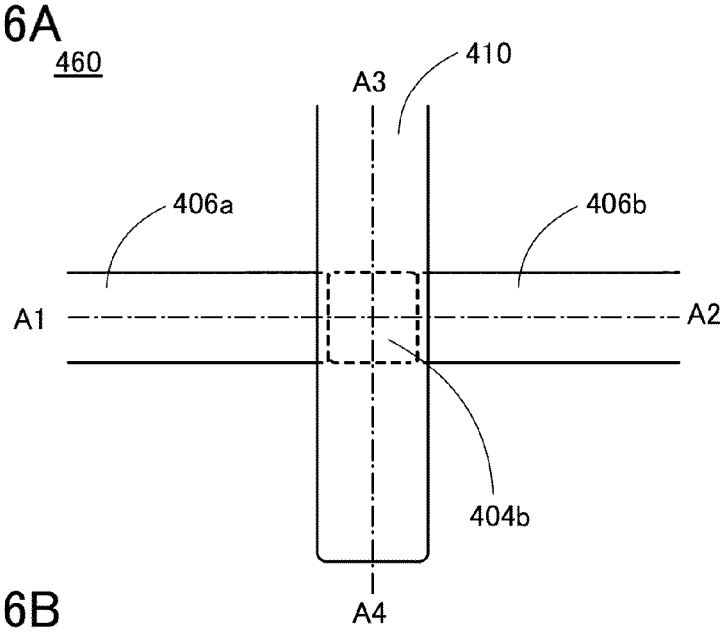
FIGS. 16A and 16B are a top view and a cross-sectional view, respectively, which illustrate a transistor.
Figure 16B:
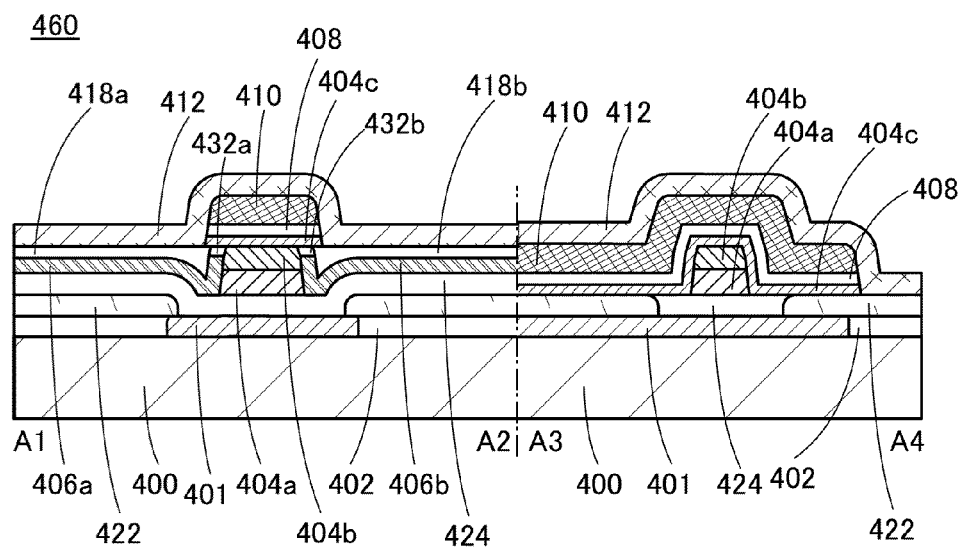

FIGS. 16A and 16B are a top view and a cross-sectional view of a transistor of one embodiment of the present invention. FIG. 16A is the top view. FIG. 16B illustrates a cross section taken along dashed-dotted lines A1-A2 and A3-A4 in FIG. 16A. Note that for simplification of the drawing, some components in the top view in FIG. 16A are not illustrated. In some cases, the direction of the dashed-dotted line A1-A2 is referred to as a channel length direction, and the direction of the dashed-dotted line A3-A4 is referred to as a channel width direction.

A transistor 460 illustrated in FIGS. 16A and 16B includes the conductive film 401 and the insulating film 402 over the substrate 400; the blocking film 422 over the conductive film 401 and the insulating film 402; the base insulating film 424 over the conductive film 401 and the blocking film 422; the oxide semiconductor film 404a and the oxide semiconductor film 404b over the base insulating film 424; the source electrode 406a and the drain electrode 406b in contact with the side surfaces of the oxide semiconductor film 404a and the oxide semiconductor film 404b; the insulating film 418a over the source electrode 406a; the insulating film 418b over the drain electrode 406b; an insulating film 432a and an insulating film 432b over the source electrode 406a and the drain electrode 406b and in contact with the side surfaces of the oxide semiconductor film 404b; the oxide semiconductor film 404c over the blocking film 422, the base insulating film 424, the oxide semiconductor film 404b, the insulating film 432a, the insulating film 432b, the insulating film 418a, and the insulating film 418b; the gate insulating film 408 over the oxide semiconductor film 404c; the gate electrode 410 on and in contact with the gate insulating film 408 and covering the top surface and side surfaces of the oxide semiconductor film 404b with the gate insulating film 408 provided therebetween; and the blocking film 412 over the insulating film 418a, the insulating film 418b, the blocking film 422, and the gate electrode 410. The oxide semiconductor film 404a, the oxide semiconductor film 404b, and the oxide semiconductor film 404c are collectively referred to as the multilayer film 404.

Each of the insulating film 432a and the insulating film 432b is preferably an insulating film containing oxygen in excess of the stoichiometric composition. Oxygen released from the insulating film can be diffused to the channel formation region in the multilayer film 404, so that oxygen vacancies formed in the channel formation region can be filled with the oxygen. In this manner, stable electrical characteristics of the transistor can be achieved.

The description in the above embodiments can be referred to for components other than the insulating film 432a and the insulating film 432b.

Next, a method for manufacturing the transistor is described with reference to FIGS. 17A to 17C, FIGS. 18A to 18C, FIGS. 19A to 19C, FIGS. 20A to 20C, and FIG. 21.

First, the conductive film 401 is formed over the substrate 400, and the insulating film is formed over the substrate 400 and the conductive film 401. Then, removing (polishing) treatment is performed on the insulating film to remove a part of the insulating film and expose the conductive film 401, whereby the insulating film 402 is formed (see FIG. 17A). The above embodiments can be referred to for materials and formation methods of the substrate 400, the conductive film 401, and the insulating film 402.

Figure 17A:
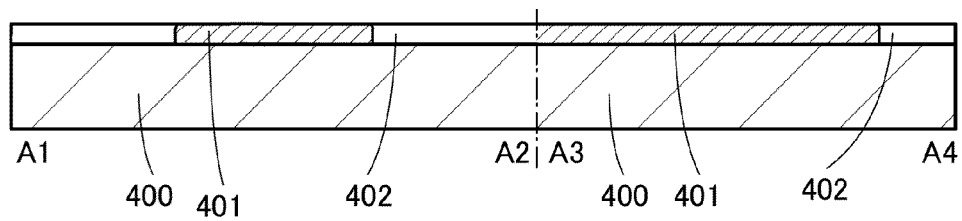
FIGS. 17A to 17C illustrate a method for manufacturing a transistor.
Figure 17B:
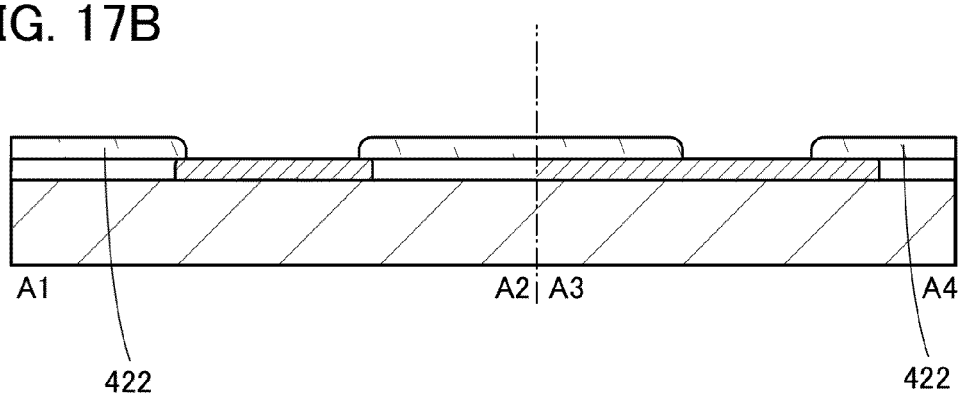

Next, the blocking film 422 is formed over the conductive film 401 and the insulating film 402 (see FIG. 17B). The above embodiments can be referred to for a material and a formation method of the blocking film 422.

Figure 17C:
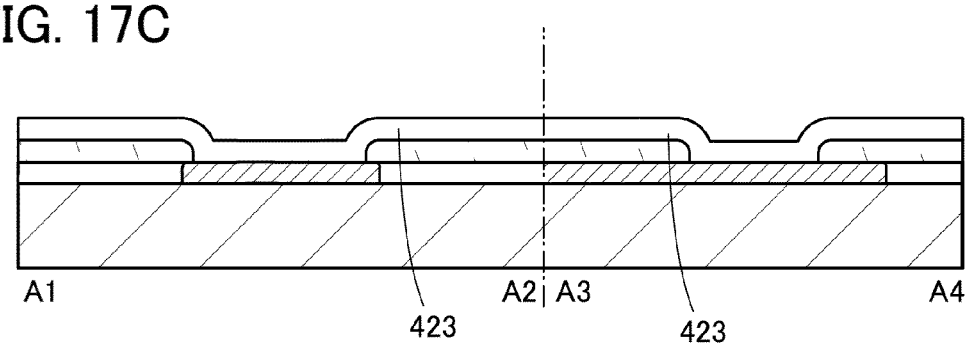

Next, the base insulating film 423 is formed over the conductive film 401 and the blocking film 422 (see FIG. 17C). The above embodiments can be referred to for a material and a formation method of the base insulating film 423.

Figure 18A:
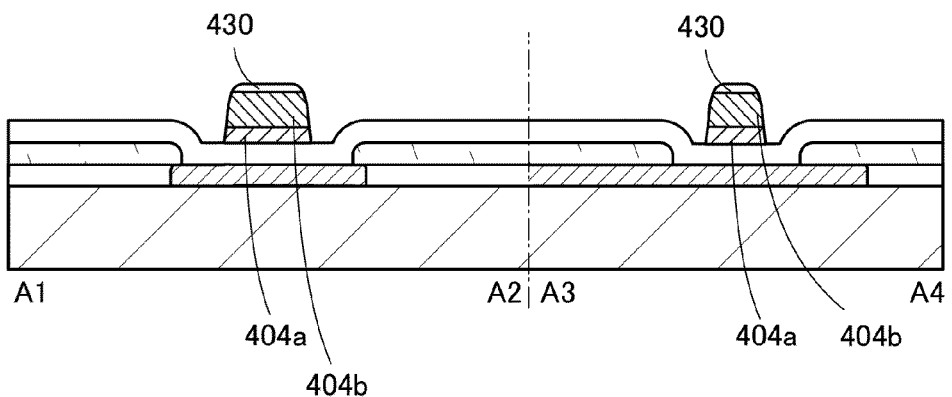
FIGS. 18A to 18C illustrate a method for manufacturing a transistor.

Next, the oxide semiconductor film to be the oxide semiconductor film 404a and the oxide semiconductor film to be the oxide semiconductor film 404b are formed over the base insulating film 423 and processed using the hard mask 430, whereby the oxide semiconductor film 404a and the oxide semiconductor film 404b are formed (see FIG. 18A). The above embodiments can be referred to for materials and formation methods of the oxide semiconductor film to be the oxide semiconductor film 404a, the oxide semiconductor film to be the oxide semiconductor film 404b, and the hard mask 430.

Figure 18B:
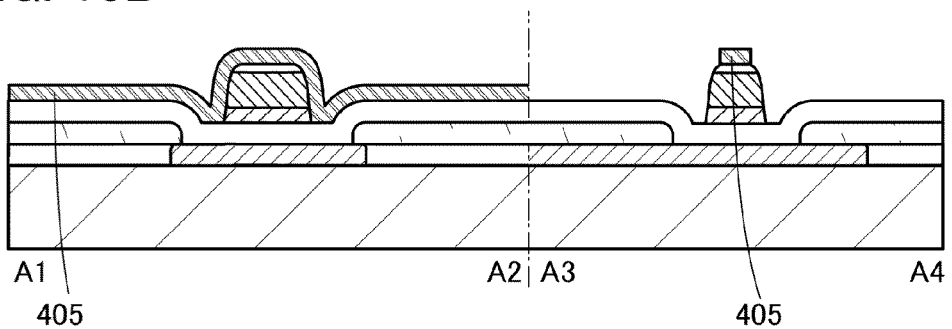

Next, a conductive film 405 to be the source electrode 406a and the drain electrode 406b is formed over the oxide semiconductor film 404b (see FIG. 18B). The above embodiments can be referred to for a material and a formation method of the conductive film 405.

Figure 18C:
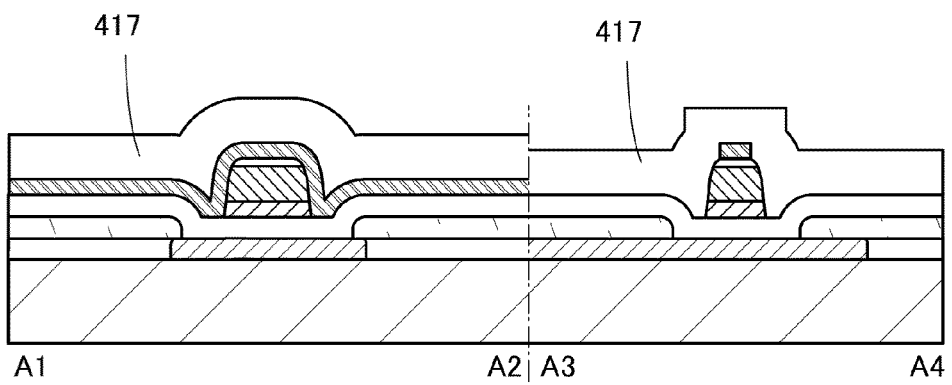

Next, the insulating film 417 is formed over the base insulating film 423 and the conductive film 405 (see FIG. 18C). The insulating film 417 can be formed using a material and a formation method similar to those of the base insulating film 423.

Figure 19A:
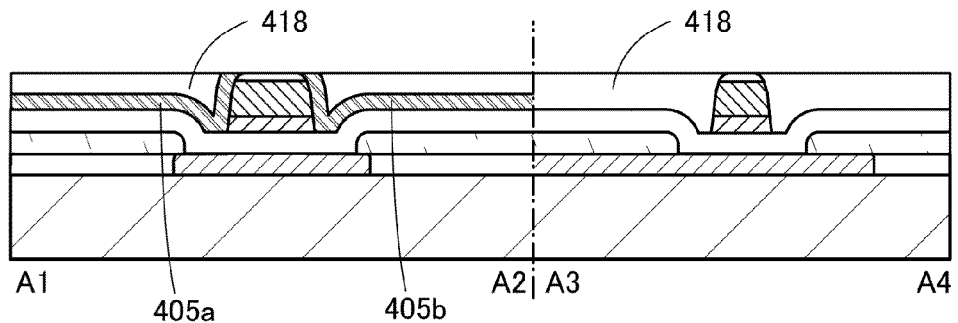
FIGS. 19A to 19C illustrate a method for manufacturing a transistor.

Then, removing (polishing) treatment is performed on the conductive film 405 and the insulating film 417 to remove a part of the conductive film 405 and a part of the insulating film 417 and expose the hard mask 430, whereby a conductive film 405a, a conductive film 405b, and the insulating film 418 are formed (see FIG. 19A).

Figure 19B:
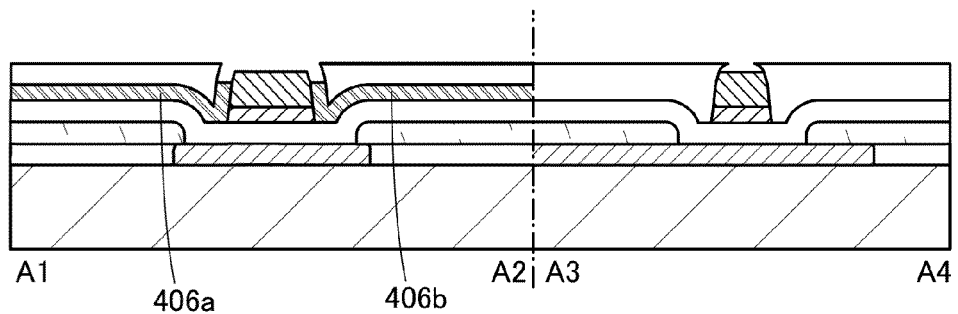

Next, a part of the conductive film 405a, a part of the conductive film 405b, and the hard mask 430 are subjected to etching (slight etching) to form the source electrode 406a and the drain electrode 406b (see FIG. 19B).

Figure 19C:
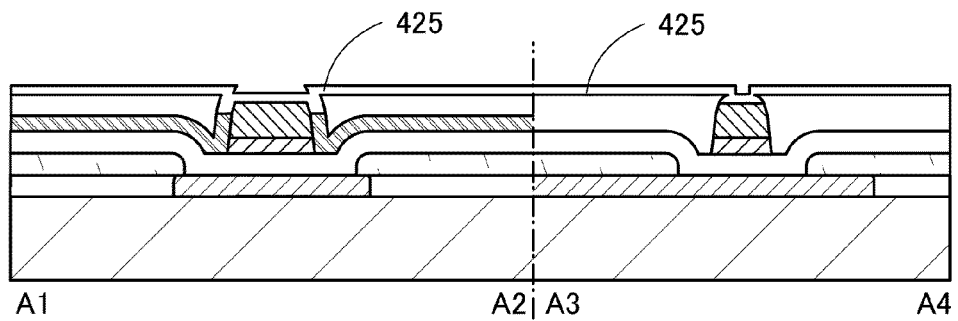

Next, the insulating film 425 is formed over the oxide semiconductor film 404b, the source electrode 406a, the drain electrode 406b, and the insulating film 418 (see FIG. 19C). The insulating film 425 can be formed using a material and a method similar to those of the base insulating film 423.

Figure 20A:
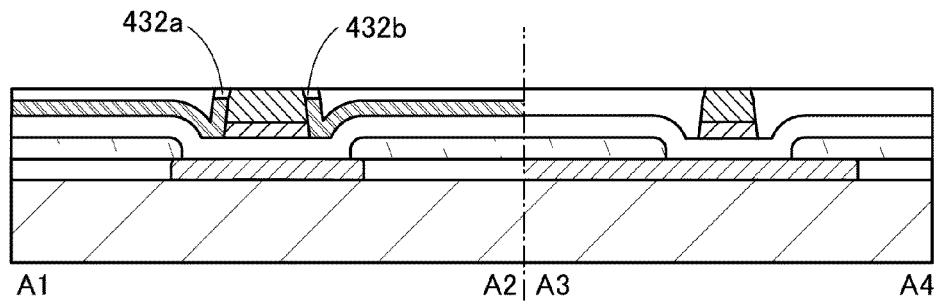
FIGS. 20A to 20C illustrate a method for manufacturing a transistor.

Then, removing (polishing) treatment is performed on the insulating film 425 to remove a part of the insulating film 425 and expose the insulating film 418, whereby the insulating film 432a and the insulating film 432b are formed (see FIG. 20A).

Figure 20B:
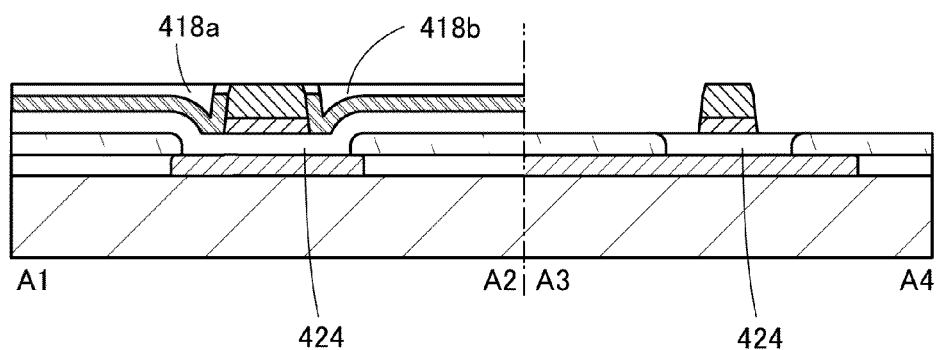

Next, the insulating film 418 and the base insulating film 423 are etched to form the insulating film 418a, the insulating film 418b, and the base insulating film 424 (see FIG. 20B).

Figure 20C:
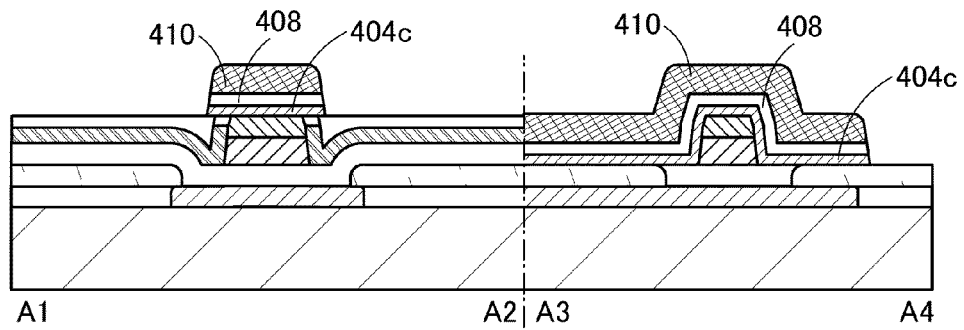

Next, the oxide semiconductor film 404c, the gate insulating film 408, and the gate electrode 410 are formed over the blocking film 422, the base insulating film 424, the insulating film 418a, the insulating film 418b, the insulating film 432a, the insulating film 432b, and the oxide semiconductor film 404b (see FIG. 20C). The above embodiments can be referred to for materials and formation methods of the oxide semiconductor film 404c, the gate insulating film 408, and the gate electrode 410.

Figure 21:
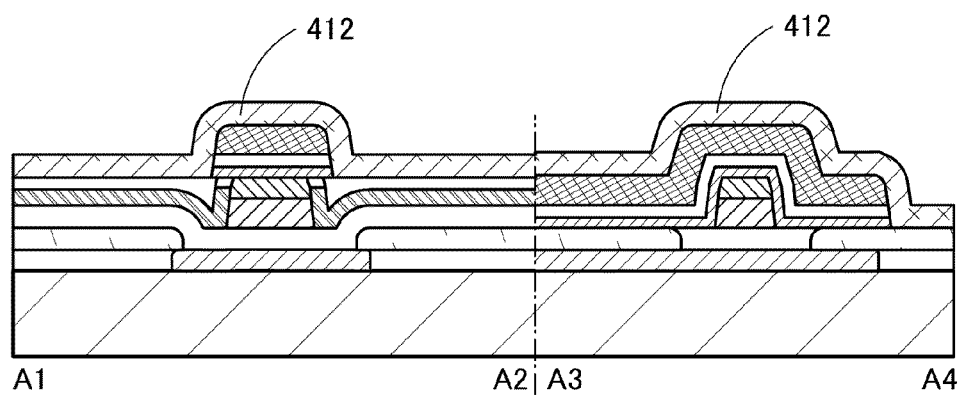
FIG. 21 illustrates a method for manufacturing a transistor.

Next, the blocking film 412 is formed over the gate electrode 410 and the blocking film 422 (see FIG. 21). For the blocking film 412, the material and the formation method of the blocking film 422 can be referred to.

Through the above process, the transistor 460 illustrated in FIGS. 16A and 16B can be manufactured. Because the transistor 460 is surrounded by the blocking film 412 and the blocking film 422, it is possible to prevent outward diffusion of oxygen from the multilayer film 404 and entry of hydrogen, water, or the like into the multilayer film 404 from the outside, so that generation of an oxygen vacancy in the oxide semiconductor film can be suppressed. As a result, stable electrical characteristics of the transistor can be achieved.

Modification Example 1

Figure 22A:
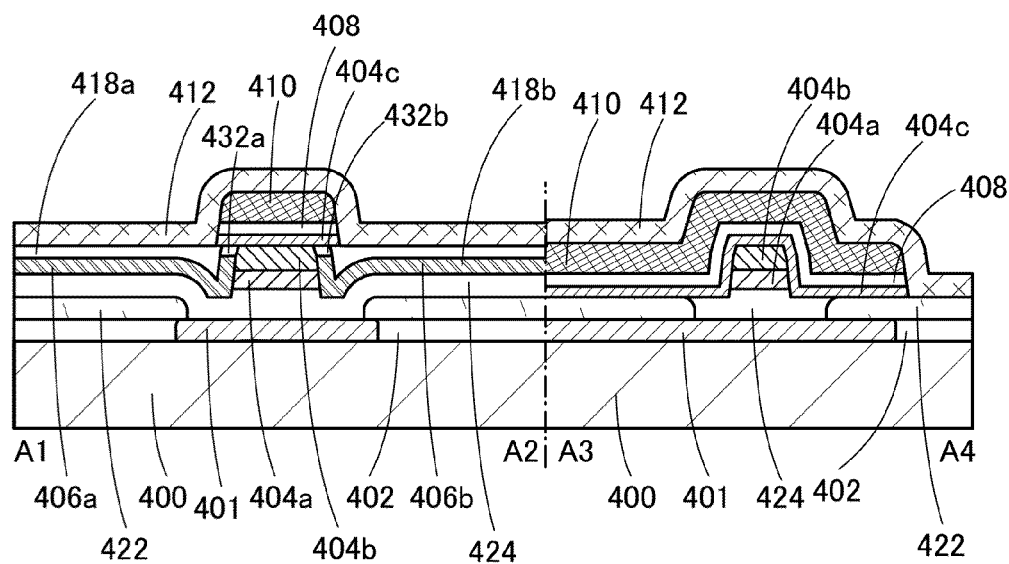
FIGS. 22A and 22B are each a cross-sectional view illustrating a transistor.

As in a transistor illustrated in FIG. 22A, the surface of the base insulating film 424 may be etched when the oxide semiconductor film 404a and the oxide semiconductor film 404b are etched. Note that the description of the transistor illustrated in FIGS. 16A and 16B is referred to for the other components.

Modification Example 2

Figure 22B:
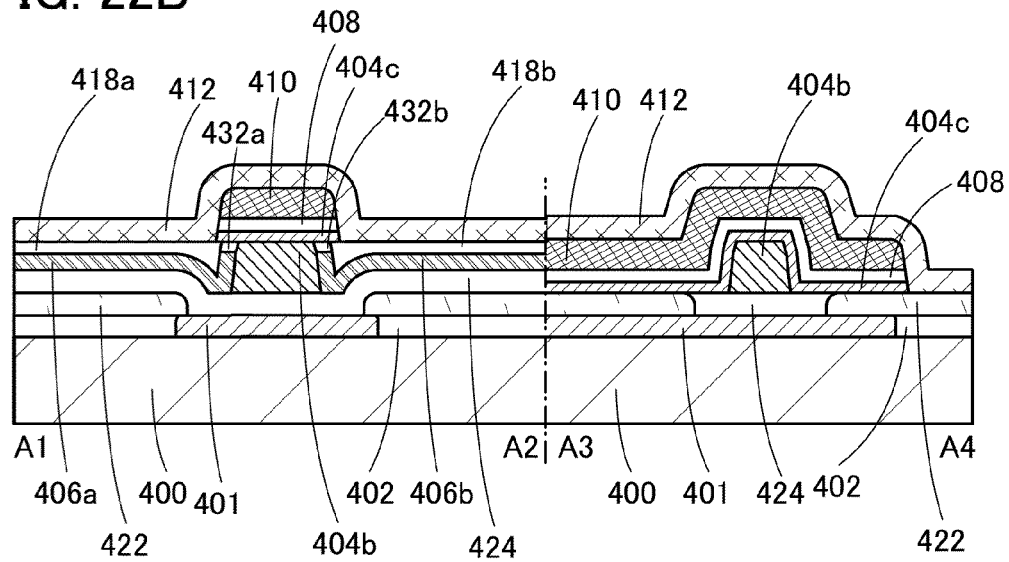
Figure 23A:
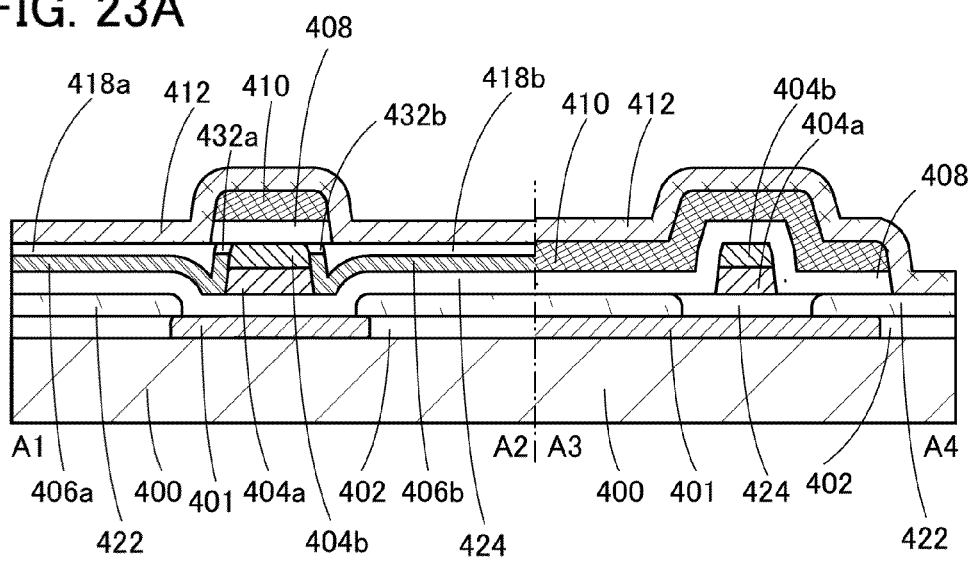
FIGS. 23A and 23B are each a cross-sectional view illustrating a transistor.
Figure 23B:
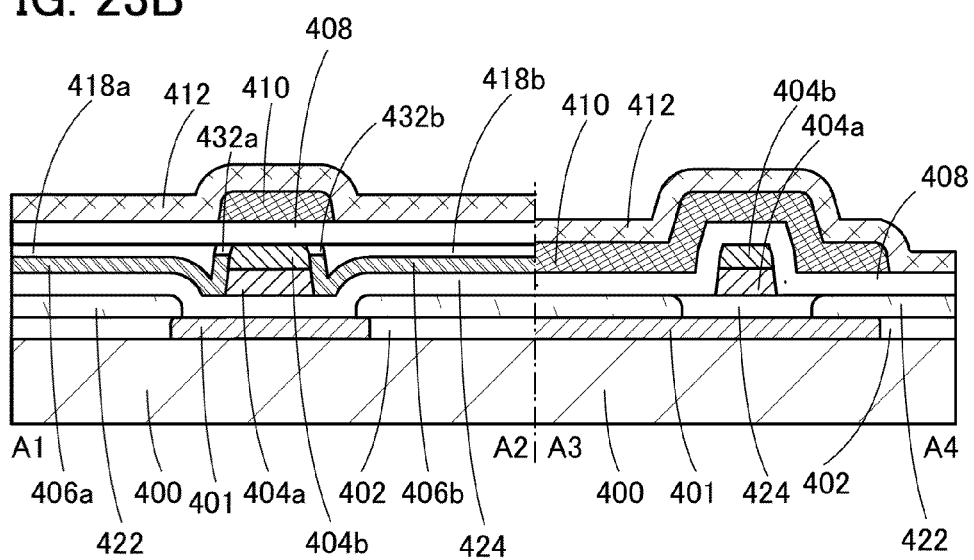
Figure 24A:
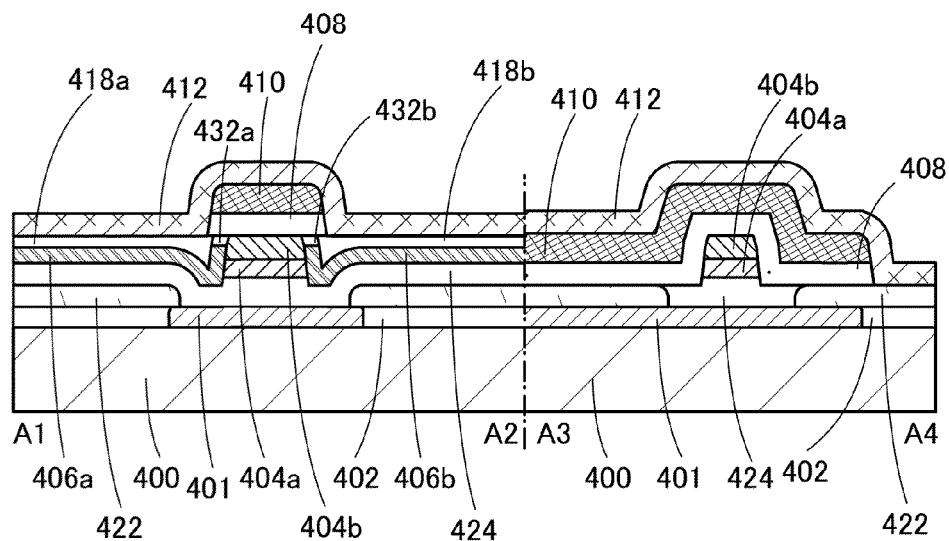
FIGS. 24A and 24B are each a cross-sectional view illustrating a transistor.
Figure 24B:
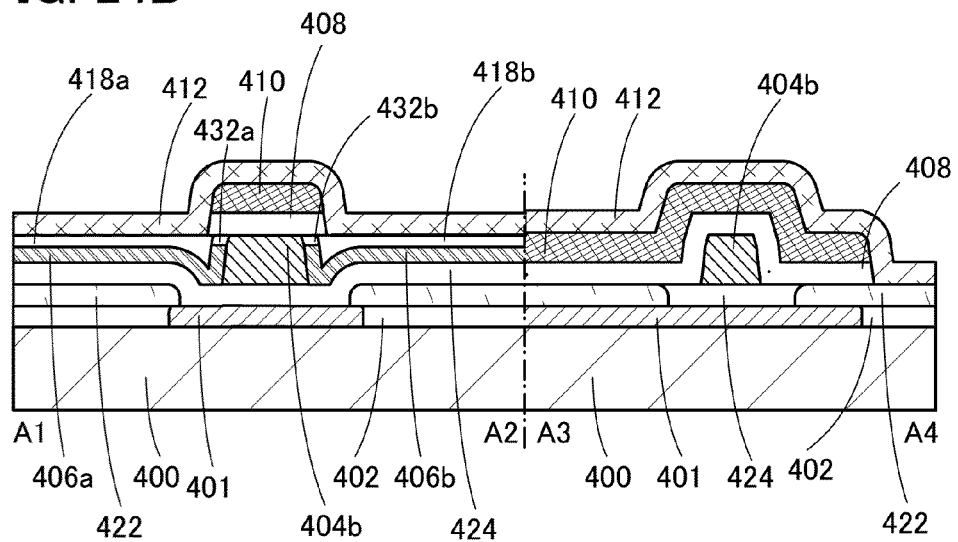
Figure 25A:
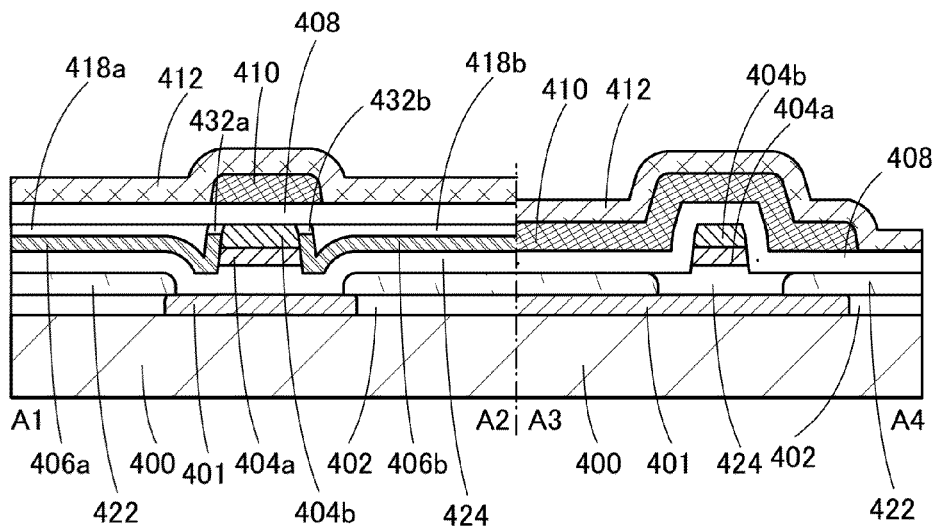
FIGS. 25A and 25B are each a cross-sectional view illustrating a transistor.
Figure 25B:
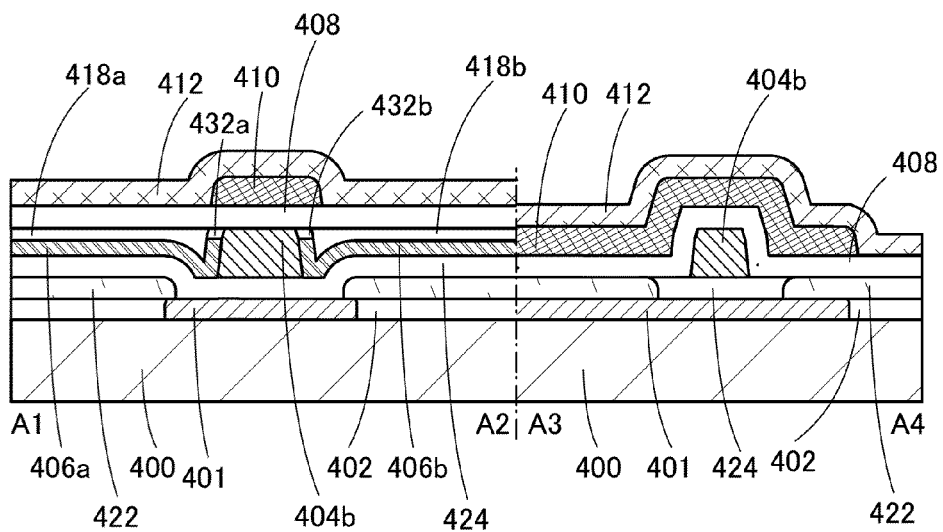

In this embodiment, the structure in which the oxide semiconductor film 404b is provided between the oxide semiconductor film 404a and the oxide semiconductor film 404c is described. However, this embodiment is not limited to thereto. A structure without the oxide semiconductor film 404a and/or the oxide semiconductor film 404c may be used. Furthermore, another oxide semiconductor film may be additionally provided. For example, as illustrated in a transistor in FIG. 22B, a structure including only the oxide semiconductor film 404b and the oxide semiconductor film 404c may be used. Note that the description of the transistor in FIGS. 16A and 16B is referred to for the other components.

Note that, depending on circumstances or conditions, the oxide semiconductor film 404c is not necessarily provided, and etching of the gate insulating film 408 is not needed. FIGS. 23A and 23B, FIGS. 24A and 24B, and FIGS. 25A and 25B show examples in which such structures are applied to the structures in FIGS. 16A and 16B, FIGS. 22A and 22B, and the like.

Although an example where a channel or the like is formed in an oxide semiconductor film is described in this embodiment or the like, one embodiment of the present invention is not limited thereto. For example, depending on cases or conditions, a channel, the vicinity of the channel, a source region, a drain region, or the like may be formed using a material containing Si (silicon), Ge (germanium), SiGe (silicon germanium), GaAs (gallium arsenide), or the like.

This embodiment can be combined with any of the other embodiments in this specification as appropriate.

Embodiment 4

In this embodiment, a semiconductor device including a capacitor 560 that can be formed concurrently with the transistor 460 described in Embodiment 3 is described.

Figure 26A:
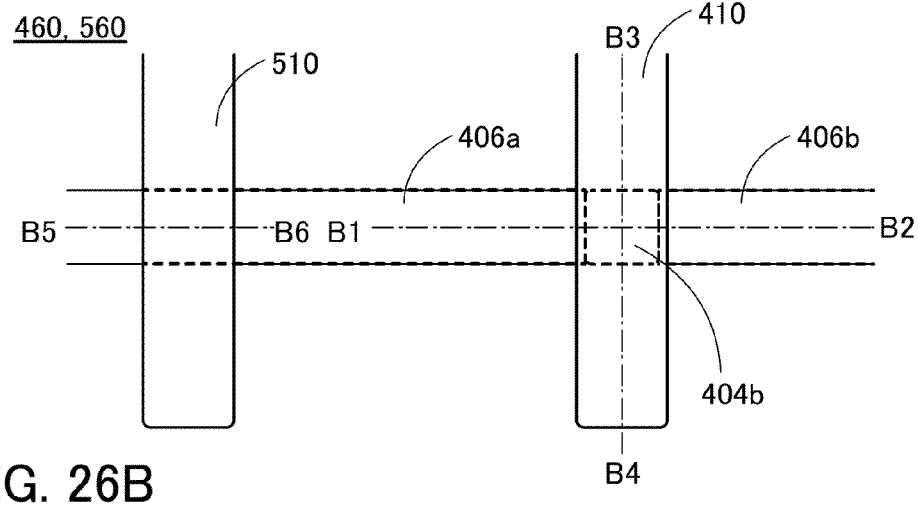
FIGS. 26A to 26C are a top view and cross-sectional views illustrating a transistor and a capacitor.
Figure 26B:
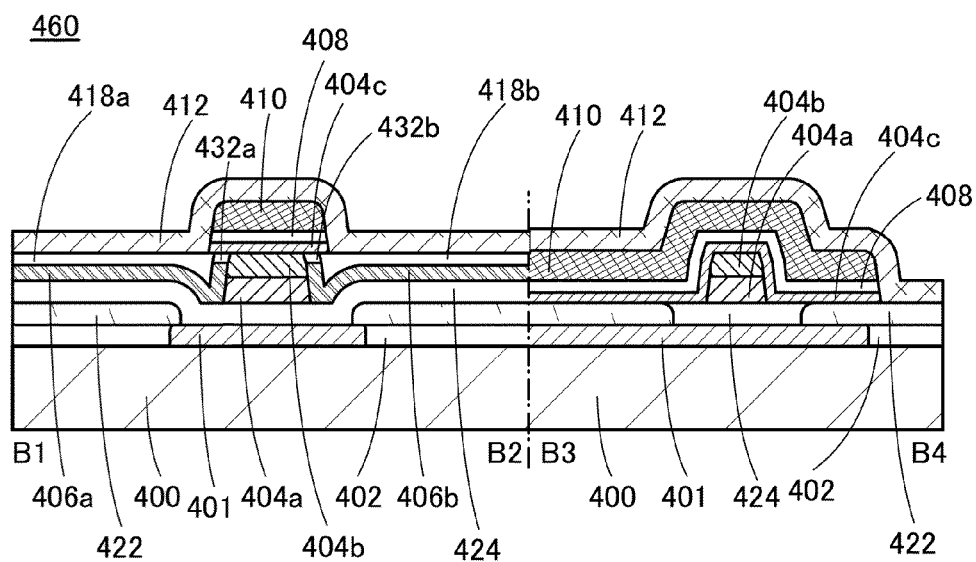
Figure 26C:
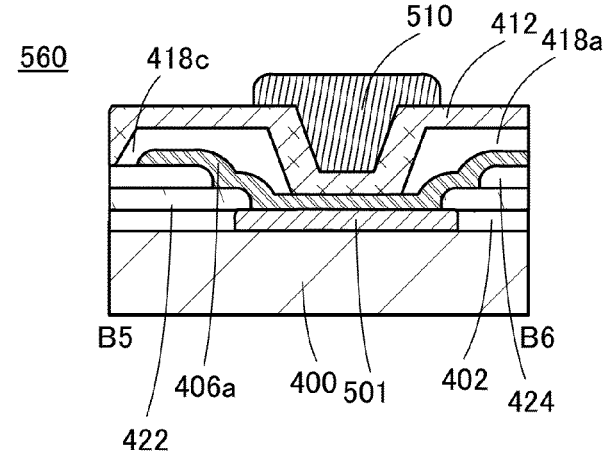

FIGS. 26A to 26C are a top view and cross-sectional views of a semiconductor device including the transistor and a capacitor of one embodiment of the present invention. FIG. 26A is the top view. FIG. 26B illustrates a cross section taken along dashed-dotted lines B1-B2 and B3-B4 in FIG. 26A. FIG. 26C illustrates a cross section taken along a dashed-dotted line B5-B6 in FIG. 26A. Note that for simplification of the drawing, some components in the top view in FIG. 26A are not illustrated. In some cases, the direction of the dashed-dotted line B1-B2 and the direction of the dashed-dotted line B5-B6 are each referred to as a channel length direction, and the direction of the dashed-dotted line B3-B4 is referred to as a channel width direction.

The structure of the transistor 460 illustrated in FIGS. 26A and 26B is the same as that of the transistor 460 described in Embodiment 3. The semiconductor device including the capacitor 560 illustrated in FIGS. 26A and 26C includes the conductive film 501 and the insulating film 402 over the substrate 400; the blocking film 422 over the conductive film 501 and the insulating film 402; the base insulating film 424 over the blocking film 422; the source electrode 406a over the conductive film 501, the blocking film 422, and the base insulating film 424; the insulating film 418a and the insulating film 418c over the source electrode 406a; the blocking film 412 over the source electrode 406a, the insulating film 418a, and the insulating film 418c; and the electrode 510 over the blocking film 412.

The capacitor 560 includes the source electrode 406a serving as a lower electrode film, the electrode 510 serving as an upper electrode film, and the blocking film 412 serving as an inter-electrode insulating film provided between the source electrode 406a and the electrode 510. Here, the source electrode 406a is used as the lower electrode film; alternatively, the drain electrode 406b may be used as the lower electrode film.

Next, a method for manufacturing the transistor 460 and the capacitor 560 is described with reference to FIGS. 27A to 27C, FIGS. 28A to 28C, FIGS. 29A to 29C, FIGS. 30A to 30C, and FIGS. 31A and 31B.

First, the conductive film 401 and the conductive film 501 are formed over the substrate 400, and the insulating film is formed over the substrate 400, the conductive film 401, and the conductive film 501. Then, removing (polishing) treatment is performed on the insulating film to remove the part of the insulating film and expose the conductive film 401 and the conductive film 501, whereby the insulating film 402 is formed (see FIG. 27A).

The conductive film 501 can be formed using the same step and the same material as the conductive film 401. The above embodiments can be referred to for materials and formation methods of the substrate 400 and the conductive film 401, the removing treatment performed on the insulating film, or the like.

Figure 27A:
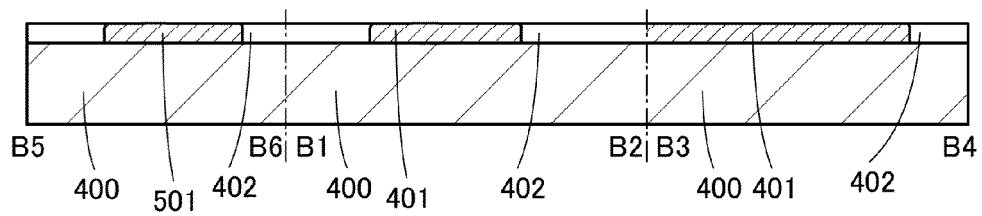
FIGS. 27A to 27C illustrate a method for manufacturing a transistor and a capacitor.
Figure 27B:
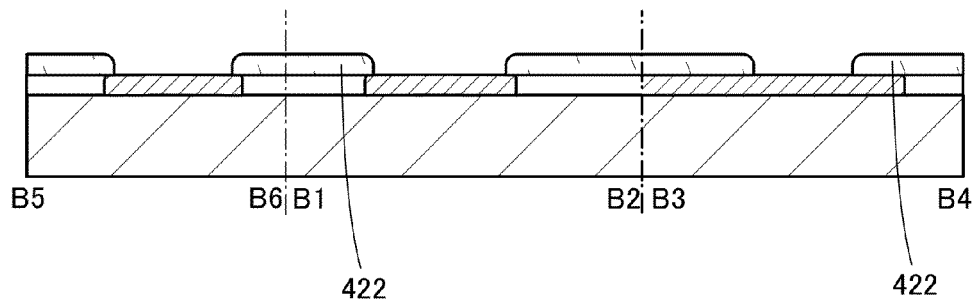

Next, the blocking film 422 is formed over the conductive film 401, the conductive film 501, and the insulating film 402 (see FIG. 27B). The above embodiments can be referred to for a material and a formation method of the blocking film 422.

Figure 27C:
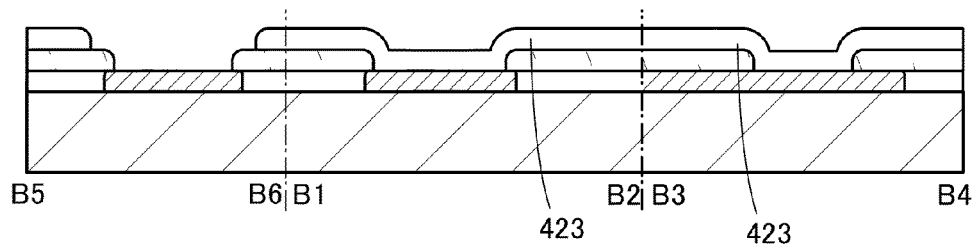

Next, the base insulating film 423 including the opening reaching the conductive film 501 is formed over the conductive film 401, the conductive film 501, and the blocking film 422 (see FIG. 27C). The above embodiments can be referred to for a material and a formation method of the base insulating film 423.

Figure 28A:
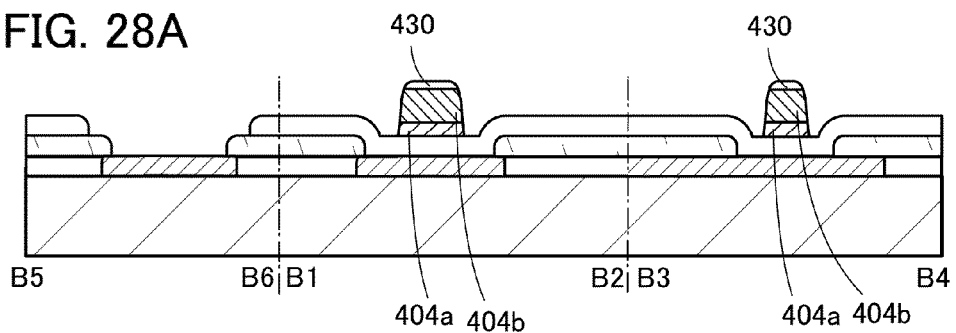
FIGS. 28A to 28C illustrate a method for manufacturing a transistor and a capacitor.

Next, the oxide semiconductor film to be the oxide semiconductor film 404a and the oxide semiconductor film to be the oxide semiconductor film 404b are formed over the base insulating film 423 and processed using the hard mask 430, whereby the oxide semiconductor film 404a and the oxide semiconductor film 404b are formed (see FIG. 28A). The above embodiments can be referred to for materials and formation methods of the oxide semiconductor film 404a, the oxide semiconductor film 404b, and the hard mask 430.

Figure 28B:
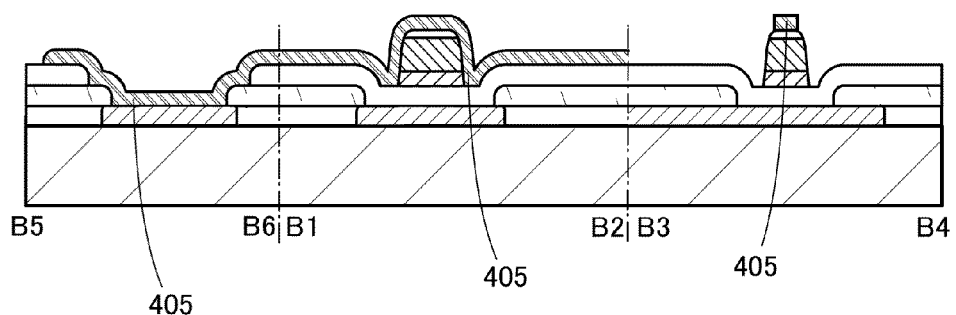

Next, the conductive film 405 to be the source electrode 406a and the drain electrode 406b is formed over the oxide semiconductor film 404b (see FIG. 28B). The above embodiments can be referred to for a material and a formation method of the conductive film 405.

Figure 28C:
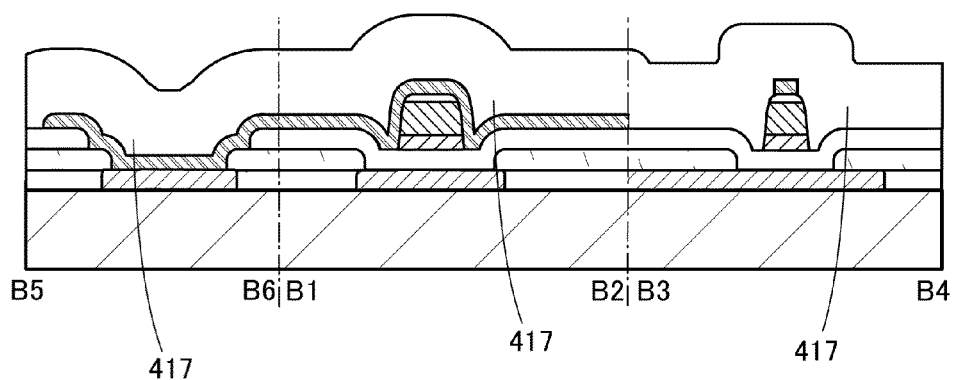

Next, the insulating film 417 is formed over the base insulating film 423 and the conductive film 405 (see FIG. 28C). The insulating film 417 can be formed using a material and a method similar to those of the base insulating film 423.

Figure 29A:
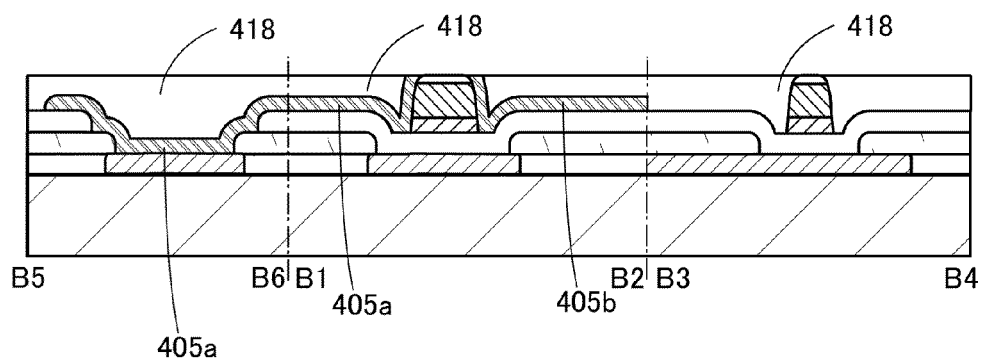
FIGS. 29A to 29C illustrate a method for manufacturing a transistor and a capacitor.

Then, removing (polishing) treatment is performed on the conductive film 405 and the insulating film 417 to remove the part of the conductive film 405 and the part of the insulating film 417 and expose the hard mask 430, whereby the conductive film 405a, the conductive film 405b, and the insulating film 418 are formed (see FIG. 29A). The above embodiments can be referred to for the removing treatment or the like of the conductive film 405 and the insulating film 417.

Figure 29B:
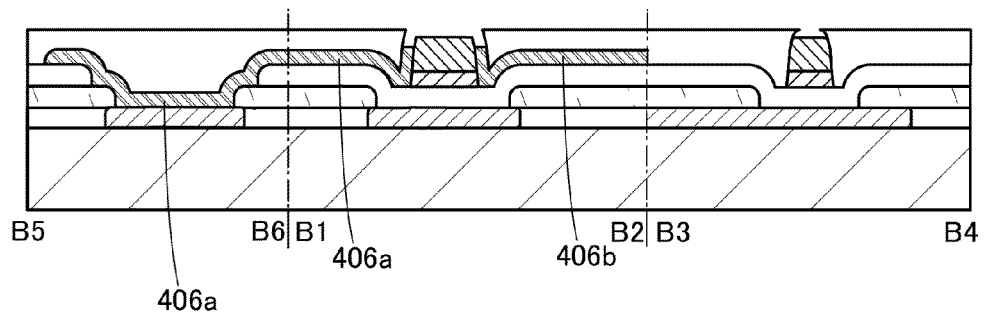

Next, the part of the conductive film 405a, the part of the conductive film 405b, and the hard mask 430 are subjected to etching (slight etching) to form the source electrode 406a and the drain electrode 406b (see FIG. 29B).

Figure 29C:
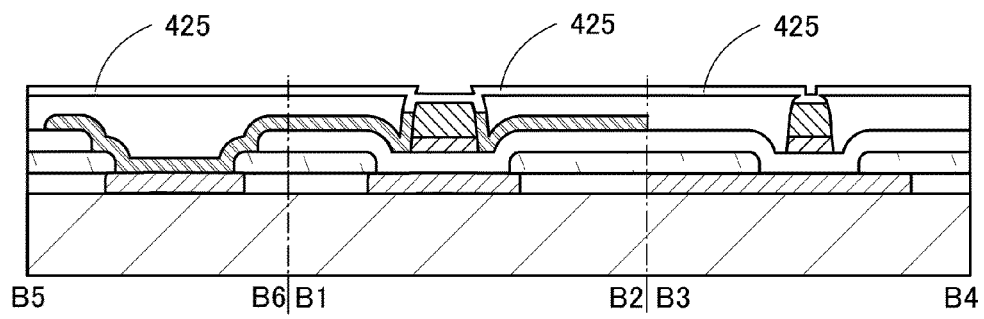

Next, the insulating film 425 is formed over the oxide semiconductor film 404b, the source electrode 406a, the drain electrode 406b, and the insulating film 418 (see FIG. 29C). The insulating film 425 can be formed using a material and a method similar to those of the base insulating film 423.

Figure 30A:
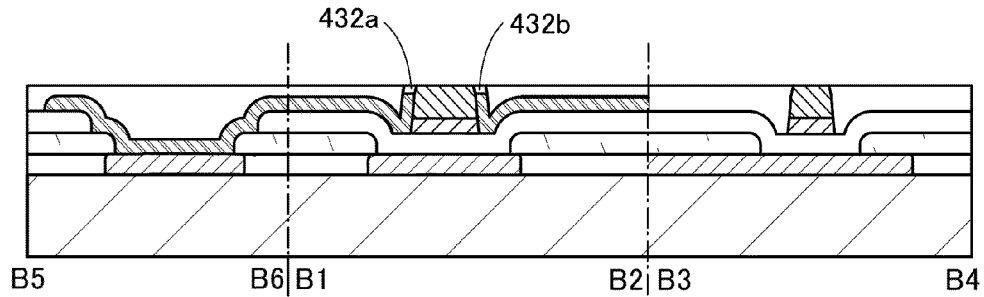
FIGS. 30A to 30C illustrate a method for manufacturing a transistor and a capacitor.

Next, removing (polishing) treatment is performed on the insulating film 425 to remove the part of the insulating film 425 and expose the insulating film 418, whereby the insulating film 432a and the insulating film 432b are formed (see FIG. 30A). The above embodiments can be referred to for the removing treatment or the like of the insulating film 425.

Figure 30B:
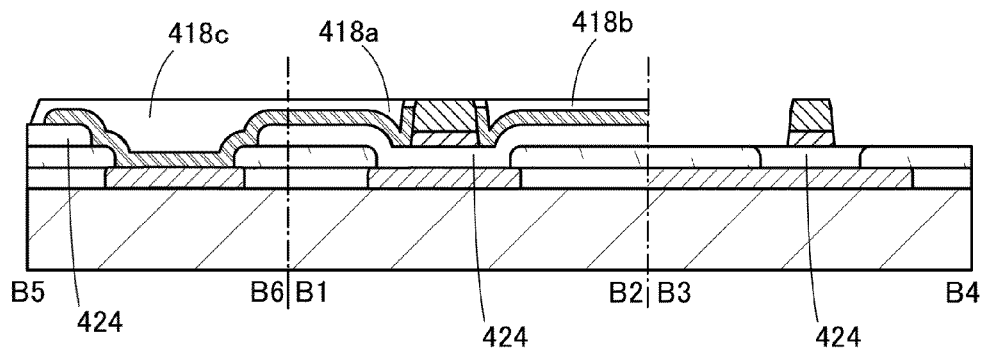

Next, the insulating film 418 and the base insulating film 423 are etched to form the insulating film 418a, the insulating film 418b, the insulating film 418c, and the base insulating film 424 (see FIG. 30B).

Figure 30C:
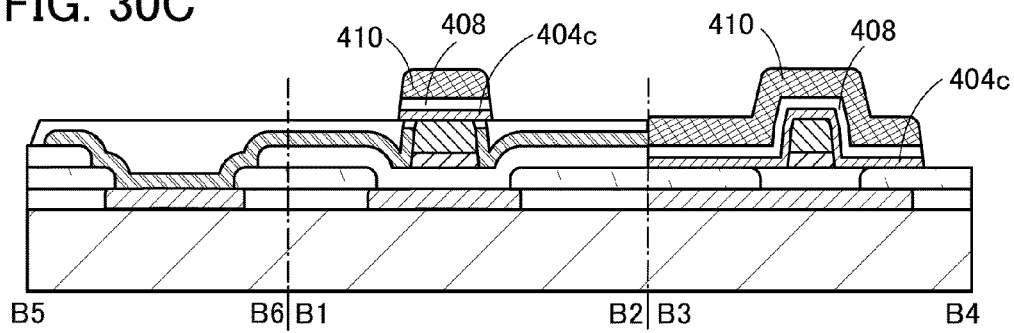

Next, the oxide semiconductor film 404c, the gate insulating film 408, and the gate electrode 410 are formed over the blocking film 422, the base insulating film 424, the insulating film 418a, the insulating film 418b, the insulating film 418c, the insulating film 432a, the insulating film 432b, and the oxide semiconductor film 404b (see FIG. 30C). The above embodiments can be referred to for materials and formation methods of the oxide semiconductor film 404c, the gate insulating film 408, and the gate electrode 410.

Figure 31A:
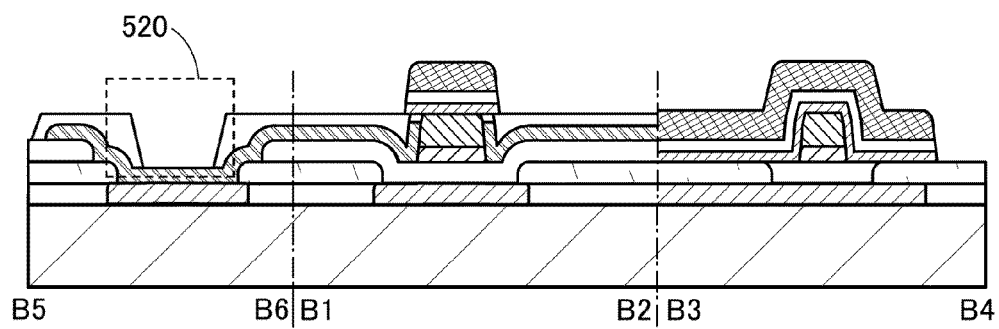
FIGS. 31A and 31B illustrate a method for manufacturing a transistor and a capacitor.
Figure 31B:
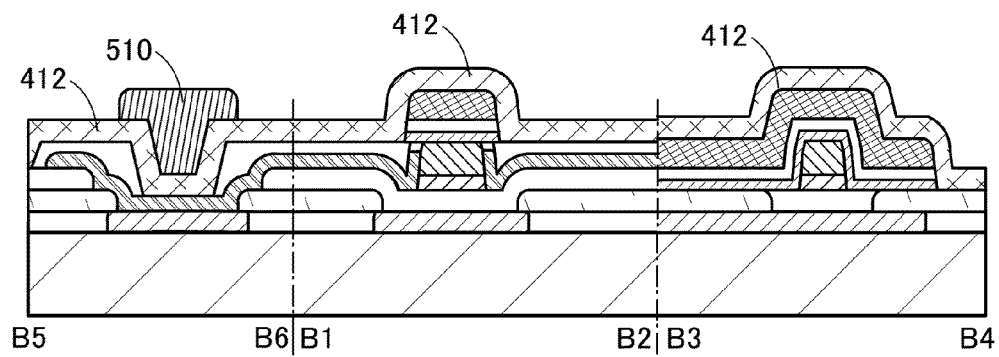

Next, the opening 520 reaching the source electrode 406a is formed in the insulating film 418c (see FIG. 31A).

Next, the blocking film 412 is formed over the source electrode 406a, the insulating film 418a, the insulating film 418b, the insulating film 418c, the gate electrode 410, and the blocking film 422. Then, the electrode 510 is formed over the blocking film 412 (see FIG. 31B).

Through the above process, the transistor 460 and the capacitor 560 illustrated in FIGS. 26A and 26B can be manufactured. The transistor 460 and the capacitor 560 can be formed through the same process; therefore, the capacitor 560 can be efficiently formed.

This embodiment can be combined with any of the other embodiments in this specification as appropriate.

Embodiment 5

In this embodiment, an example of a circuit including the transistor of one embodiment of the present invention is described with reference to drawings.

[Cross-Sectional Structure]

Figure 40A:
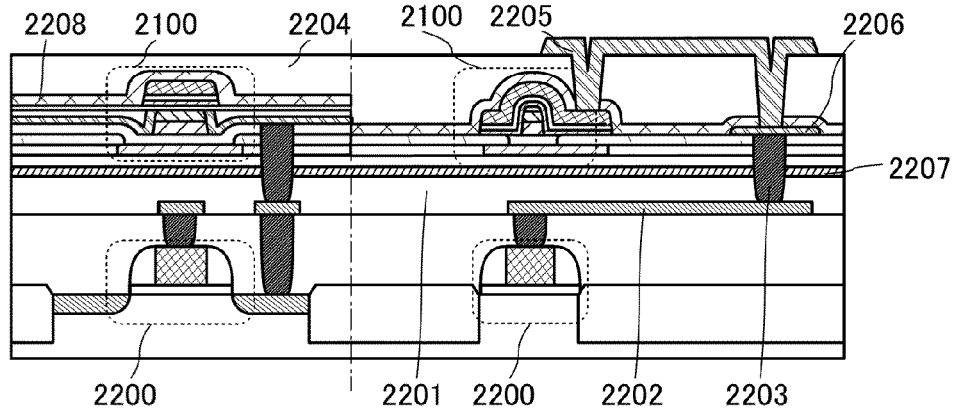
FIGS. 40A to 40D are cross-sectional views and circuit diagrams of semiconductor devices according to an embodiment.

FIG. 40A is a cross-sectional view of a semiconductor device of one embodiment of the present invention. The semiconductor device illustrated in FIG. 40A includes a transistor 2200 containing a first semiconductor material in a lower portion and a transistor 2100 containing a second semiconductor material in an upper portion. In FIG. 40A, an example is described in which the transistor described in the above embodiment as an example is used as the transistor 2100 containing the second semiconductor material.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, does not need to be limited to those described here except for the use of the transistor of one embodiment of the present invention which uses an oxide semiconductor.

FIG. 40A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 having a function of preventing diffusion of hydrogen is preferably formed over the transistor 2100 to cover the transistor 2100 including an oxide semiconductor film. For the blocking film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor layer included in the transistor 2100 can be prevented and entry of water and hydrogen into the oxide semiconductor film can be prevented.

Note that the transistor 2200 can be a transistor of various types without being limited to a planar type transistor. For example, a FIN-type transistor, a TRI-GATE transistor, or the like can be used. An example of a cross-sectional view in this case is shown in FIG. 40D. An insulating film 2212 is provided over a semiconductor substrate 2211. The semiconductor substrate 2211 includes a projecting portion with a thin tip (also referred to as a fin). Note that an insulating film may be provided over the projecting portion. The insulating film functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

<CMOS Circuit>

Figure 40B:
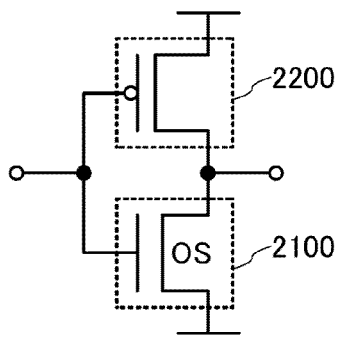

A circuit diagram in FIG. 40B shows a configuration of a "CMOS circuit" in which the p-channel transistor 2200 and the n-channel transistor 2100 are connected to each other in series and in which gates of them are connected to each other.

<CMOS Analog Switch>

Figure 40C:
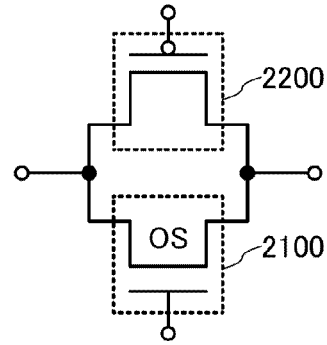
Figure 40D:
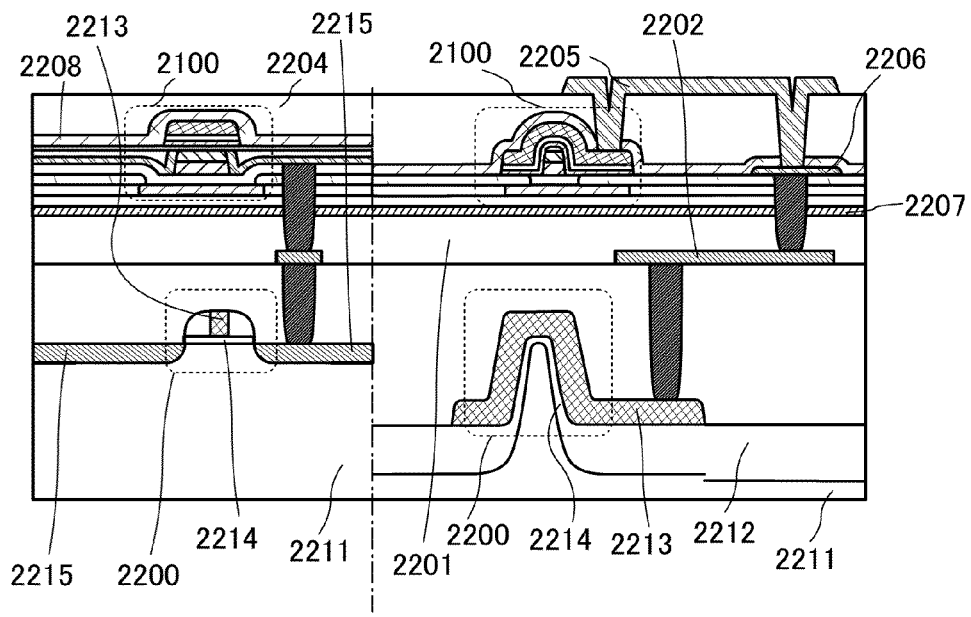

A circuit diagram in FIG. 40C shows a configuration in which a source and a drain of the transistor 2100 are connected to a source and a drain of the transistor 2200. With such a configuration, the transistors can function as what is called an analog switch <Memory Device Example>

Figure 41A:
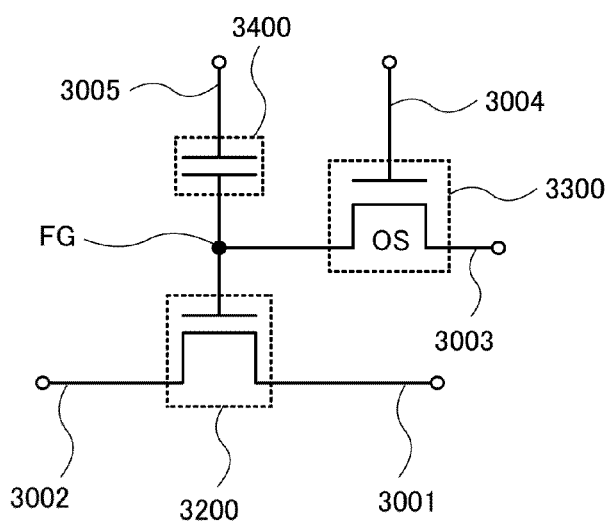
FIGS. 41A to 41C illustrate structure examples of a memory device according to an embodiment.
Figure 41B:
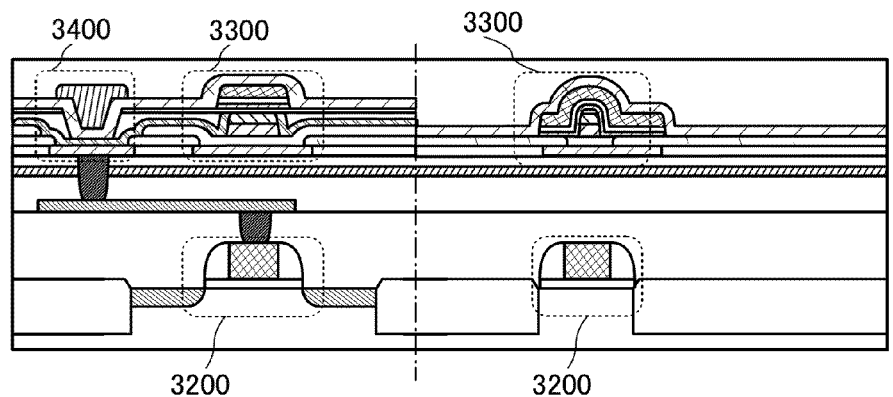
Figure 41C:
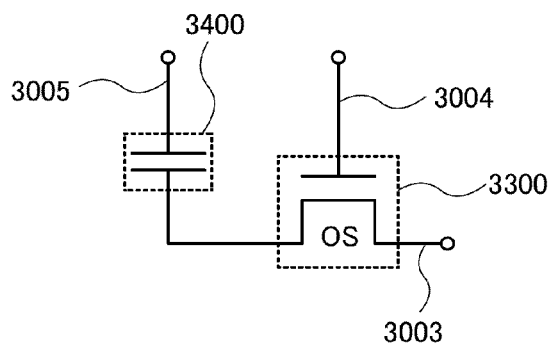

An example of a semiconductor device (memory device) which includes the transistor of one embodiment of the present invention, which can retain stored data even when not powered, and which has an unlimited number of write cycles is shown in FIGS. 41A to 41C.

The semiconductor device illustrated in FIG. 41A includes a transistor 3200 using a first semiconductor material, a transistor 3300 using a second semiconductor material, and a capacitor 3400. Note that any of the transistors described in the above embodiments can be used as the transistor 3300, and the capacitor 550 described in the above embodiment can be used as the capacitor 3400. FIG. 41B is a cross-sectional view of the semiconductor device illustrated in FIG. 41A.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 41A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and a first terminal of the capacitor 3400. A fifth wiring 3005 is electrically connected to a second terminal of the capacitor 3400.

The semiconductor device in FIG. 41A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell be read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 41C is different from the semiconductor device illustrated in FIG. 41A in that the transistor 3200 is not provided. Also in this case, writing and retaining operation of data can be performed in a manner similar to the above.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} C \times V)/(C_B+C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1>V_0$), the potential of the third wiring 3003 in the case of retaining the potential $V_1$ (($C_B \times V_{B0}+C \times V_1)/(C_B+C)$) is higher than the potential of the third wiring 3003 in the case of retaining the potential $V_0$ (($C_B \times V_{B0}+C \times V_0)/(C_B+C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The structures, methods, and the like described in this embodiment can be combined as appropriate with any of the structures, methods, and the like described in the other embodiments.

Embodiment 6

In this embodiment, an RF tag that includes the transistor described in the above embodiments or the memory device described in the above embodiment is described with reference to FIG. 42.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 42. FIG. 42 is a block diagram illustrating a configuration example of an RF tag.

Figure 42:
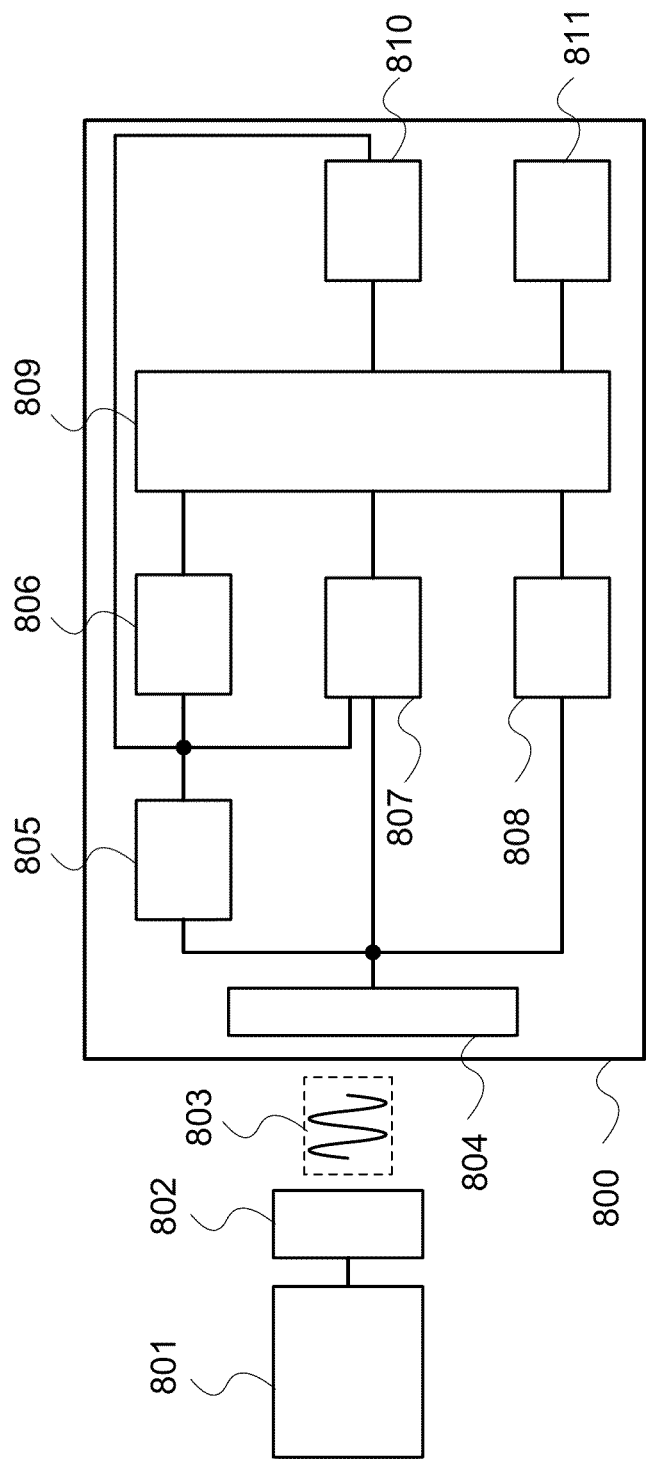
FIG. 42 illustrates a structure example of an RF tag according to an embodiment.

As shown in FIG. 42, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods:

an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Embodiment 7

In this embodiment, a CPU in which at least the transistor described in at least the above embodiment can be used and the memory device described in the above embodiment is included is described.

Figure 43:
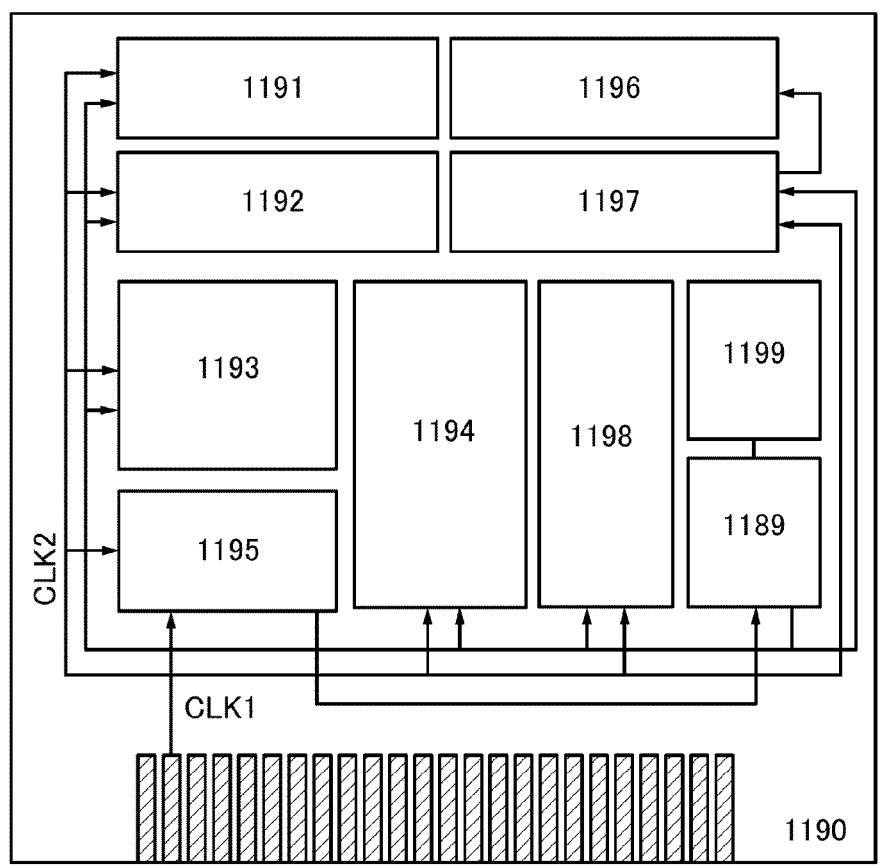
FIG. 43 illustrates a structure example of a CPU according to an embodiment.

FIG. 43 is a block diagram illustrating a configuration example of a CPU at least partly including any of the transistors described in the above embodiments as a component.

The CPU illustrated in FIG. 43 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 43 is just an example in which the configuration has been simplified, and an actual CPU may have a variety of configurations depending on the application. For example, the CPU may have the following configuration: a structure including the CPU illustrated in FIG. 43 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 43, a memory cell is provided in the register 1196. For the memory cell of the register 1196, any of the transistors described in the above embodiments can be used.

In the CPU illustrated in FIG. 43, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 44:
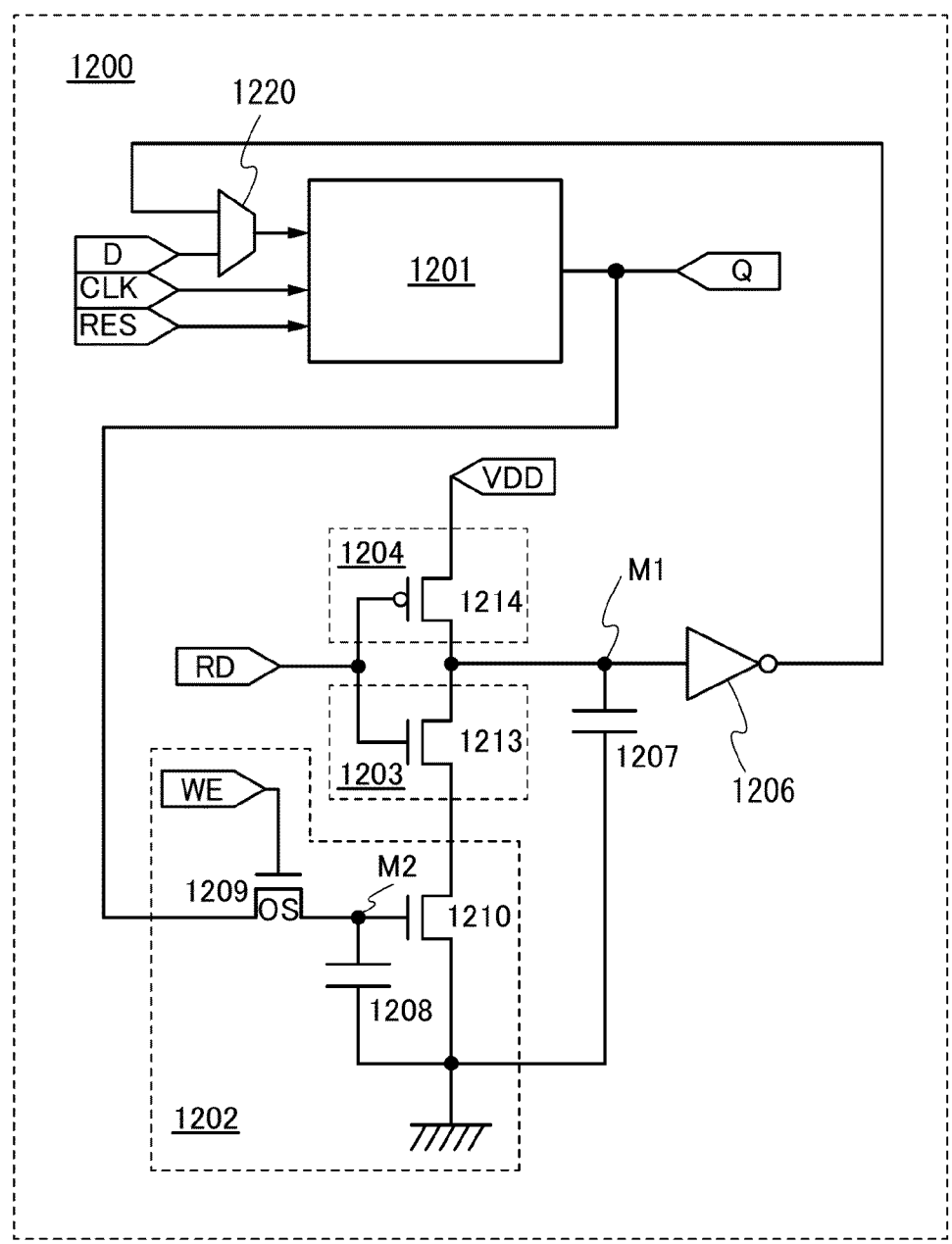
FIG. 44 is a circuit diagram of a memory element according to an embodiment.

FIG. 44 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 do not need to be provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 44 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 44, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 44, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 44, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) device.

Embodiment 8

Figure 45A:
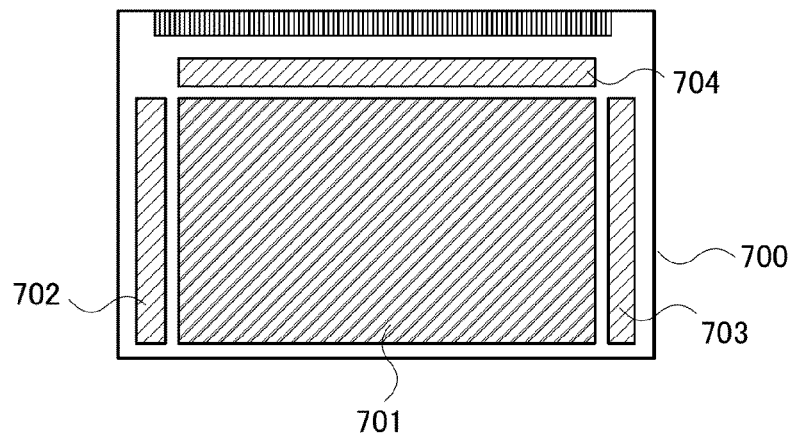
FIGS. 45A to 45C are circuit diagrams of display devices according to an embodiment.
Figure 45B:
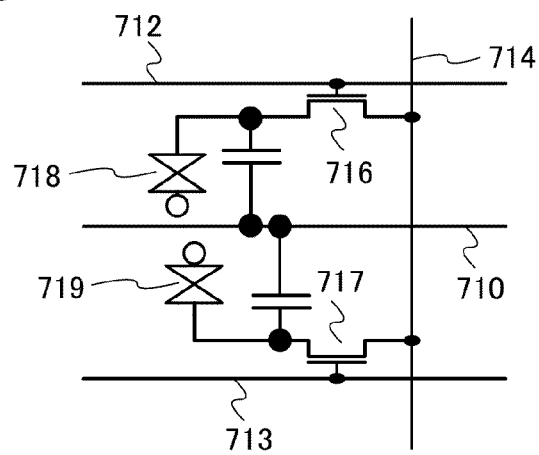
Figure 45C:
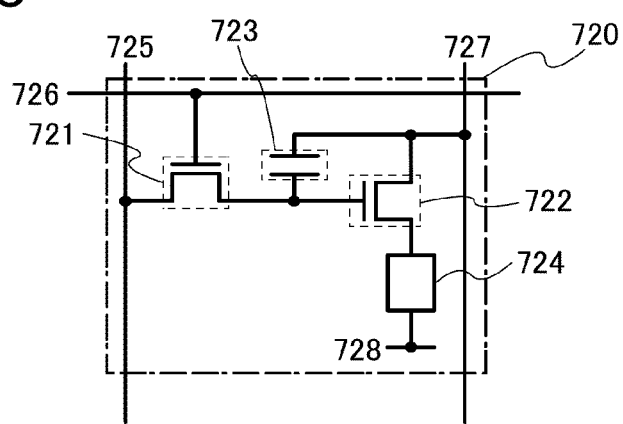

In this embodiment, a structure example of a display device of one embodiment of the present invention is described.
[Structure Example]
FIG. 45A is a top view of the display device of one embodiment of the present invention. FIG. 45B is a circuit diagram illustrating a pixel circuit that can be used in the case where a liquid crystal element is used in a pixel in the display device of one embodiment of the present invention. FIG. 45C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 45A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 45A, the first scan line driver circuit 702, the second scan line driver circuit 703, and the signal line driver circuit 704 are formed over the substrate 700 where the pixel portion 701 is formed. Accordingly, the number of components that are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.
<Liquid Crystal Display Device>
FIG. 45B illustrates an example of a circuit configuration of the pixel. Here, a pixel circuit that can be used in a pixel of a VA liquid crystal display device is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer is spread in a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 45B. For example, a switch, a resistor, a capacitor, a transistor, a sensor, a logic circuit, or the like may be added to the pixel illustrated in FIG. 45B.

<Organic EL Display Device>

FIG. 45C illustrates another example of a circuit configuration of the pixel. Here, a pixel structure of a display device including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 45C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 45C. For example, a switch, a resistor, a capacitor, a sensor, a transistor, a logic circuit, or the like may be added to the pixel circuit illustrated in FIG. 45C.

In the case where the transistor shown in any of the above embodiments is used for the circuit shown in FIGS. 45A to 45C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an electroluminescent (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator (IMOD) element, an electrowetting element, a piezoelectric ceramic display, or a carbon nanotube, which are display media whose contrast, luminance, reflectivity, transmittance, or the like is changed by electromagnetic action. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

At least part of this embodiment can be implemented in combination with any of the other embodiments described in this specification as appropriate.

Embodiment 9

In this embodiment, a display module using a semiconductor device of one embodiment of the present invention will be described with reference to FIG. 46.

Figure 46:
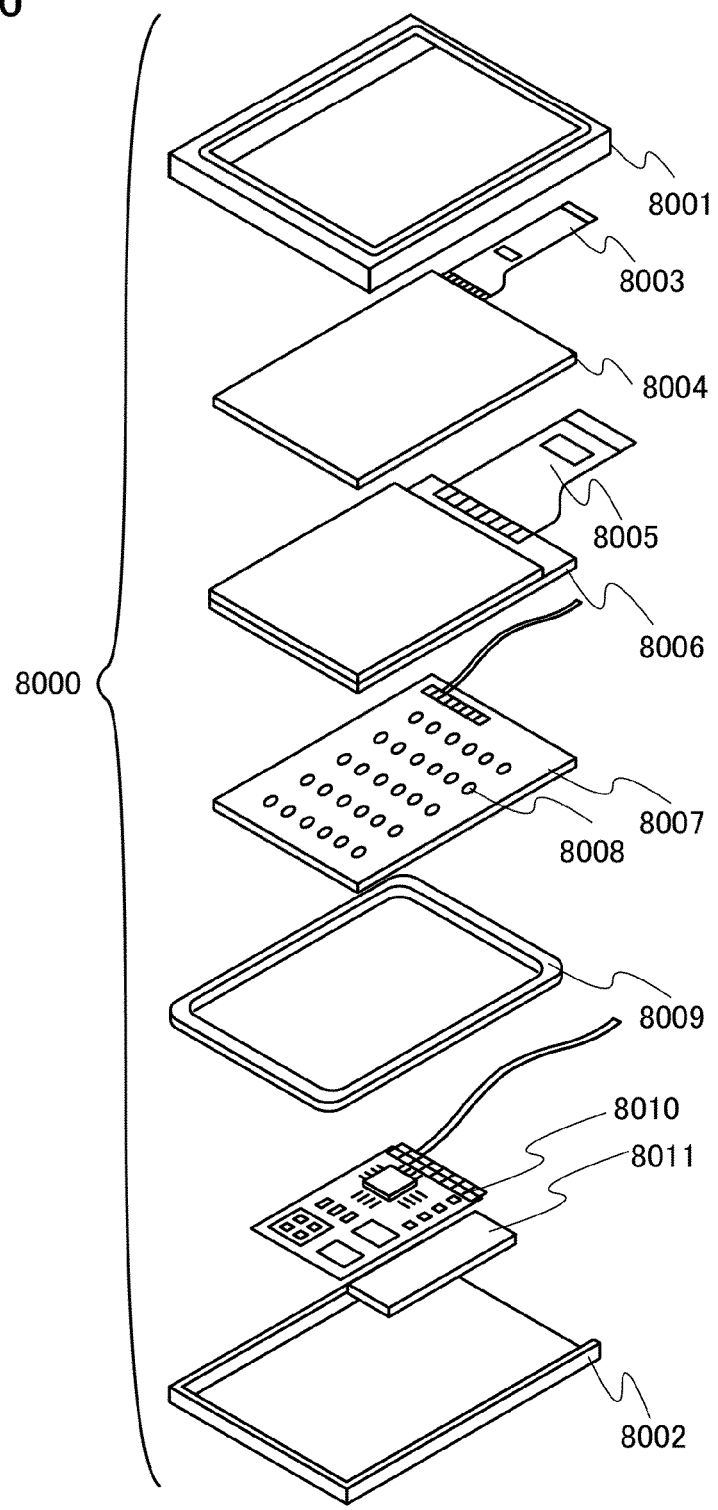
FIG. 46 illustrates a display module.

In a display module 8000 in FIG. 46, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

The structures described in this embodiment can be used as appropriate in combination with any of the structures described in the other embodiments.

Embodiment 10

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 47A to 47F illustrate specific examples of these electronic devices.

Figure 47A:
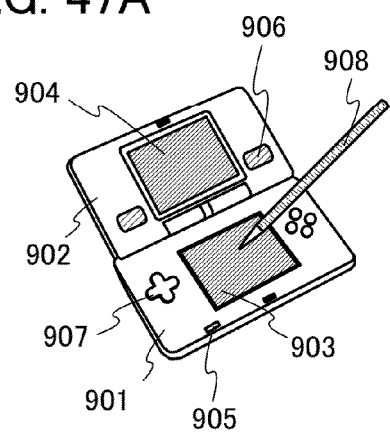
FIGS. 47A to 47F each illustrate an electronic device according to an embodiment.

FIG. 47A illustrates a portable game console including a housing 901, a housing 902, a display portion 903, a display portion 904, a microphone 905, a speaker 906, an operation key 907, a stylus 908, and the like. Although the portable game machine in FIG. 47A has the two display portions 903 and 904, the number of display portions included in a portable game machine is not limited to this.

Figure 47B:
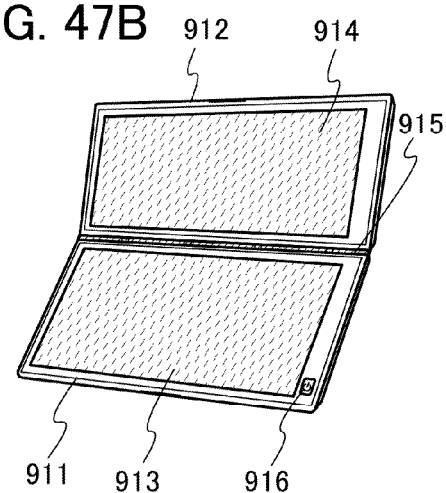

FIG. 47B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 47C:
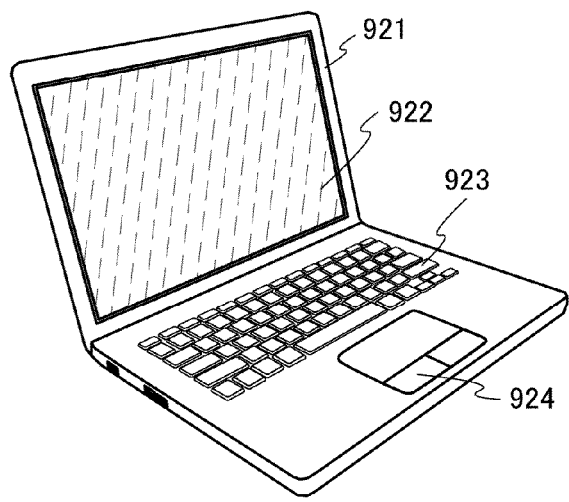

FIG. 47C illustrates a notebook personal computer, which includes a housing 921, a display portion 922, a keyboard 923, a pointing device 924, and the like.

Figure 47D:
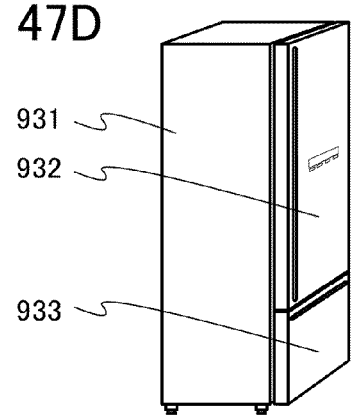

FIG. 47D illustrates an electric refrigerator-freezer including a housing 931, a door for a refrigerator 932, a door for a freezer 933, and the like.

Figure 47E:
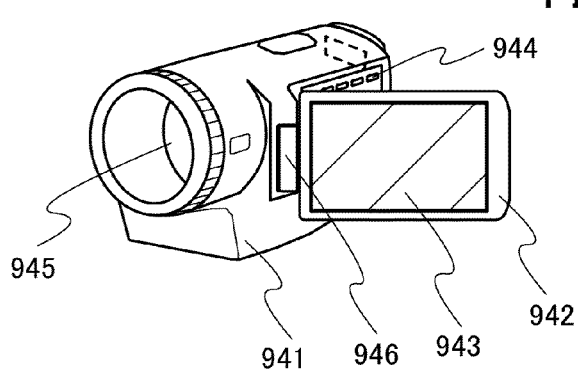

FIG. 47E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 47F:
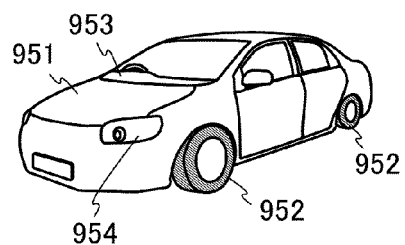
Figure 48A:
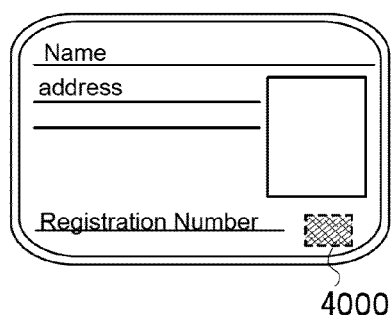
FIGS. 48A to 48F each show an application example of an RF device according to an embodiment.
Figure 48B:
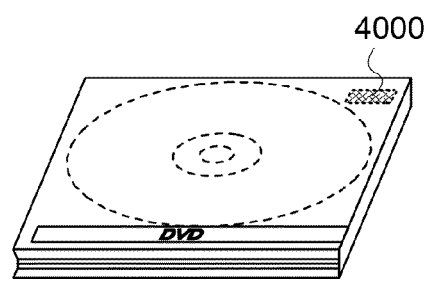
Figure 48C:
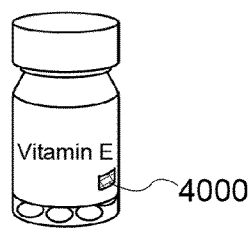
Figure 48D:
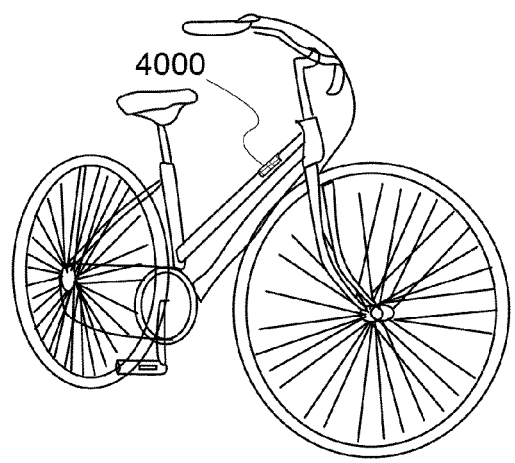
Figure 48E:
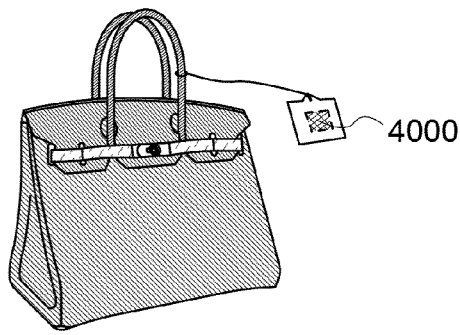
Figure 48F:
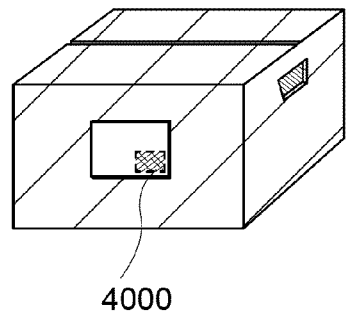

FIG. 47F illustrates an ordinary vehicle including a car body 951, wheels 952, a dashboard 953, lights 954, and the like.

Embodiment 11

In this embodiment, application examples of an RF device of one embodiment of the present invention will be described with reference to FIGS. 48A to 48F. The RF device is widely used and can be provided for, for example, products such as bills, coins, securities, bearer bonds, documents (e.g., driver's licenses or resident's cards, see FIG. 48A), packaging containers (e.g., wrapping paper or bottles, see FIG. 48C), recording media (e.g., DVD or video tapes, see FIG. 48B), vehicles (e.g., bicycles, see FIG. 48D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 48E and 48F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF device can be preferably used for application in which data is not frequently written or read.

This application is based on Japanese Patent Application serial no. 2013-213915 filed with Japan Patent Office on Oct. 11, 2013, and Japanese Patent Application serial no. 2013-213928 filed with Japan Patent Office on Oct. 11, 2013, the entire contents of which are hereby incorporated by reference.

What is claimed is:

1. A semiconductor device comprising:
a first insulating film over an insulating surface;
a second insulating film over the insulating surface and the first insulating film;
a first oxide semiconductor film over the second insulating film;
a second oxide semiconductor film over the first oxide semiconductor film;
a source electrode in contact with a first side surface of the first oxide semiconductor film and a first side surface of the second oxide semiconductor film;
a drain electrode in contact with a second side surface of the first oxide semiconductor film and a second side surface of the second oxide semiconductor film;
a third insulating film over the second oxide semiconductor film;
a third oxide semiconductor film over the third insulating film;
a gate insulating film over the third oxide semiconductor film; and
a gate electrode over the gate insulating film,
wherein the gate electrode covers a top surface and a third side surface of the second oxide semiconductor film.

2. The semiconductor device according to claim 1, wherein the first insulating film comprises aluminum oxide.

3. The semiconductor device according to claim 1, wherein the third oxide semiconductor film is in contact with the third side surface of the second oxide semiconductor film.

4. The semiconductor device according to claim 1, further comprising a fourth insulating film over the gate electrode and the first insulating film, wherein the fourth insulating film comprises aluminum oxide.

5. The semiconductor device according to claim 4, further comprising a capacitor,
wherein the capacitor comprises one of the source electrode and the drain electrode, the fourth insulating film, and an upper electrode, and
wherein the fourth insulating film is provided between the one of the source electrode and the drain electrode and the upper electrode.

6. A semiconductor device comprising:
a conductive film over an insulating surface;
a first insulating film over the insulating surface;
a second insulating film over the conductive film and the first insulating film;
a first oxide semiconductor film over the second insulating film;
a second oxide semiconductor film over the first oxide semiconductor film;
a source electrode in contact with a first side surface of the first oxide semiconductor film and a first side surface of the second oxide semiconductor film;
a drain electrode in contact with a second side surface of the first oxide semiconductor film and a second side surface of the second oxide semiconductor film;
a third insulating film over the second oxide semiconductor film;
a third oxide semiconductor film over the third insulating film;
a gate insulating film over the third oxide semiconductor film; and
a gate electrode over the gate insulating film,
wherein the gate electrode covers a top surface and a third side surface of the second oxide semiconductor film.

7. The semiconductor device according to claim 6, wherein the first insulating film comprises aluminum oxide.

8. The semiconductor device according to claim 6, wherein the third oxide semiconductor film is in contact with the third side surface of the second oxide semiconductor film.

9. The semiconductor device according to claim 6, further comprising a fourth insulating film over the gate electrode and the first insulating film, wherein the fourth insulating film comprises aluminum oxide.

10. The semiconductor device according to claim 9, further comprising a capacitor,
wherein the capacitor comprises one of the source electrode and the drain electrode, the fourth insulating film, and an upper electrode, and wherein the fourth insulating film is provided between the one of the source electrode and the drain electrode and the upper electrode.

11. A method for manufacturing a semiconductor device, comprising the steps of:
forming a first insulating film over an insulating surface;
forming a second insulating film over the insulating surface and the first insulating film;
forming a stacked-layer film including a first oxide semiconductor film, a second oxide semiconductor film, and a hard mask, over the second insulating film;
forming a first conductive film over the second insulating film and the stacked-layer film;
forming a third insulating film over the first conductive film;
performing removing treatment on the third insulating film, the first conductive film, and the hard mask to expose the second oxide semiconductor film and form a source electrode and a drain electrode;
forming a fourth insulating film over the second oxide semiconductor film after the step of performing removing treatment;
performing etching on the fourth insulating film, the third insulating film, and the second insulating film to expose the first insulating film;
forming a third oxide semiconductor film over the fourth insulating film;
forming a gate insulating film over the third oxide semiconductor film; and
forming a gate electrode over the gate insulating film.

12. The method for manufacturing a semiconductor device according to claim 11, wherein the removing treatment is performed by chemical mechanical polishing.

13. The method for manufacturing a semiconductor device according to claim 11, wherein the gate electrode covers a top surface and side surfaces of the second oxide semiconductor film.

14. The method for manufacturing a semiconductor device according to claim 11, wherein the first insulating film comprises aluminum oxide.

15. The method for manufacturing a semiconductor device according to claim 11, further comprising a step of forming a fifth insulating film over the gate electrode and the first insulating film, wherein the fifth insulating film comprises aluminum oxide.

16. A method for manufacturing a semiconductor device, comprising the steps of:
forming a conductive film over an insulating surface;
forming a first insulating film over the insulating surface;
forming a second insulating film over the conductive film and the first insulating film;
forming a stacked-layer film including a first oxide semiconductor film, a second oxide semiconductor film, and a hard mask, over the second insulating film;
forming a first conductive film over the second insulating film and the stacked-layer film;
forming a third insulating film over the first conductive film;
performing removing treatment on the third insulating film, the first conductive film, and the hard mask to expose the second oxide semiconductor film and form a source electrode and a drain electrode;
forming a fourth insulating film over the second oxide semiconductor film after the step of performing removing treatment;
performing etching on the fourth insulating film, the third insulating film, and the second insulating film to expose the first insulating film;
forming a third oxide semiconductor film over the fourth insulating film;
forming a gate insulating film over the third oxide semiconductor film; and
forming a gate electrode over the gate insulating film.

17. The method for manufacturing a semiconductor device according to claim 16, wherein the removing treatment is performed by chemical mechanical polishing.

18. The method for manufacturing a semiconductor device according to claim 16, wherein the gate electrode covers a top surface and side surfaces of the second oxide semiconductor film.

19. The method for manufacturing a semiconductor device according to claim 16, wherein the first insulating film comprises aluminum oxide.

20. The method for manufacturing a semiconductor device according to claim 16, further comprising a step of forming a fifth insulating film over the gate electrode and the first insulating film, wherein the fifth insulating film comprises aluminum oxide.

* * * * *